United States Patent
Chang et al.

(10) Patent No.: US 8,767,465 B2
(45) Date of Patent: Jul. 1, 2014

(54) NONVOLATILE MEMORY DEVICE AND METHOD OF MANUFACTURING THE SAME

(75) Inventors: Sung-il Chang, Hwasung (KR); Changseok Kang, Seongnam (KR); Jungdal Choi, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 349 days.

(21) Appl. No.: 12/817,391

(22) Filed: Jun. 17, 2010

(65) Prior Publication Data
US 2010/0309729 A1    Dec. 9, 2010

(30) Foreign Application Priority Data
Jun. 19, 2009    (KR) .................. 10-2009-0055067

(51) Int. Cl.
*G11C 11/40*    (2006.01)
(52) U.S. Cl.
USPC ..................... 365/185.17; 257/321
(58) Field of Classification Search
None
See application file for complete search history.

(56) References Cited

U.S. PATENT DOCUMENTS

| | | | |
|---|---|---|---|
| 7,247,538 B2 | 7/2007 | Lee et al. | |
| 7,364,388 B2 | 4/2008 | Faul et al. | |
| 7,365,388 B2 | 4/2008 | Bhattacharyya | |
| 7,402,492 B2 | 7/2008 | Jeon et al. | |
| 7,619,926 B2 * | 11/2009 | Orimoto et al. | 365/185.17 |
| 7,936,004 B2 * | 5/2011 | Kito et al. | 257/324 |
| 7,956,406 B2 * | 6/2011 | Yasuda | 257/324 |
| 2005/0285184 A1 | 12/2005 | Jung | |
| 2006/0138478 A1 * | 6/2006 | Buh et al. | 257/288 |
| 2008/0173930 A1 * | 7/2008 | Watanabe et al. | 257/321 |
| 2009/0121275 A1 * | 5/2009 | Kim et al. | 257/321 |
| 2009/0134450 A1 * | 5/2009 | Kim et al. | 257/325 |

FOREIGN PATENT DOCUMENTS

| | | |
|---|---|---|
| JP | 2006-086511 | 3/2006 |
| JP | 2008-177492 | 7/2008 |
| KR | 20050116976 | 12/2005 |
| KR | 20070106165 | 11/2007 |

OTHER PUBLICATIONS

Robertson, "Band offsets of wide-band-gap oxides," 2000, J. Vac. Sci. Technol. B 18, 1875. 8 pages.*
Wilk et al., "High-k gate dielectrics: Current status and materials properties considerations," 2001, Journal of Applied Physics, vol. 89, No. 10. pp. 5243-5275.*
Jang et al., "Vertical cell array using TCAT(Terabit Cell Array Transistor) technology for ultra high density NAND flash memory," VLSI Technology, 2009 Symposium on , vol., No., pp. 192,193, Jun. 16-18, 2009.*

* cited by examiner

*Primary Examiner* — Douglas King
(74) *Attorney, Agent, or Firm* — Stanzione & Kim, LLP

(57) ABSTRACT

A nonvolatile memory device and method of manufacturing the same are provided. In the nonvolatile memory device, a blocking insulation layer is provided between a trap insulation layer and a gate electrode. A fixed charge layer spaced apart from the gate electrode is provided in the blocking insulation layer. Accordingly, the reliability of the nonvolatile memory device is improved.

26 Claims, 48 Drawing Sheets

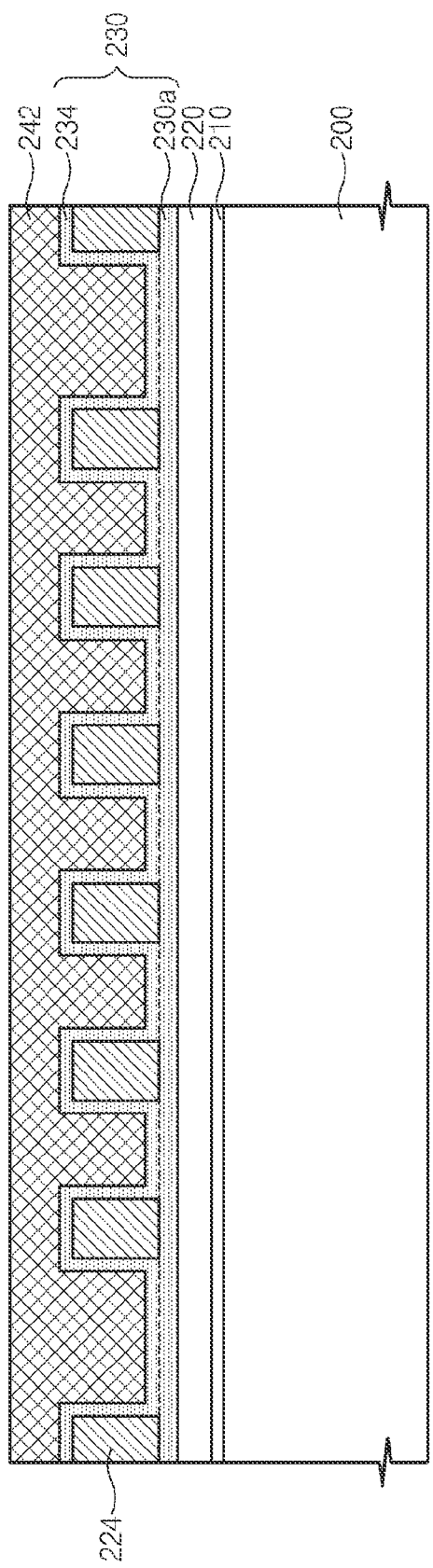

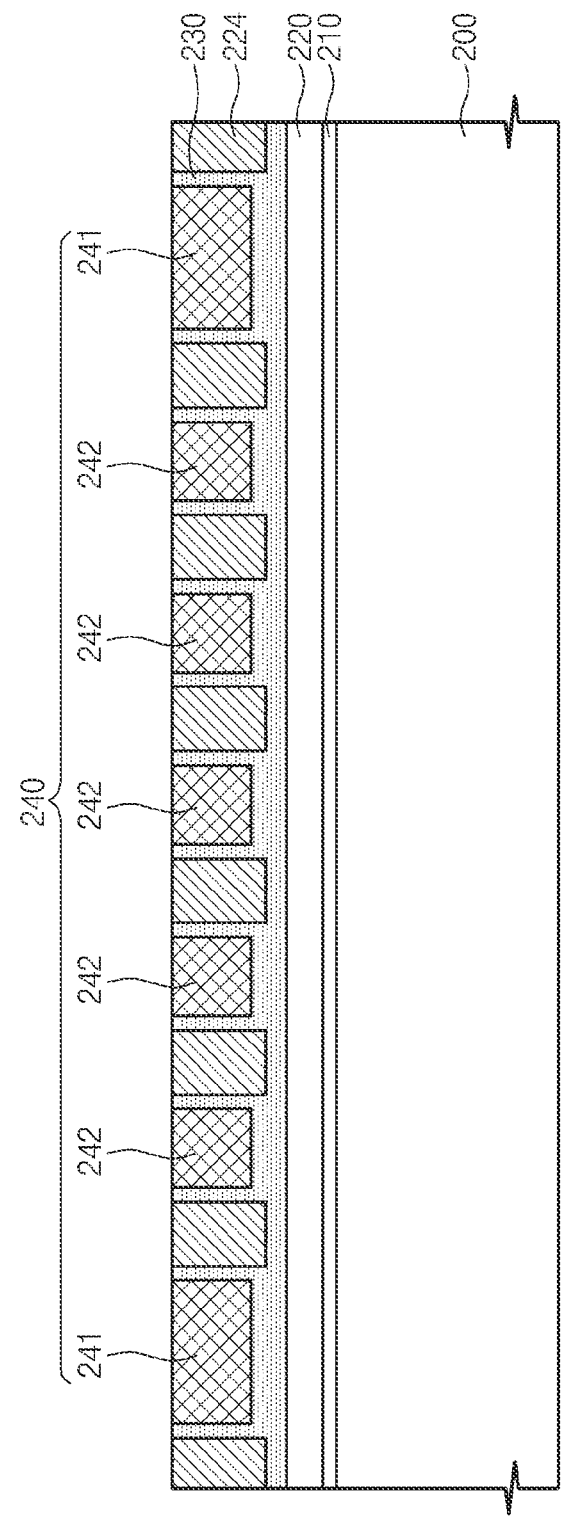

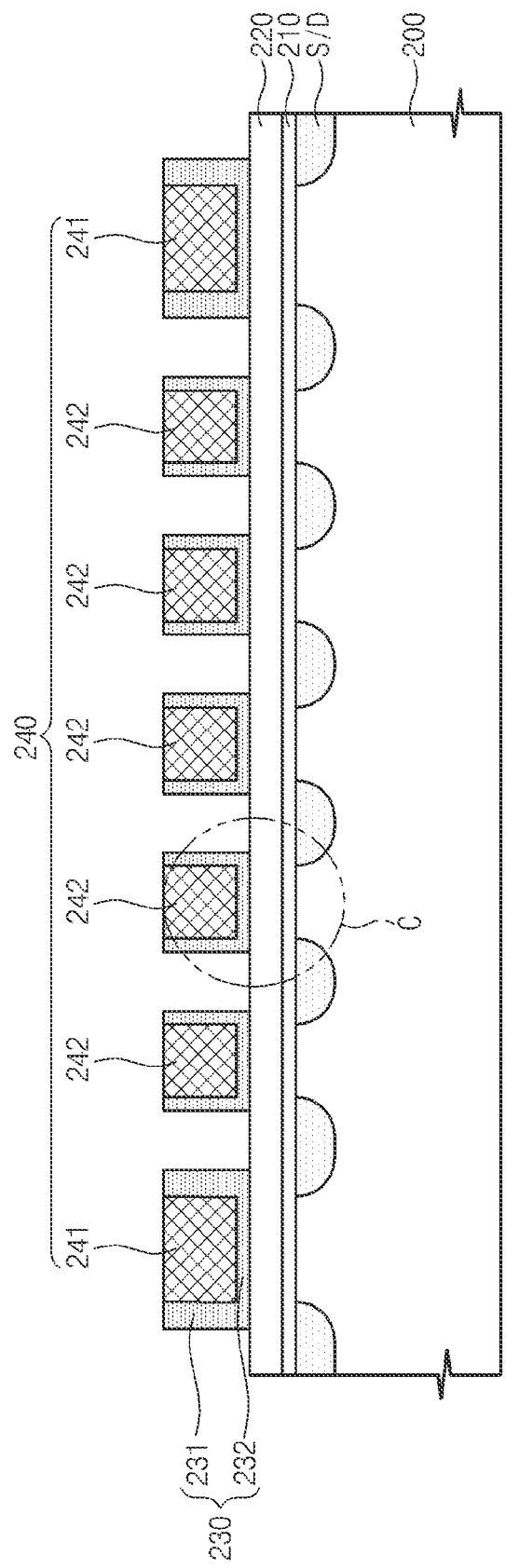

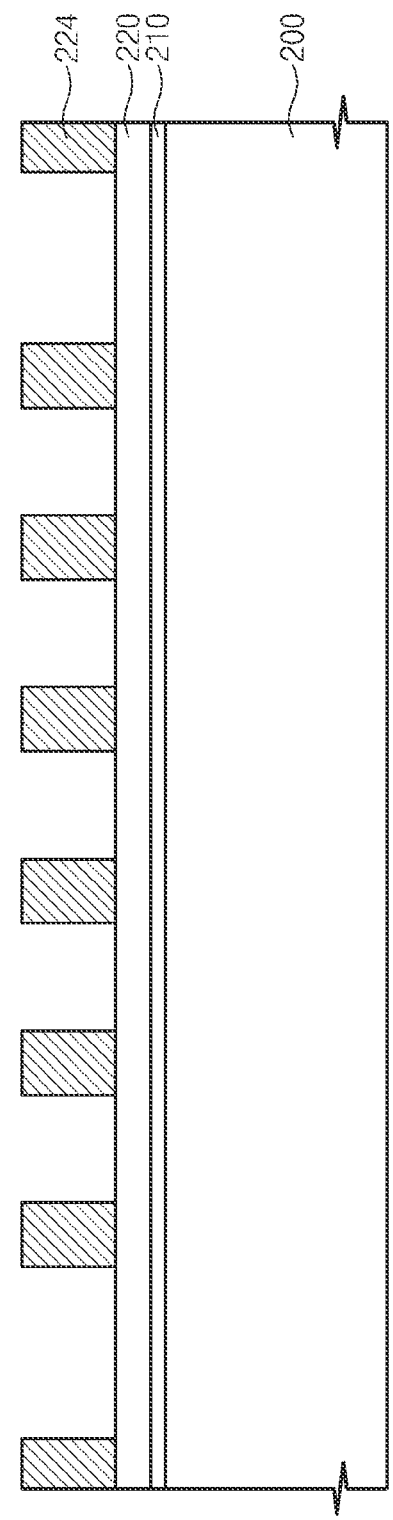

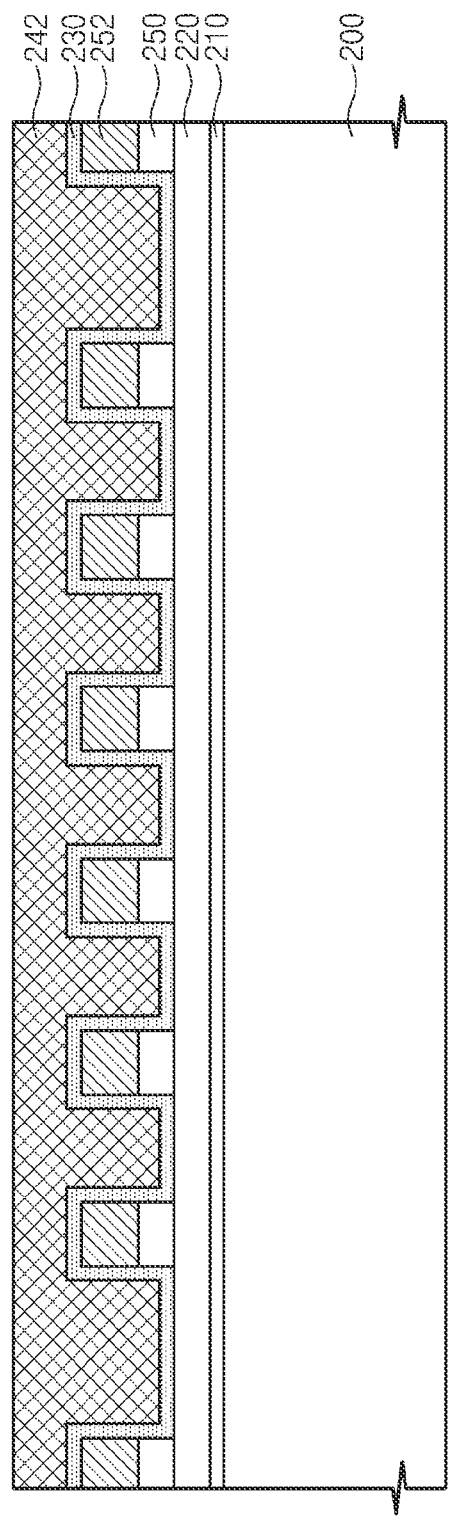

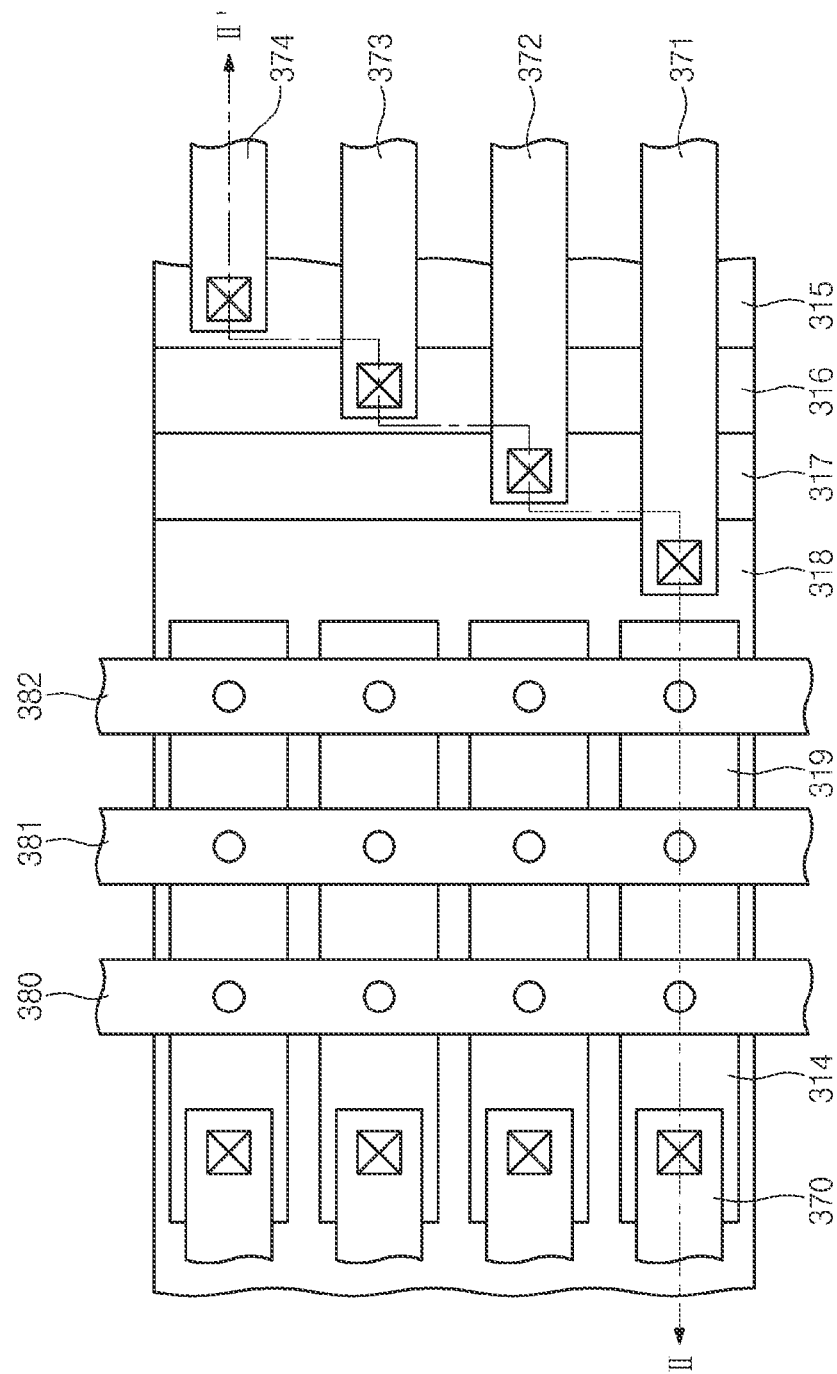

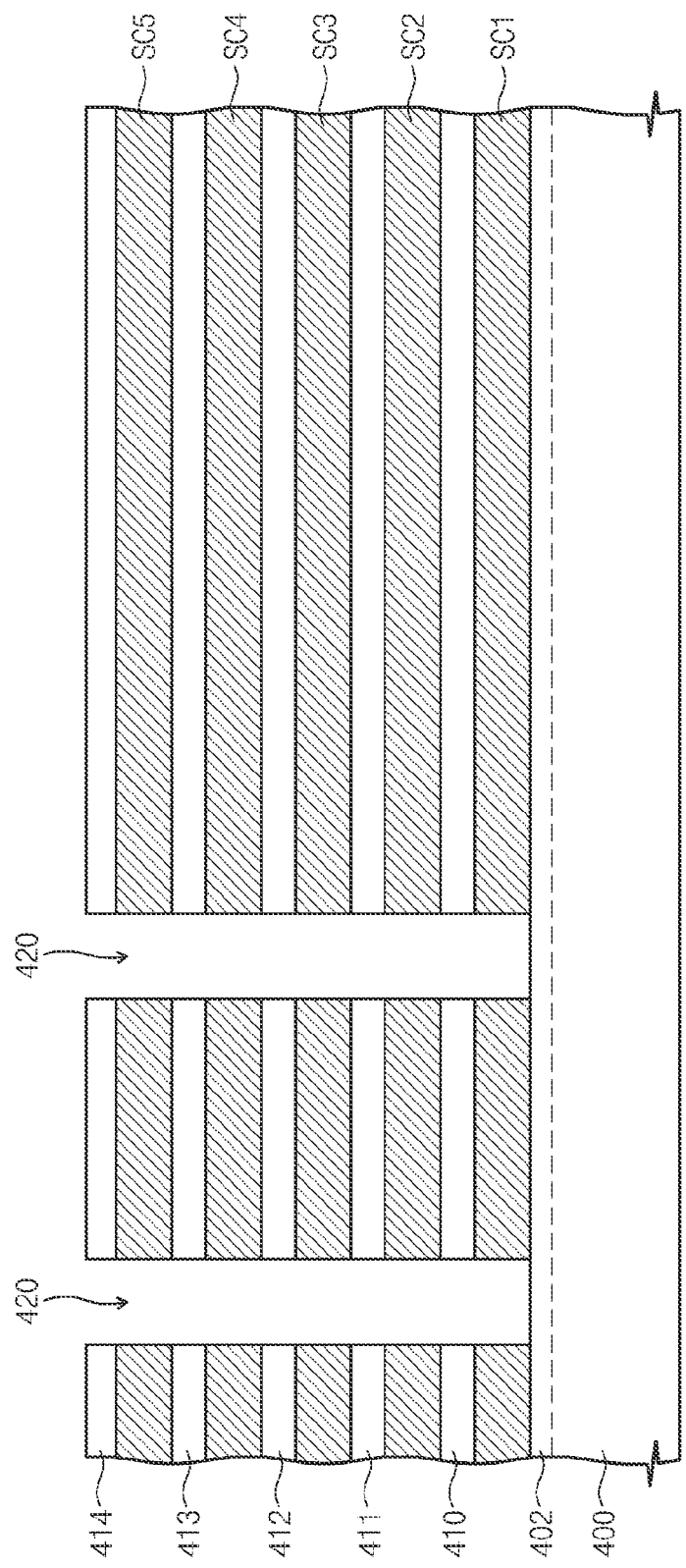

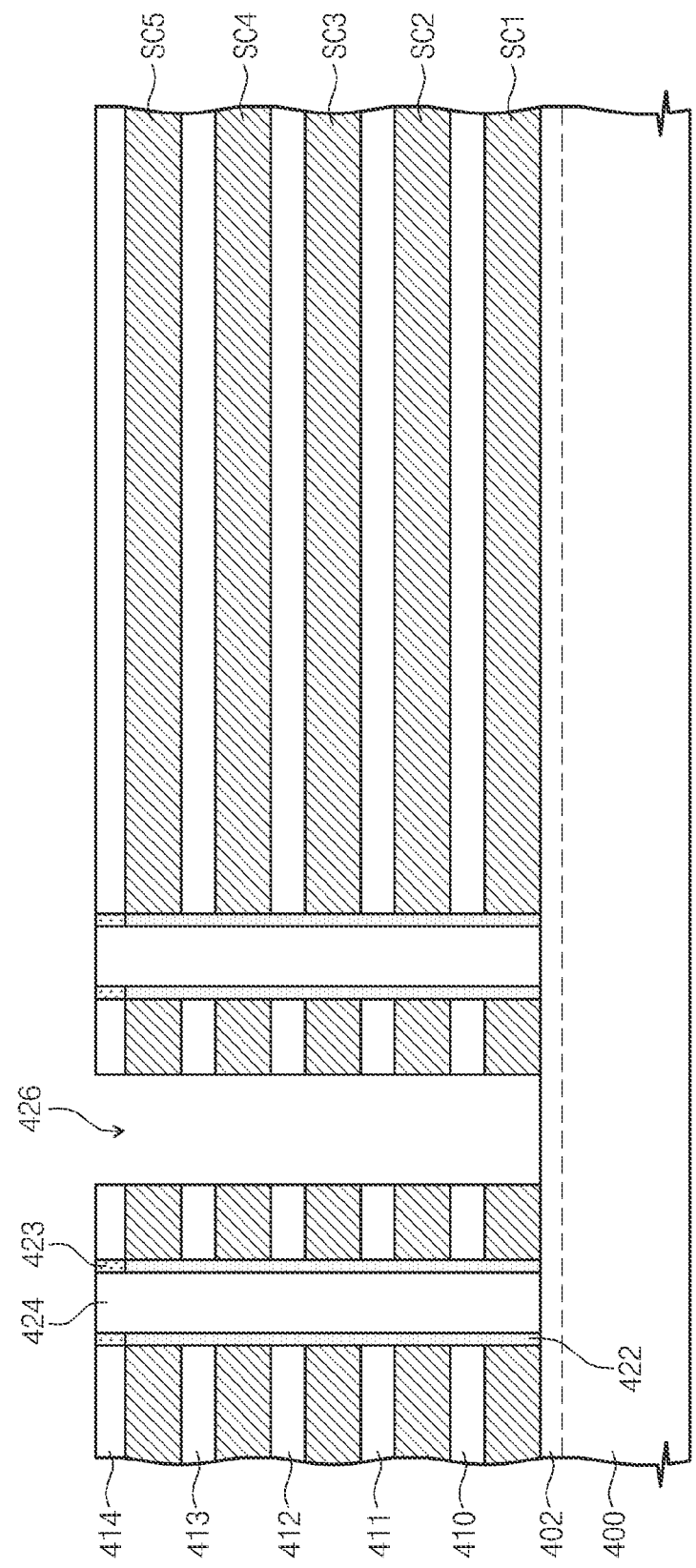

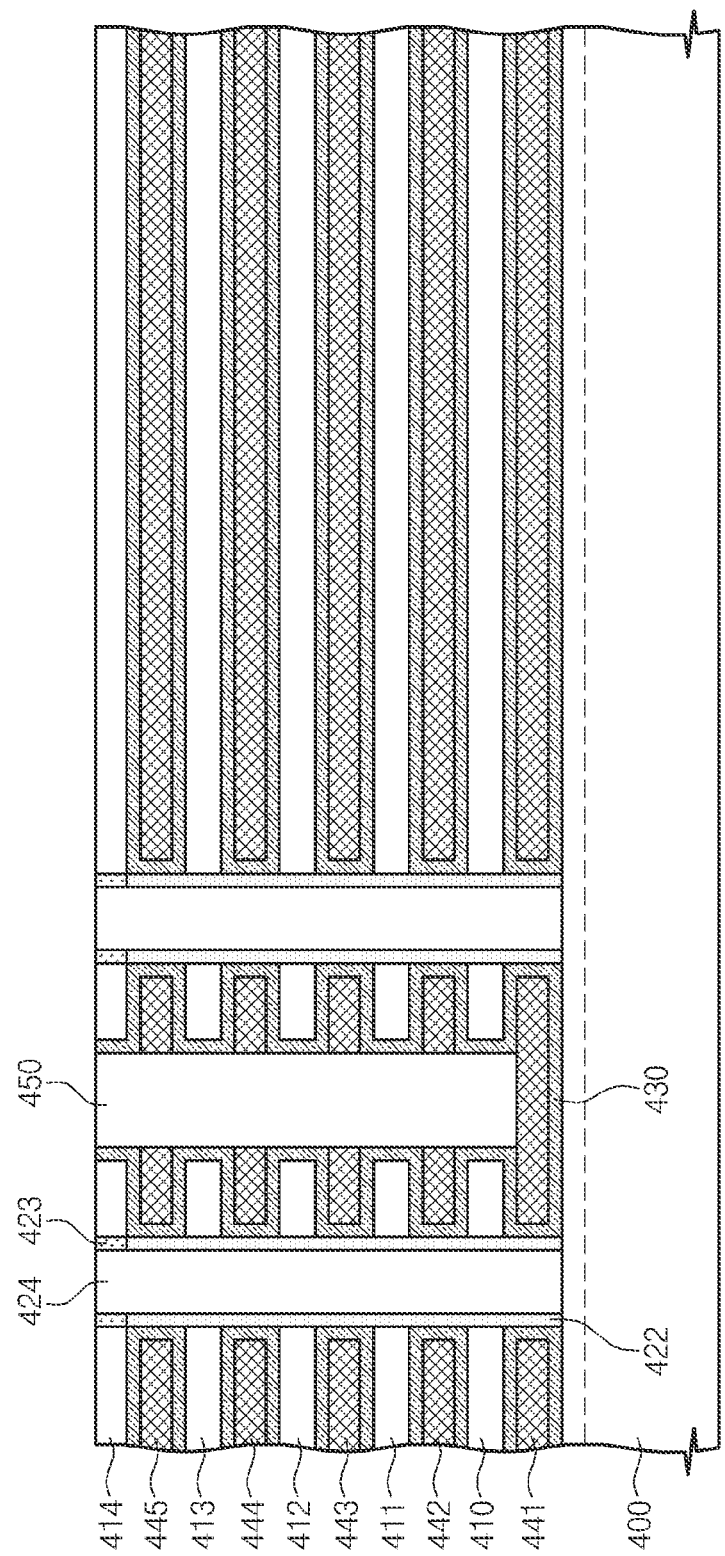

NONVOLATILE MEMORY DEVICE AND METHOD OF MANUFACTURING THE SAME

CROSS-REFERENCE TO RELATED APPLICATIONS

This U.S. non-provisional patent application claims priority under 35 U.S.C. §119(a) from Korean Patent Application No. 10-2009-0055067, filed on Jun. 19, 2009 in the Korean Intellectual Property Office, the entire contents of which are hereby incorporated by reference.

BACKGROUND OF THE INVENTION

1. Field of the Invention

The present general inventive concept relates to a nonvolatile memory device, and more particularly, to a nonvolatile memory device including a fixed charge layer.

2. Description of the Related Art

As semiconductors have been used in almost every industrial field, including various electronic devices, vehicles, vessels, and so on, the interest of semiconductor industries in the modern industry structure is gradually increasing. As semiconductor devices are being used in various industry fields and are becoming an important factor in determining qualities of electronic devices, vehicles, vessels, and so on, the demand of semiconductor devices having superior characteristics is increasing. To meet such a demand, developments have been made to achieve high integration, low power consumption and/or high speed of semiconductor devices.

The importance of data storage capability and data record/erase characteristics of nonvolatile memory devices among a variety of semiconductor devices are increasingly growing because they are directly connected to reliabilities of devices employing the nonvolatile memory devices. In particular, these characteristics may be greatly affected by characteristics of blocking insulation layers of the nonvolatile memory devices.

SUMMARY OF THE INVENTION

The present general inventive concept minimizes a charge loss through block insulation layers of memory devices to improve data storage capability, and minimizes a back tunneling of electrons through the blocking insulation layers of the memory devices to improve data record/erase characteristics.

The present general inventive concept also provides a nonvolatile memory device with improved reliability.

The present general inventive concept also provides a nonvolatile memory device with improved erase characteristic.

The present general inventive concept also provides a nonvolatile memory device with improved data storage capability.

Additional features and utilities of the present general inventive concept will be set forth in part in the description which follows and, in part, will be obvious from the description, or may be learned by practice of the general inventive concept.

Embodiments of the present general inventive concept provide nonvolatile memory devices including an active region, a tunnel dielectric layer having a first surface contacting the active region, and a second surface facing the first surface, a gate electrode on the second surface of the tunnel dielectric layer, a blocking insulation layer comprising a fixed charge layer between the second surface of the tunnel dielectric layer and the gate electrode, and a trap insulation layer between the blocking insulation layer and the second surface of the tunnel dielectric layer, where the fixed charge layer is apart from the gate electrode.

The blocking insulation layer of the nonvolatile memory devices may include a first blocking insulation layer adjacent to the gate electrode, and the fixed charge layer comprises a material different from the first blocking insulation layer.

The nonvolatile memory devices may include where the charge density of the fixed charge layer is greater than the charge density of the first blocking insulation layer.

The nonvolatile memory devices may include a first electric field is generated between the gate electrode and the fixed charge layer by an erase voltage applied between the gate electrode and a channel region in an erase operation, a second electric field is generated between the first blocking insulation layer and the fixed charge layer by the fixed charge layer and the first blocking insulation layer, and the second electric field and the first electric field are opposite in direction.

The nonvolatile memory devices may include where the fixed charge layer comprises negative charges.

The nonvolatile memory devices may include where the blocking insulation layer further includes a second blocking insulation layer between the fixed charge layer and the trap insulation layer, and the second blocking insulation layer comprises a material different from the fixed charge layer.

The nonvolatile memory devices may include where the charge density of the fixed charge layer is greater than the charge density of the second blocking insulation layer.

The blocking insulation layer of the nonvolatile memory devices may further include a supplementary layer between the fixed charge layer and the second blocking insulation layer, and the supplementary layer has a higher dielectric constant than the tunnel dielectric layer.

The blocking insulation layer of the nonvolatile memory devices may further include a contribution layer between the fixed charge layer and the first blocking insulation layer, and the fixed charge layer is formed by a reaction between the contribution layer and the supplementary layer.

The electron affinity of the fixed charge layer of the nonvolatile memory devices may be smaller than the electron affinity of the first blocking insulation layer.

The fixed charge layer of the nonvolatile memory devices may include a first region under the gate electrode, and a second region extending toward a region adjacent to the gate electrode, and the second region of the fixed charge layer minimizes a lateral spreading of charges injected from the active region to the trap insulation layer.

The first blocking insulation layer of the nonvolatile memory devices may have a bottom and a sidewall extending from the bottom, and the sidewall of the first blocking insulation layer may cover both sidewalls of the gate electrode.

The blocking insulation layer of the nonvolatile memory devices may have a bottom and a sidewall extending from the bottom, and the sidewall of the blocking insulation layer may cover both sidewalls of the gate electrode.

The gate electrode of the of the nonvolatile memory devices may include a plurality of stacked gate patterns apart from the substrate, and the nonvolatile memory device may further include an active pillar that penetrates the plurality of gate patterns and comprises the active region connected to the substrate.

The nonvolatile memory devices may include where the tunnel dielectric layer, the trap insulation layer, and the blocking insulation layer are stacked along a sidewall of the active pillar.

The gate electrode of the nonvolatile memory devices may include a plurality of stacked gate patterns apart from the substrate, and the nonvolatile memory device further comprises an active pillar that faces sidewalls of the gate patterns and comprises the active region connected to the substrate.

Exemplary embodiments of the present general inventive concept may also provide a method of fabricating a memory device, including forming a tunnel dielectric layer on an active region of a substrate, forming a trap insulation layer on the tunnel dielectric layer, forming a blocking insulation layer including a fixed charge layer on the trap insulation layer, and forming at least one gate electrode on the blocking insulation layer, the fixed charge layer being separated from the gate electrode.

The method may also include where the fixed charge layer has a lower electron affinity than the rest of the blocking insulation layer.

The method may also include where the dielectric constant of the blocking insulation layer is greater than the tunnel insulation layer.

The method may also include where the blocking insulation layer is formed of at least one of silicon oxide layer, a silicon nitride layer, a silicon oxynitride layer, and a high-dielectric-constant layer.

The method may also include where the high-dielectric-constant layer is formed of at least one of a metal oxide layer, a metal nitride layer, and a metal oxynitride layer.

The method may also include where the high-dielectric-constant layer is formed of hafnium (Hf), zirconium (Zr), aluminum (Al), tantalum (Ta), lanthanum (La), cerium (Ce), or praseodymium (Pr).

The method may also include where the charge density of the fixed charge layer is greater than the remaining portion of the blocking insulation layer.

The method may also include where the forming of the blocking insulation layer includes forming the fixed charged layer between a first blocking insulation layer and a second blocking insulation layer, where the first blocking layer is formed such that it is between the gate electrode and the fixed charge layer, and the second blocking insulation layer is formed such that it is between the fixed charge layer and the trap insulation layer.

The method may also include where the electron affinity of the first blocking insulation layer is greater than that of the fixed charge layer, and the electron affinity of the second blocking insulation layer is less than that of the fixed charge layer.

The method may also include forming a supplementary layer between the second blocking insulation layer and the fixed charge layer, the supplementary layer having a higher dielectric constant than the tunnel dielectric layer.

The method may also include forming a contribution layer within the blocking insulation layer such that the fixed charge layer is formed by a reaction between the supplementary layer and the contribution layer.

The method may also include where the forming the blocking insulation layer includes forming a first blocking insulation layer on at least two sides of the gate electrode, and forming a second blocking insulation layer between the fixed charge layer and the trap insulation layer, where the fixed charge layer is formed between at least a portion of the first blocking insulation layer and the second blocking insulation layer.

The method may also include where the forming the blocking insulation layer includes forming the blocking insulation layer on at least two sides of the gate electrode.

The method may also include where the forming the at least one gate electrode includes forming at least one control gate electrode, and forming a pair of selection gate electrodes for each of the at least one control gate electrodes.

The method may also include forming a lower mask layer between each of the at least one control gate electrodes, and forming an upper mask layer on the lower mask layer.

The method may also include forming a source region and a drain region in the active region on at least one side of the gate electrode.

The method may also include forming channel regions in the active region between a first control gate and a second control gate of the at least one control gate.

The method may also include where the fixed charge layer includes a dielectric material comprising at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At).

The method may also include where the tunnel dielectric layer, the trap insulation layer, the blocking insulation layer, the fixed charge layer, and the at least one gate electrode is formed by one of a chemical vapor deposition (CVD) process, a physical vapor deposition (PVD) process, and an atomic layer deposition (ALD) process.

The method may also include where the forming a fixed charge layer includes generating fixed charges with a gas that includes at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At).

Exemplary embodiments of the present general inventive concept may also provide a method of manufacturing a semiconductor device, the method including forming an active region in a substrate, forming a tunnel dielectric layer on the active region, forming a trap insulation layer on the tunnel insulation layer, forming a lower blocking insulation layer of the trap insulation layer, forming a mask pattern on the lower blocking insulation layer, etching the mask pattern to form gate electrode patterns such that the lower blocking insulation layer is exposed between adjacent mask patterns, forming a first blocking insulation layer on the mask patterns, forming a gate conductive layer on the blocking insulation layer, performing a planarization process on the gate conductive layer, removing the mask pattern by an etching process, and implanting impurities into the active region through spaces formed by removing the mask patterns.

The method may also include forming a fixed charge layer on the lower blocking insulation layer.

The method may also include forming a fixed charge layer between the lower blocking insulation layer and the first blocking insulation layer.

The method may also include sequentially forming the lower blocking insulation layer, a supplemental layer, and a fixed charge layer on the trap insulation layer, where the lower blocking insulation layer is formed on the trap insulation layer, the supplemental layer is formed on the lower blocking insulation layer, and the fixed charge layer is formed on the supplemental layer.

The method may also include sequentially forming the lower blocking insulation layer, a supplemental layer, a fixed charge layer, and a contribution layer on the trap insulation layer, where the lower blocking insulation layer is formed on the trap insulation layer, the supplemental layer is formed on the lower blocking insulation layer, the fixed charge layer is formed on the supplemental layer, and the contribution layer is formed on the fixed charge layer.

The method may also include where the planarization process is a back-etch process or chemical mechanical polishing.

Exemplary embodiments of the present general inventive concept may also provide a memory device, including a tunnel dielectric layer formed on an active region of a substrate, a trap insulation layer formed on the tunnel dielectric layer, a blocking insulation layer including a fixed charge layer, the blocking insulation layer formed on at least a portion of the trap insulation layer, and a gate electrode on the blocking insulation layer, the fixed charge layer being separated from the gate electrode.

The memory device may also include where the fixed charge layer has a lower electron affinity than the rest of the blocking insulation layer.

The memory device may also include where the dielectric constant of the blocking insulation layer is greater than the tunnel insulation layer.

The memory device may also include where the blocking insulation layer is formed of at least one of silicon oxide layer, a silicon nitride layer, a silicon oxynitride layer, and a high-dielectric-constant layer.

The memory device may also include where the high-dielectric-constant layer at least one of a metal oxide layer, a metal nitride layer, and a metal oxynitride layer.

The memory device may also include where the high-dielectric-constant layer comprises one of hafnium (Hf), zirconium (Zr), aluminum (Al), tantalum (Ta), lanthanum (La), cerium (Ce), or praseodymium (Pr).

The memory device may also include where the charge density of the fixed charge layer is greater than the remaining portion of the blocking insulation layer.

The memory device may also include where the blocking insulation layer includes the fixed charged layer formed between a first blocking insulation layer and a second blocking insulation layer, where the first blocking layer is formed such that it is between the gate electrode and the fixed charge layer, and the second blocking insulation layer is formed such that it is between the fixed charge layer and the trap insulation layer.

The memory device may also include where the electron affinity of the first blocking insulation layer is greater than that of the fixed charge layer, and the electron affinity of the second blocking insulation layer is less than that of the fixed charge layer.

The memory device may also include a supplementary layer formed between the second blocking insulation layer and the fixed charge layer, the supplementary layer having a higher dielectric constant than the tunnel dielectric layer.

The memory device may also include a contribution layer formed within the blocking insulation layer such that the fixed charge layer is formed by a reaction between the supplementary layer and the contribution layer.

The memory device may also include where the blocking insulation layer has a first blocking insulation layer formed on at least two sides of the gate electrode, and a second blocking insulation layer that is formed between the fixed charge layer and the trap insulation layer, where the fixed charge layer is formed between at least a portion of the first blocking insulation layer and the second blocking insulation layer.

Exemplary embodiments of the present general inventive concept may also provide a method of manufacturing a semiconductor device, the method including forming an active region in a substrate, forming a tunnel dielectric layer on the active region, forming a trap insulation layer on the tunnel insulation layer, forming a lower blocking insulation layer of the trap insulation layer, forming lower mask layers on the lower blocking insulation layer, and forming upper mask layers on the lower mask layers such that the lower blocking insulation layer is exposed between adjacent lower and upper mask layers, forming a first blocking layer on the substrate where at least the upper and lower mask layers are formed, forming a gate conductive layer on the first blocking insulation layer, forming gate electrodes by performing a planarization process using the upper mask patterns as an etch stop layer, and removing the upper mask layers and the lower mask layers.

The method may also include where the gate electrodes comprise one or more control gate electrodes between a pair of selection gate electrodes.

The method may also include where the upper mask layers and the lower mask layers are removed on either side of the pair of the selection gate electrodes.

The method may also include forming a source/drain region in the active region on at least one side of the pair of the selection gate electrodes.

The method may also include where the planarization process is a back-etch process or chemical mechanical polishing.

Exemplary embodiments of the present general inventive concept may also provide a method of manufacturing a semiconductor device, the method including forming an active region in a substrate, forming a tunnel dielectric layer on the active region, forming gate electrodes on the tunnel dielectric layer, forming a blocking insulation layer between the gate electrodes and a surface of the tunnel dielectric layer, forming a trap insulation layer between the blocking insulation layer and the tunnel dielectric layer, forming lower mask layers on the trap insulation layer, and forming upper mask layers on the lower mask layers, and removing the mask layers.

The method may also include where the gate electrodes are formed in series on the substrate.

The method may also include where the forming the gate electrodes comprises forming control gate electrodes between a pair of selection gate electrodes.

The method may also include forming channel regions in the active region between adjacent control gate electrodes.

The method may also include where the blocking insulation layer comprises a fixed charge layer spaced apart from the gate electrodes.

The method may also include where the blocking insulation layer includes a bottom portion and a sidewall portion extending from the bottom portion.

The method may also include where the sidewall portion of the blocking insulation layer covers at least a portion of the sidewall of the gate electrodes.

The method may also include forming source/drain regions in the active region on at least one side of the gate electrodes.

Exemplary embodiments of the present general inventive concept may also provide a method of manufacturing a semiconductor device, the method including forming an active region in a substrate, forming a tunnel dielectric layer on the active region, forming a charge trap layer on the tunnel dielectric layer, forming gate electrode patterns of the charge trap layer, forming mask patterns between adjacent gate electrode patterns, removing the gate electrode patterns such that the trap insulation layer is exposed between the adjacent mask patterns, forming a blocking insulation layer on a top surface and sidewalls of the mask patterns and on the exposed trap insulation layer, forming a gate conductive layer on the blocking insulation layer, and forming gate electrodes by performing a planarization process using the mask patterns as an etch stop layer.

The method may also include a top surface of the blocking insulation layer that has a lower height than a top surface of the mask patterns.

The method may also include where the blocking insulation layer includes a bottom portion and a sidewall portion extending from the bottom portion.

The method may also include where the planarization process is an etch process.

The method may also include forming source/drain regions in the active region on at least one side of the gate electrode.

Exemplary embodiments of the present general inventive concept may also provide a method of manufacturing a semiconductor device, the method including forming an active region in a substrate, forming a tunnel dielectric layer on the active region, forming a trap insulation layer on the tunnel dielectric layer, forming lower mask layers on the trap insulation layer, and upper mask layers on the lower mask layers such that at least a portion of the trap insulation layer is exposed between the adjacent lower mask layers and upper mask layers, forming a blocking insulation layer at least on the lower and upper mask layers, forming a gate conductive layer on the blocking insulation layer, and forming gate electrodes with a planarization process by using the upper mask layers as an etch stop layer.

The method may also include where the gate electrodes include control gate electrodes disposed between a pair of selection gate electrodes.

The method may also include removing the lower and upper mask layers on at least one side of the pair of the selection gate electrodes.

The method may also include forming source/drain regions in the active region on at least one side of the gate electrode.

Exemplary embodiments of the present general inventive concept may also provide a method of manufacturing a semiconductor device, the method including forming an active pillar extending in a first direction on a substrate, the active pillar having an active region, forming a common source region that is electrically connected to the active pillar, stacking a ground select gate pattern, a plurality of cell gate patterns, and a plurality of string select gate patterns on the substrate along a sidewall of the active pillar, with the active pillar penetrating the ground select gate pattern, the plurality of cell gate patterns, and the plurality of string select gate patterns, forming cell inter-gate insulation layers between the ground select gate pattern, a plurality of cell gate patterns, and a plurality of string select gate patterns, forming bit lines on the plurality of the string select gate patterns, and forming a charge store pattern between the cell gate patterns and the active pillar.

The method may include where the common source region is a plate within a cell region of the substrate between the substrate and the active pillar.

The method may include where the substrate comprises a well of a dopant of a first conductivity type.

The method may include where the common source region has a second conductivity type with a different dopant than the well.

The method may include where the ground select gate pattern, the plurality of cell gate patterns, and the plurality of string select gate patterns have plate forms that are parallel to the substrate.

The method may include where the cell inter-gate insulation layers comprise an oxide.

The method may include where the ground selection gate pattern is disposed between the substrate and a first cell gate pattern, and a ground selection insulation layer is disposed between the ground selection pattern and the substrate.

The method may include where the ground selection gate pattern is connected to a ground select line through a ground select gate plug that penetrates an interlayer dielectric layer.

The method may include where the string select gate pattern is formed on the plurality of cell gate patterns.

The method may include where the inter-gate insulation layers are formed between the select gate patterns and the cell gate patterns.

The method may include forming a string select insulation layer between the string select gate patterns and the bit lines.

The method may include electrically connecting the string select gate pattern to the string select line with a string select plug that penetrates the string select insulation layer.

The method may also include connecting the bit lines to the active pillar through a drain region in a portion of the active pillar.

The method may also include where the charge store pattern is formed so as to penetrate the cell gate patterns and the select gate patterns.

The method may also include where the charge store pattern is formed to surround the active pillar.

The method may also include where the charge store pattern comprises a tunnel dielectric layer, a trap insulation layer, and a blocking insulation layer.

Exemplary embodiments of the present general inventive concept may also provide a method of erasing a memory device having a tunnel dielectric layer on an active region of a substrate, a trap insulation layer on the tunnel dielectric layer, a blocking insulation layer including a fixed charge layer on the trap insulation layer, and a gate electrode on the blocking insulation layer, the fixed charge layer being separated from the gate electrode, the method including applying an erase voltage between the channel region and the gate electrode, generating a first electric field between the gate electrode and the fixed charge layer in the blocking insulation layer, the first electric field applied in a direction from the channel region to the gate electrode, and generating a second electric field between the gate electrode and the fixed charge layer by a difference in charge density between the fixed charge layer and the blocking insulation layer, the second electric field applied in an opposite direction to the first electric field, where the charges of the gate electrode pass through the blocking insulation layer and are injected into the trap insulation layer.

Exemplary embodiments of the present general inventive concept may also provide a method of programming a memory device having a tunnel dielectric layer on an active region of a substrate, a trap insulation layer on the tunnel dielectric layer, a blocking insulation layer including a fixed charge layer on the trap insulation layer, and a gate electrode on the blocking insulation layer, the fixed charge layer being separated from the gate electrode, the method including applying a programming voltage between the channel region and the gate electrode, generating a first electric field between the gate electrode and the channel region by applying a voltage to the gate electrode, the first electric field being in a direction from the gate electrode to the channel region, and generating a second electric field by a difference of charge density between the fixed charge layer and the blocking insulation layer, the second electric field being in a direction from the blocking insulation layer to the fixed charge layer and in an opposite direction from the first electric field to decrease the intensity of the first electric field.

BRIEF DESCRIPTION OF THE DRAWINGS

The accompanying figures are comprised to provide a further understanding of the present invention, and are incorporated in and constitute a part of this specification. The drawings illustrate exemplary embodiments of the present general inventive concept and, together with the description, serve to explain principles of the present general inventive concept. In the figures:

FIGS. 7A to 7D are cross-sectional views illustrating a method of manufacturing a nonvolatile memory device according to exemplary embodiments of the present general inventive concept;

FIG. 9A is a cross-sectional view of nonvolatile memory device according to exemplary embodiments of the present general inventive concept;

FIGS. 11A to 11D are cross-sectional views illustrating a method of manufacturing a nonvolatile memory device according to exemplary embodiments of the present general inventive concept;

FIGS. 12A and 12B are cross-sectional views illustrating a method of manufacturing a nonvolatile memory device according to exemplary embodiments of the present general inventive concept;

FIG. 13 is a plan view of a nonvolatile memory device according to exemplary embodiments of the present general inventive concept;

FIGS. 20A to 20H are cross-sectional views illustrating a method of manufacturing a nonvolatile memory device according to exemplary embodiments of the present general inventive concept.

DETAILED DESCRIPTION OF PREFERRED EMBODIMENTS

Figure 1A:
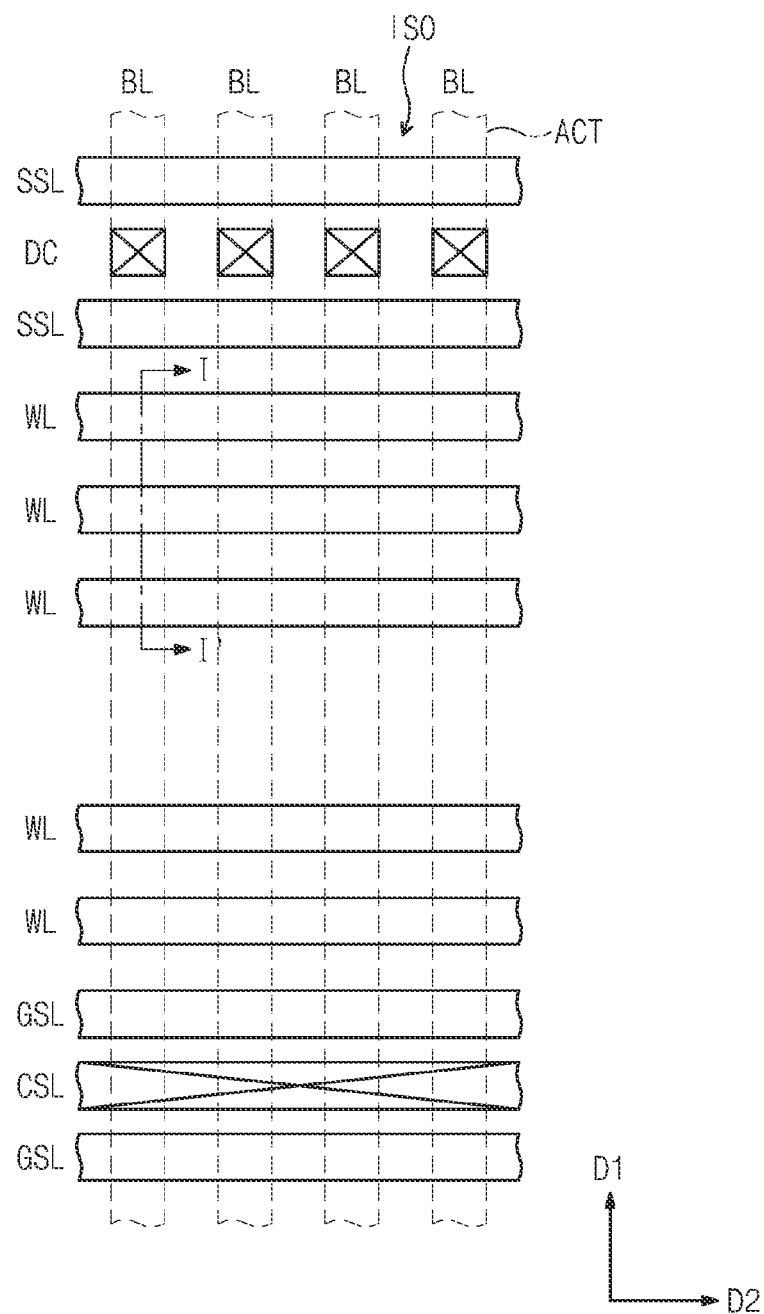
FIG. 1A is a schematic plan view of a nonvolatile memory device according to exemplary embodiments of the present general inventive concept.

Exemplary embodiments of the present general inventive concept will be described below in more detail with reference to the accompanying drawings. The present general inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

A nonvolatile memory device according to a first embodiment of the present general inventive concept will be described with reference to FIGS. 1A, 1B and 2. FIG. 1A is a schematic plan view of a nonvolatile memory device according exemplary embodiments of the present general inventive concept, FIG. 1B is a circuit diagram of the nonvolatile memory device, and FIG. 2 is a cross-sectional view taken along line I-I' of FIG. 1A.

Figure 1B:
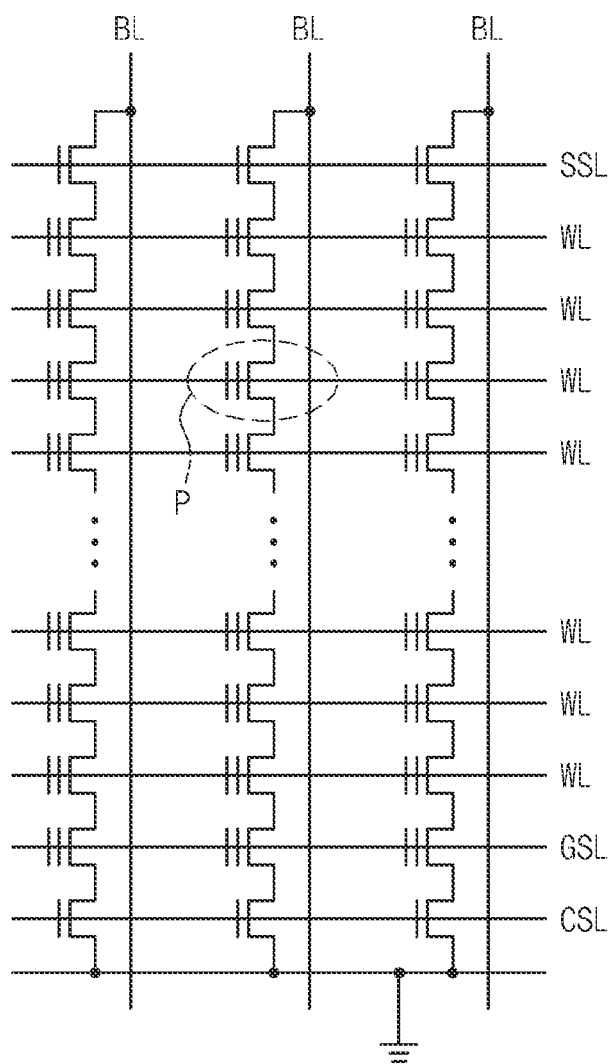
FIG. 1B is a circuit diagram of the nonvolatile memory device according to exemplary embodiments of the present general inventive concept.

Referring to FIGS. 1A and 1B, a semiconductor device 100 (e.g., illustrated in FIG. 2) having a cell region comprises an active region ACT defined by a device isolation region ISO, and the active region ACT may extend a first direction D1. The active region ACT may comprise a channel region. Upon operation of the nonvolatile memory device, a channel may be formed within the channel region. A plurality of word lines WL may extend in a second direction D2 intersecting with one or more lines extending in the first direction D1 (e.g., one or more word lines extending in the second direction may intersect with one or more bit lines in the active region ACT that extend in the first direction D1). The word lines WL may extend in the second direction D2 between a string select line SSL and a ground select line GSL, which are parallel to the word lines WL. At one side of the ground select line GSL, a common source line CSL may be provided in parallel to the ground select line GSL (e.g., the ground select line GSL and the common source line CSL extend parallel to one another in the second direction D2). A plurality of bit lines BL may extend in a direction intersecting with the word lines WL. As illustrated in FIG. 1A, the bit lines BL extend in a first direction D1 and intersect the word lines WL that extend in the second direction D2. The bit lines BL may be connected to the active region ACT adjacent to the string select line SSL through a contact DC.

Figure 2:
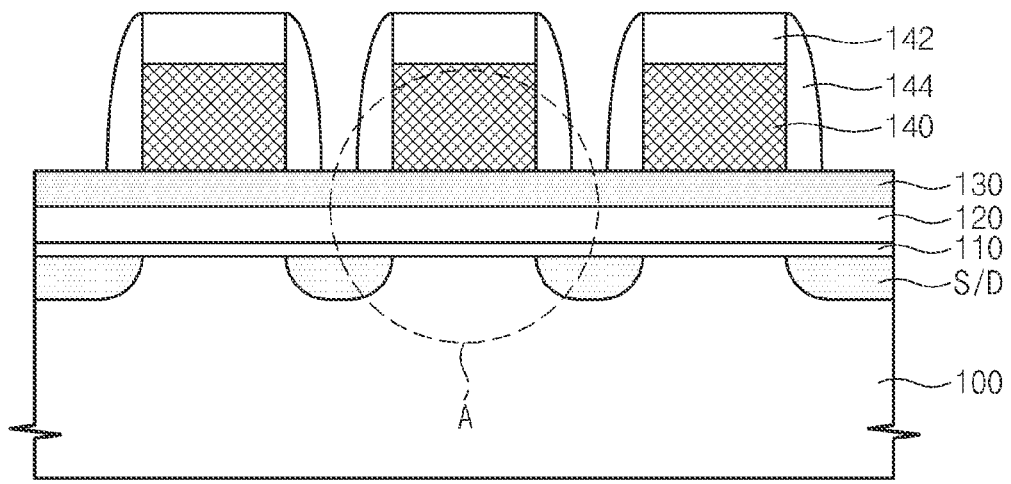
FIG. 2 is a cross-sectional view taken along line I-I' of FIG. 1A, illustrating the nonvolatile memory device according to exemplary embodiments of the present general inventive concept.

Referring to FIGS. 1A and 2, the substrate 100 having the active region ACT is provided. The substrate 100 may comprise a semiconductor having a single crystal structure or any other suitable structure which will perform the intended purposes as described herein. A tunnel dielectric layer 110 having a first surface contacting the active region ACT and a second surface opposite to the first surface may be provided on the substrate 100. A gate electrode 140 may be provided on the second surface of the tunnel dielectric layer 110. A blocking insulation layer 130 may be provided between the second surface of the tunnel dielectric layer 110 and the gate electrode 140. The blocking insulation layer 130 may comprise a fixed charge layer (e.g., fixed charge layer 135 illustrated in FIGS. 3A-3D). The fixed charge layer may be spaced apart from the gate electrode 140. A trap insulation layer 120 may be provided between the block insulation layer 130 and the second surface of the tunnel dielectric layer 110.

The tunnel dielectric layer 110 may be a single layer or a multi layer. For example, the tunnel dielectric layer 110 may comprise at least one of a silicon oxynitride layer, a silicon nitride layer, a silicon oxide layer, and a metal oxide layer.

The trap insulation layer 120 may comprise charge trap sites to store electric charges. For example, the trap insulation layer 120 may comprise at least one of a silicon nitride layer, a metal nitride layer, a metal oxynitride layer, a metal silicon oxide layer, a metal silicon oxynitride layer, and nanodots. The trap insulation layer 120 can trap electric charges of the same conductivity as carriers generated in the channel upon operation of the nonvolatile memory device. For example, if the nonvolatile memory device is an NMOS (n-type (i.e., negative type) Metal Oxide Semiconductor) type memory device, electrons may be trapped in the trap insulation layer 120.

The gate electrode 140 may be a single layer or a multi layer. The gate electrode 140 may comprise at least one of a doped polysilicon layer, a metal silicide layer, and a metal nitride layer. The metal silicide layer may comprise a tungsten silicide layer, a titanium silicide layer, a cobalt silicide layer, or a tantalum silicide layer. The metal nitride layer may comprise a titanium nitride layer or a tantalum nitride layer.

A source and drain region S/D may be provided in the active region ACT in one or more sides of the gate electrode 140. The source and drain region S/D may be a region doped with dopants (e.g., with n-type dopants or p-type dopants, etc.). Alternatively, the source and drain region S/D may be provided by an inversion layer. The inversion layer may be formed by a fringe field generated at the gate electrode 140 due to an operating voltage. A capping insulation layer 142 may be provided on the gate electrode 140. A spacer 144 may be provided on both sidewalls of the gate electrode 140.

A blocking insulation layer according to exemplary embodiments of the present general inventive concept will be described below in connection with FIG. 3A, which is an enlarged view of a portion A of FIG. 2.

Figure 3A:
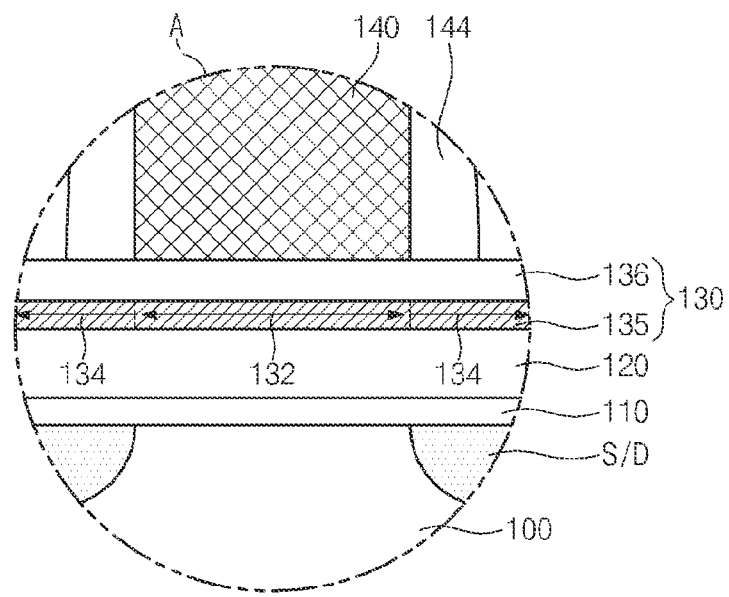
FIGS. 3A to 3D are enlarged views of a portion A of FIG. 2, illustrating blocking insulation layers according to exemplary embodiments of the present general inventive concept.

Referring to FIG. 3A, the blocking insulation layer 130 may comprise a fixed charge layer 135 disposed and/or formed on the trap insulation layer 120. The fixed charge layer 135 may contact the trap insulation layer 120. The blocking insulation layer 130 may comprise a first blocking insulation layer 136 between the fixed charge layer 135 and the gate electrode 140. The fixed charge layer 135 may be spaced apart from the gate electrode 140.

The fixed charge layer 135 may include a material to generate fixed charges. For example, the fixed charge layer 135 may include a dielectric material comprising at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). For example, the fixed charge layer 135 may comprise aluminum nitride. The fixed charges may be the same conductivity type as carriers generated within the channel upon operation of the nonvolatile memory device. For example, if the nonvolatile memory device according to an embodiment of the present general inventive concept is an NMOS type memory device, the fixed charges may be electrons.

The fixed charges may be fixed charge-dots spaced apart from one another within the fixed charge layer 135. The fixed charge-dots may be distributed substantially uniformly within the fixed charge layer 135.

The first blocking insulation layer 136 may have a material different from the fixed charge layer 135. The electron affinity of the first blocking insulation layer 136 may be greater than that of the fixed charge layer 135.

The first blocking insulation layer 136 may be a single layer or a multi layer. The first blocking insulation layer 136 may comprise at least one of a silicon oxide layer, a silicon nitride layer, a silicon oxynitride layer, and a high-dielectric-constant (high-k) layer. The high-k layer may comprise at least one of a metal oxide layer, a metal nitride layer, and a metal oxynitride layer. The high-k layer may comprise hafnium (Hf), zirconium (Zr), aluminum (Al), tantalum (Ta), lanthanum (La), cerium (Ce), or praseodymium (Pr). The dielectric constant of the first blocking insulation layer 136 may be greater than that of the tunnel insulation layer 110. For example, the first blocking insulation layer 136 may be formed of aluminum oxide.

The first blocking insulation layer 136 may include the fixed charges, which may be, for example, electrons. The first blocking insulation layer 136 may have the fixed charges of the same conductivity type as the fixed charge layer 135. The charge density of the first blocking insulation layer 136 may be smaller than that of the fixed charge layer 135.

Alternatively, the first blocking insulation layer 136 may be electrically neutral. In this case, the charge density of the first blocking insulation layer 136 is substantially zero. Accordingly, the charge density of the first blocking insulation layer 136 is smaller than that of the fixed charge layer 135.

Another example of the blocking insulation layer according to exemplary embodiments of the present general inventive concept will be described in connection with FIG. 3B, which is an enlarged view of the portion A of FIG. 2.

Figure 3B:
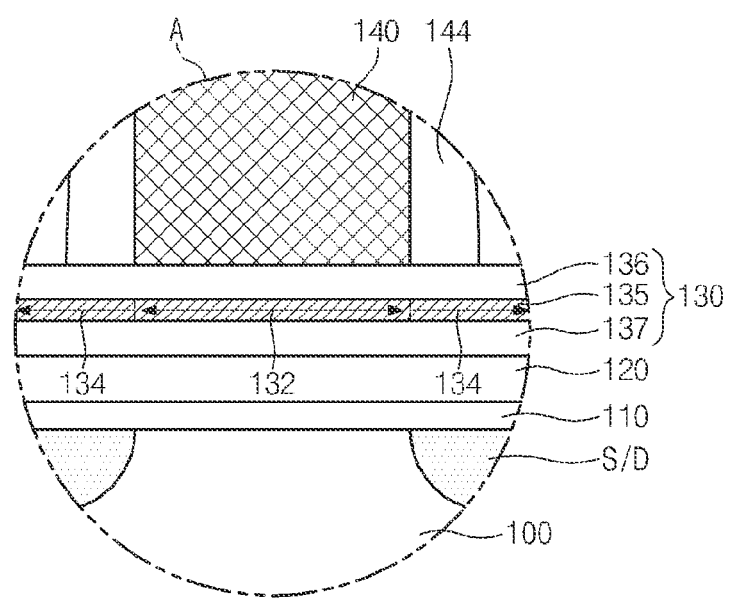

Referring to FIG. 3B, the blocking insulation layer 130 may comprise a fixed charge layer 135 formed and/or disposed on the trap insulation layer 120. The blocking insulation layer 130 may comprise a first blocking insulation layer 136 between the fixed charge layer 135 and the gate electrode 140. The fixed charge layer 135 may be spaced apart from the gate electrode 140. The blocking insulation layer 130 may comprise a second blocking insulation layer 137 between the fixed charge layer 135 and the trap insulation layer 120.

The second blocking insulation layer 137 may include a material different from the fixed charge layer 135. For example, the second blocking insulation layer 137 may include the same material as the first blocking insulation layer 136. The loss of the fixed charges of the fixed charge layer 135 can be reduced by the second blocking insulation layer 137 that is formed and/or disposed between the fixed charge layer 135 and the trap insulation layer 120. The electron affinity of the second blocking insulation layer 137 may be smaller than that of the fixed charge layer 135. The charge density of the fixed charge layer 135 may be greater than that of the second blocking insulation layer 137.

Another example of the blocking insulation layer according to exemplary embodiments of the present general inventive concept will be described with reference to FIG. 3C, which is an enlarged view of the portion A of FIG. 2.

Figure 3C:
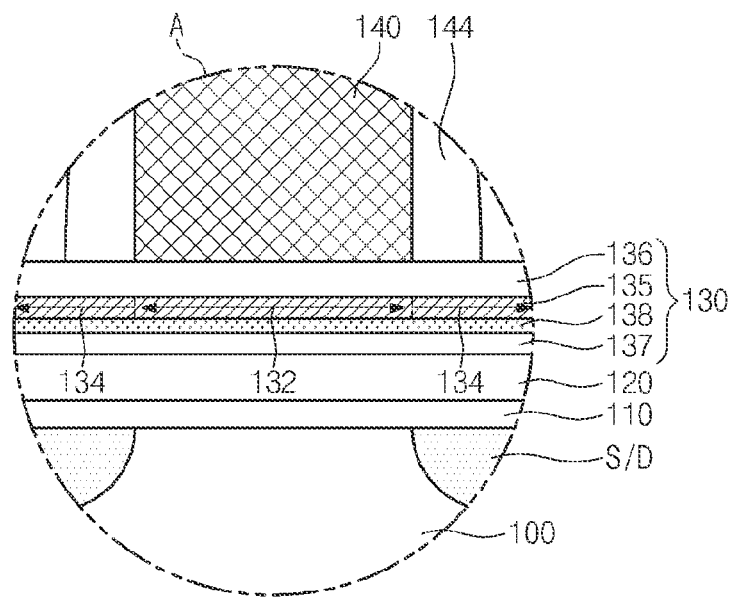

Referring to FIG. 3C, the blocking insulation layer 130 may comprise a fixed charge layer 135 formed and/or disposed on the trap insulation layer 120. The blocking insulation layer 130 may comprise a first blocking insulation layer 136 between the fixed charge layer 135 and the gate electrode 140. The fixed charge layer 135 may be spaced apart from the gate electrode 140. The blocking insulation layer 130 may comprise a second blocking insulation layer 137 between the fixed charge layer 135 and the trap insulation layer 120. The blocking insulation layer 130 may comprise a supplementary layer 138 between the second blocking insulation layer 137 and the fixed charge layer 135.

The supplementary layer 138 may have a higher dielectric constant than the tunnel dielectric layer 110. The supplementary 138 may comprise a metal oxide layer. For example, the metal oxide layer may comprise hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or ruthenium (Lu).

Another example of the blocking insulation layer according to exemplary embodiments of the present general inventive concept will be described in connection with FIG. 3D, which is an enlarged view of the portion A of FIG. 2.

Figure 3D:
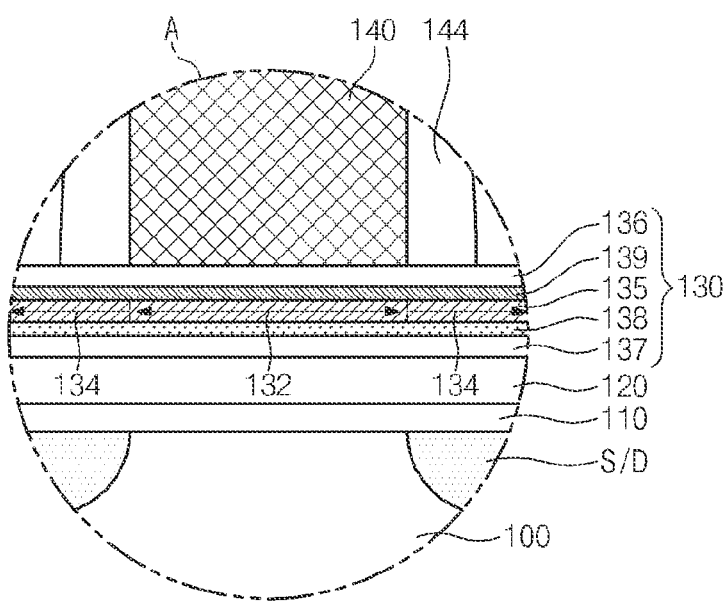

Referring to FIG. 3D, the blocking insulation layer 130 may comprise a fixed charge layer 135 on the trap insulation layer 120. The blocking insulation layer 130 may comprise a first blocking insulation layer 136 between the fixed charge layer 135 and the gate electrode 140. Hence, the fixed charge layer 135 may be spaced apart from the gate electrode 140. The blocking insulation layer 130 may comprise a second blocking insulation layer 137 between the fixed charge layer 135 and the trap insulation layer 120. The blocking insulation layer 130 may comprise a supplementary layer 138 between the second blocking insulation layer 137 and the fixed charge layer 135. The blocking insulation layer 130 may comprise a contribution layer 139 between the first blocking insulation layer 136 and the fixed charge layer 135.

The contribution layer 139 may include a material to generate fixed charges. For example, the contribution layer 139 may include at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). During the forming of the contribution layer 139, the fixed charge layer 135 may be formed. The fixed charge layer 135 may be formed by the reaction between the supplementary layer 138 and the contribution layer 139. For example, the supplementary layer 138 may comprise aluminum oxide, the contribution layer 139 may comprise silicon nitride, and the fixed charge layer 135 may comprise aluminum silicon nitride formed by the reaction between aluminum oxide and silicon nitride.

The fixed charges of the fixed charge layer 135 and the charges trapped in the trap insulation layer 120 may have the same conductivity type. For example, when the nonvolatile memory device is NMOS type, the fixed charges and the trapped charges may be electrons. Therefore, the electrical repulsive force (e.g., the repulsive force between electrons) can be generated between the fixed charge layer 135 and the trap insulation layer 120. Due to the electrical repulsive force, the charges trapped in the trap insulation layer 120 can tunnel through the tunnel insulation layer 110 in an erase operation of the nonvolatile memory device. Consequently, the erase characteristic of the nonvolatile memory device can be improved.

The fixed charges contained in the fixed charge layer 135 may be the same conductivity type as the charges stored in the trap insulation layer 120 and/or the carriers generated within the channel. For example, the fixed charges in the fixed charge layer 135 may be electrons, and the charges stored in the trap insulation layer 120 and/or the carriers generated within the channel may also be electrons. The electron affinity of the fixed charge layer 135 can be reduced by the fixed charges inside the fixed charge layer 135. As the charge density of the fixed charge layer 135 increases, the electron affinity may gradually decrease. Accordingly, the potential barrier of the fixed charge layer 135 with respect to the charges stored in the trap insulation layer 120 may increase. For example, when the nonvolatile memory devices according to the exemplary embodiments of the present general inventive concept are NMOS type, the fixed charge layer 135 may have electrons. The conduction band edge of the fixed charge layer 135 may be increased by the fixed charges (electrons). Consequently, the energy difference between the conduction band edge of the fixed charge layer 135 and the conduction band edge of the trap insulation layer 120 (that is, potential barrier for electrons stored in the trap insulation layer) may be increased. That is, by increasing the electrons at the conduction band edge of the fixed charge layer, the energy difference between the conduction band edge of the fixed charge layer 135 and the conduction band edge of the trap insulation layer 120 increases.

Therefore, in a retention mode of the nonvolatile memory device, the loss of the charges trapped within the trap insulation layer 120 toward the blocking insulation layer 130 may be reduced. Consequently, the data storage capability can be improved, and the nonvolatile memory device with improved reliability can be provided. That is, reducing the loss of trapped charges in the trap insulation layer 120 may increase the ability of the nonvolatile memory device to store data.

In the erase/program operation of the nonvolatile memory device, an erase/program voltage may be provided between the channel region and the gate electrode 140. Due to the erase/program voltage, electric field may be applied to the fixed charge layer 135. When the fixed charge layer 135 directly contacts the gate electrode 140 and the magnitude of the erase/program voltage is sufficiently large, the fixed charges of the fixed charge layer 135 may be lost. However, according to the exemplary embodiments of the present general inventive concept, the loss of the fixed charges of the fixed charge layer 135 may be reduced by the first blocking insulation layer 136 provided between the gate electrode 140 and the fixed charge layer 135.

In the program operation of the nonvolatile memory devices according to the exemplary embodiments of the present general inventive concept, a first electric field may be generated between the gate electrode 140 and the channel region by a voltage applied to the gate electrode 140 (e.g., a positive voltage). A second electric field may be generated by difference of charge density between the fixed charge layer 135 and the second blocking insulation layer 137. For example, the nonvolatile memory device may be NMOS type.

The first electric field may be applied in a direction from the gate electrode 140 to the channel region. As described above, the fixed charge layer 135 and the second blocking insulation layer 137 may have the fixed charges of the same conductivity type (e.g., where the fixed charges may be electrons). The second electric field may be applied in a direction from the second blocking insulation layer 137 to the fixed charge layer 135. The first electric field and the second electric field may be opposite in direction such that the intensity of the electric field applied within the blocking insulation layer 130 may be decreased, and the loss of the charges trapped in the trap insulation layer 120 may be reduced. Thus, in the program operation, the charges trapped in the trap insulation layer 120 that are lost through/into the blocking insulation layer 130 can be reduced.

In the erase operation of the nonvolatile memory devices according to the exemplary embodiments of the present general inventive concept, the erase voltage may be provided between the gate electrode 140 and the channel region. A first electric field may be generated between the gate electrode 140 and the fixed charge layer 135 by the erase voltage, such that the first electric field may be within the blocking insulation layer 130. For example, the nonvolatile memory device may be a NMOS type, where the carriers in the channel region are electrons. In this case, the potential of the channel region may be greater than that of the gate electrode 140. Therefore, the first electric field may be applied in a direction from the channel region to the gate electrode 140.

The fixed charge layer 135 and the first blocking insulation layer 136 may include fixed charges of the same conductivity type (e.g., the fixed charges may be electrons). The charge density of the fixed charge layer 135 may be greater than that of the first blocking insulation layer 136. A second electric field may be generated between the gate electrode 140 and the fixed charge layer 135 by the difference of charge density between the fixed charge layer 135 and the first blocking insulation layer 136. As the difference of charge density between the fixed charge layer 135 and the first blocking insulation layer 136 increases, the intensity of the second electric field may increase. The second electric field may be applied in an opposite direction to the first electric field. For example, when the nonvolatile memory device is NMOS type, the first electric field may be applied in a direction from the fixed charge layer 135 to the gate electrode 140. Since carriers within the NMOS channel are electrons, the fixed charge layer 135 and the first blocking insulation layer 136 may include electrons. Since the charge density of the fixed charge layer 135 is greater than that of the first blocking insulation layer 136, the second electric field may be applied in a direction from the gate electrode 140 to the fixed charge layer 135. Since the first electric field and the second electric field are opposite in direction, the intensity of the first electric field can be reduced by the second electric field.

In the erase operation of the nonvolatile memory device, since the electric field applied within the blocking insulation layer 130 decreases, the back tunneling phenomenon can be reduced. Due to the back tunneling, the charges of the gate electrode 140 pass through the blocking insulation layer 130 and are injected into the trap insulation layer 120 to increase the reliability of the nonvolatile memory device.

Referring to FIGS. 2 and 3A to 3D, the fixed charge layer 135 may comprise a first region 132 under the gate electrode 140, and a second region 134 extending into a region adjacent to the gate electrode 140. A program operation may be performed on a specific memory cell (P of FIG. 1B) of the nonvolatile memory device. Thus, the memory cell P may be programmed. For example, charges (for example, electrons) injected from the active region ACT may be trapped in the trap insulation layer 120.

Since memory cells share the trap insulation layer 120, charges (for example, electrons) trapped in the trap insulation layer 120 may be spread in a bit line (BL) direction (e.g., direction D1 as illustrated in FIG. 1A) or a lateral direction (e.g., direction D2 as illustrated in FIG. 1A). In this case, the retention of data in the programmed memory cell P is reduced when the charges trapped in the trap insulation layer 120 are spread in the bit line (BL) or lateral directions.

According to the exemplary embodiments of the present general inventive concept, the second region 134 of the fixed charge layer 135 can reduce the lateral spreading of charges trapped in the trap insulation layer 120. For example, the fixed charges included in the fixed charge layer 135 may have the same conductivity type as the charges trapped in the trap insulation layer 120. For example, the fixed charges of the fixed charge layer and the charges trapped in the trap insulation layer 120 may be electrons. Hence, the electrical repulsive force (for example, repulsive force between the charges having the same conductivity type, such as electrons) can be applied between the second region 134 of the fixed charge layer 135 and the trap insulation layer 120. Consequently, the lateral charge spreading of charges trapped in the trap insulation layer 120 can be reduced.

A method of manufacturing a nonvolatile memory device according to exemplary embodiments of the present general inventive concept is discussed below.

Referring to FIGS. 1A and 2, a substrate 100 is provided. The substrate 100 may comprise a silicon substrate having a single crystal structure or any other suitable structure which will perform the intended purposes as described herein. A device isolation region ISO may be formed in the substrate 100. The device isolation region ISO may define an active region ACT. A tunnel dielectric layer 110 may be formed on the substrate 100. The tunnel dielectric layer 110 may have a first surface contacting the active region ACT and a second surface facing the first surface. The tunnel dielectric layer 110 may comprise at least one of a silicon oxide layer, a silicon nitride layer, a silicon oxynitride layer, and a metal oxide layer. The tunnel dielectric layer 110 may be formed by any one of a chemical vapor deposition (CVD) process, a physical vapor deposition (PVD) process, and an atomic layer deposition (ALD) process. A trap insulation layer 120 may be formed on the second surface of the tunnel dielectric layer 110. The trap insulation layer 120 may comprise at least one of a silicon nitride layer, a metal nitride layer, a metal oxynitride layer, a meal silicon oxynitride layer, and nano dots. The trap insulation layer 120 may be formed by any one of a CVD process, a PVD process, and an ALD process.

A blocking insulation layer 130 may be formed on the trap insulation layer 120. A gate electrode 140 and a capping insulation layer 142 may be formed on the blocking insulation layer 130. The gate electrode 140 may comprise at least one of a doped polysilicon layer, a metal silicide layer, and a metal nitride layer. The gate electrode 140 may be formed by any one of a CVDP process, a PVD process, and an ALD process. The gate electrode 140 and the capping insulation layer 142 may be patterned.

A method of forming the blocking insulation layer according to exemplary embodiments of the present general inventive concept is described below.

Referring to FIG. 3A, a fixed charge layer 135 may be formed on the trap insulation layer 120. The fixed charge layer 135 may include a material to generate fixed charges, such as, for example, nitrogen (N), fluorine (F), phosphorus (P), sulfur (S), chlorine (CI), carbon (C), arsenic (As), selenium (Se), bromine (Br), tellurium (Te), iodine (I), and astatine (At). For example, the fixed charge layer 135 may comprise aluminum nitride. The fixed charge layer 135 may comprise at least one of the above-described materials that generate the fixed charges.

The fixed charge layer 135 may be formed by thermally treating the trap insulation layer 120. The thermal treatment may use a gas that may be at least one of the above-described materials that generate the fixed charges. For example, the thermal treatment may be performed at about 500° C. to about 1,000° C. in a nitrogen-containing environment such as $NH_3$, NO, and $N_2O$. The fixed charge layer 135 may also be formed by a plasma process on the trap insulation layer 120. The plasma process may be performed in an ambient of gas of at least one of the above-described materials that generate the fixed charges. For example, the plasma process may be a plasma nitridation process using nitrogen-containing gas. The fixed charge layer 135 may be formed by any one of a CVD process, a PVD process, and an ALD process. The fixed charge layer 135 may comprise aluminum nitride. The gases used in the above-described deposition processes may comprise at least one of the above-described materials that generate the fixed charges.

The charge density of the fixed charge layer 135 may be changed according to the concentration of the material to generate the fixed charges within the fixed charge layer 135. The concentration of the material to generate the fixed charges may be adjusted during the forming the fixed charge layer 135. For example, the charge density of the fixed charge layer 135 may be adjusted by the concentration of the material generating the fixed charges, which is contained in the gas used in the thermal treatment, plasma process or deposition processes for forming the fixed charge layer 135.

A first blocking insulation layer 136 may be formed on the fixed charge layer 135. The first blocking insulation layer 136 may comprise at least one of a silicon oxide layer, a silicon nitride layer, a silicon oxynitride layer, and a high-k layer (e.g., a layer having a high dielectric constant). The first blocking insulation layer 136 may be formed by at least one of a CVD process, a PVD process, and an ALD process.

Another example method of forming the blocking insulation layer according to exemplary embodiments of the present general inventive concept will be described.

Referring to FIG. 3B, a second blocking insulation layer 137 may be formed on the trap insulation layer 120. The second block insulation layer 137 may comprise at least one of a silicon oxide layer, a silicon nitride layer, a silicon oxynitride layer, and a high-k layer. The second blocking insulation layer 137 may be formed by at least one of a CVD process, a PVD process, and an ALD process.

A fixed charge layer 135 and a first blocking insulation layer 136 may be formed on the second blocking insulation layer 137. The fixed charge layer 135 and the first blocking insulation layer 136 may be formed by the same method as described with reference to FIG. 3A.

Another example of the method of forming the blocking insulation layer according to exemplary embodiments of the present general inventive concept will be described.

Referring to FIG. 3C, a second blocking insulation layer 137 may be formed on the trap insulation layer 120. A supplementary layer 138 may be formed on the second blocking insulation layer 137. The supplementary layer 138 may have a higher dielectric constant than the tunnel dielectric layer 110. The supplementary layer 138 may comprise a metal oxide layer that may include, for example, hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or ruthenium (Lu).

The fixed charge layer 135 and the first blocking insulation layer 136 may be formed on the supplementary layer 138. The second blocking insulation layer 137, the fixed charge layer 135 and the first blocking insulation layer 136 may be formed in the same method as described with reference to FIGS. 3A and 3B.

Another example of the method of forming the blocking insulation layer according to exemplary embodiments of the present general inventive concept will be described in connection with FIG. 4.

Figure 4:
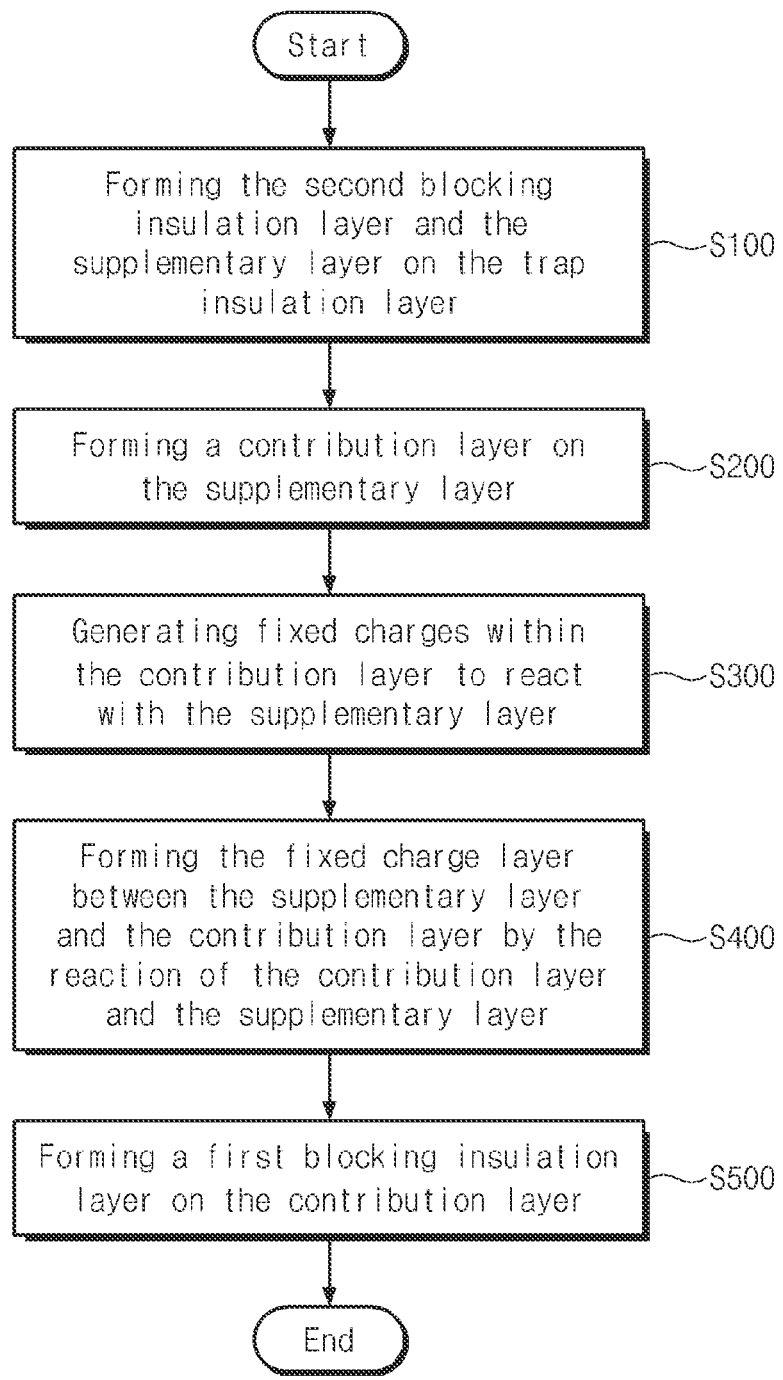
FIG. 4 is a flowchart illustrating a method of forming the blocking insulation layer according to exemplary embodiments of the present general inventive concept.

Referring to FIGS. 4 and 3D, the second blocking insulation layer 137 and the supplementary layer 138 may be formed on the trap insulation layer 120 (operation S100). The second blocking insulation layer 137 and the supplementary layer 138 may be formed in the method described with reference to FIG. 3C. A contribution layer 139 may be formed on the supplementary layer 138 (operation S200). The contribution layer 139 may comprise at least one of materials that generate the fixed charges. The contribution layer 139 may be formed by a CVD process, a PVD process, or an ALD process. The contribution layer 139 may react with the supplementary layer 138 (operation S300). Specifically, the material to generate fixed charges within the contribution layer 139 may react with the supplementary layer 138. The fixed charge layer 135 may be formed between the supplementary layer 138 and the contribution layer 139 by the reaction of the contribution layer 139 and the supplementary layer 138 (operation S400). For example, the contribution layer 139 may be a silicon nitride layer, and the supplementary layer 138 may be an aluminum oxide layer. The deposition temperature of the silicon nitride layer may be sufficiently high such that nitrogen existing within the silicon nitride layer is diffused. Therefore, nitrogen within the silicon nitride layer may be diffused into the aluminum oxide layer. The diffused nitrogen and the aluminum of the aluminum oxide layer may react with each other to form an aluminum nitride layer. The aluminum nitride layer may be a fixed charge layer having fixed charges. A first blocking insulation layer 136 may be formed on the contribution layer 139 (operation S500). The first blocking insulation layer 136 may be formed by the method described with reference to FIG. 3A.

A nonvolatile memory device according to exemplary embodiments of the present general inventive concept will be described in connection with FIG. 5A.

Figure 5A:
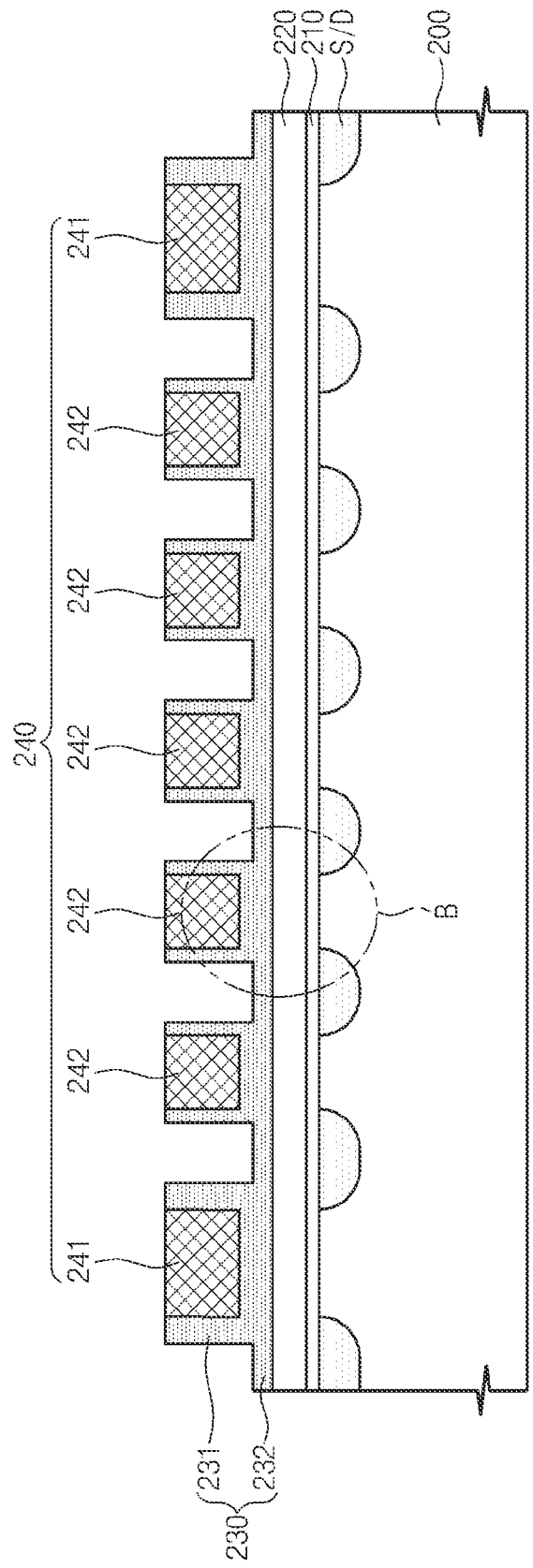
FIG. 5A is a cross-sectional view of a nonvolatile memory device according to exemplary embodiments of the present general inventive concept.

Referring to FIGS. 5A and 1A, a substrate 200 is provided. The substrate 200 may comprise a semiconductor having a single crystal structure or other suitable structure which will perform the intended purposes as described herein. The substrate 200 may comprise a device isolation region ISO. An active region ACT may be defined by the device isolation layer ISO. A tunnel dielectric layer 210 having a first surface contacting the active region ACT and a second surface opposite to the first surface may be provided. Gate electrodes 240 may be provided on the tunnel dielectric layer 210. The gate electrodes 240 may be provided in parallel on the substrate 200. The gate electrodes 240 may comprise a pair of selection gate electrodes 241. The gate electrodes 240 may comprise control gate electrodes 242 provided between the pair of the selection gate electrodes 241.

A blocking insulation layer 230 may be provided between the gate electrodes 240 and the second surface of the tunnel dielectric layer 210. The blocking insulation layer 230 may comprise a bottom portion of the blocking insulation layer 232 and a sidewall portion of the blocking insulation layer 231 extending from the bottom portion of the blocking insulation layer 232. The bottom portion of the blocking insulation layer 232 may comprise a fixed charge layer (see FIGS. 6A-6D). The bottom portion of the blocking insulation layer 232 may extend over the trap insulation layer 220. The sidewall portion of the blocking insulation layer 231 may cover at least a portion of the sidewalls of the gate electrodes 240. A trap insulation layer 220 may be provided between the blocking insulation layer 230 and the second surface of the tunnel dielectric layer 210.

A memory cell may comprise the tunnel dielectric layer 210, the trap insulation layer 220, the blocking insulation layer 230, and the control gate electrode 242. The memory cell may form a serially-connected NAND structure. A select transistor may comprise the tunnel dielectric layer 210, the trap insulation layer 220, the blocking insulation layer 230, and the selection gate electrode 241.

The tunnel dielectric layer 210 may be a single layer or a multi layer. For example, the tunnel dielectric layer 210 may comprise at least one of a silicon oxynitride layer, a silicon nitride layer, a silicon oxide layer, and a metal oxide layer.

The trap insulation layer 220 may comprise one or more charge trap sites to store electric charges. For example, the trap insulation layer 220 may comprise at least one of a silicon nitride layer, a metal nitride layer, a metal oxynitride layer, a metal silicon oxide layer, a metal silicon oxynitride layer, and nanodots. The trap insulation layer 220 can trap electric charges of the same conductivity type as carriers generated in the channel upon operation of the nonvolatile memory device. For example, when the nonvolatile memory device is an NMOS type memory device, electrons may be trapped in the trap insulation layer 220.

The gate electrodes 240 may be a single layer or a multi layer. The gate electrodes 240 may comprise at least one of a doped polysilicon layer, a metal silicide layer, and a metal nitride layer. The metal silicide layer may comprise a tungsten silicide layer, a titanium silicide layer, a cobalt silicide layer, or a tantalum silicide layer. The metal nitride layer may comprise a titanium nitride layer or a tantalum nitride layer.

A source/drain region S/D may be provided in the active regions ACT on either side of the gate electrodes 240. The source/drain region S/D may be regions doped with dopants (e.g., with n-type dopants or p-type dopants, etc.).

A nonvolatile memory device according to exemplary embodiments of the present general inventive concept will be described below in connection with FIG. 5B, which illustrates a cross-sectional view of a nonvolatile memory device In FIGS. 5A and 5B, like reference numerals are used to refer to like elements.

Figure 5B:
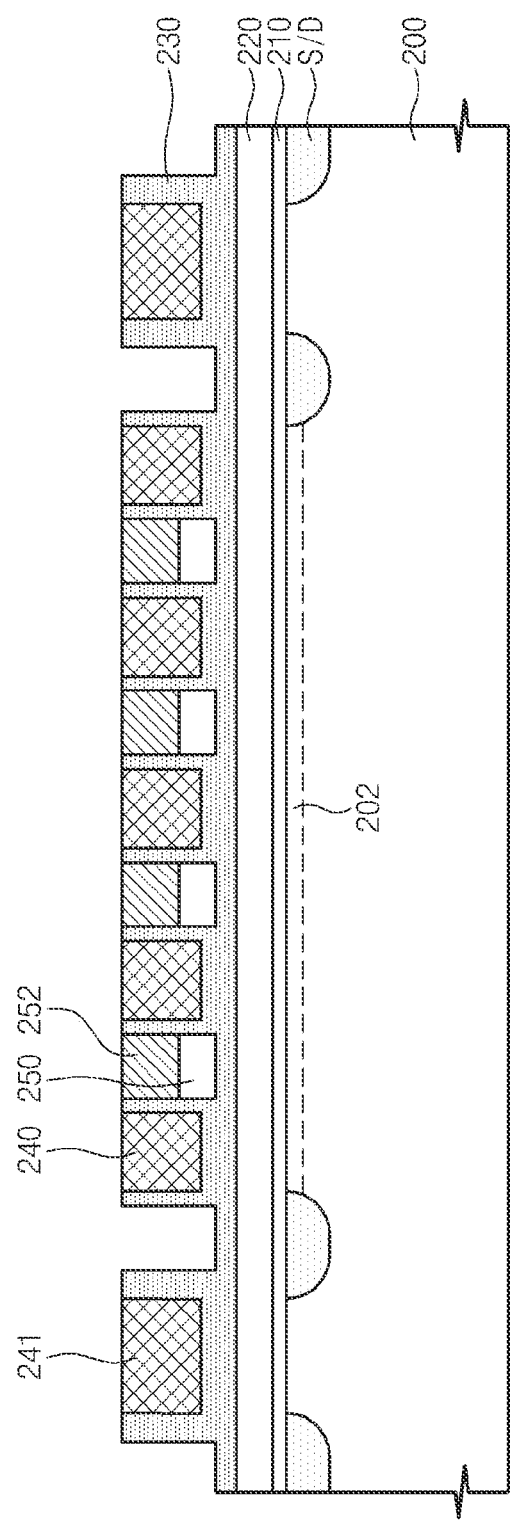
FIG. 5B is a cross-sectional view of a nonvolatile memory device according to exemplary embodiments of the present general inventive concept.

Referring to FIG. 5B, lower mask layers 250 may be provided between the control gate electrodes 242 adjacent to each other, and upper mask layers 252 may be provided on the lower mask layers 250. The lower mask layers 250 and the upper mask layers 252 may be provided on the blocking insulation layer 230. The lower mask layers 250 may have an etch selectivity to the trap insulation layer 220. The upper mask layers 252 may have an etch selectivity to the blocking insulation layer 230 and the gate electrodes 240. For example, the lower mask layers 250 may comprise an oxide layer, and the upper mask layers 252 may comprise a nitride layer. A source/drain region S/D may be provided in active regions on either side of the selection gate electrodes 241. The source/drain region S/D may be region doped with dopants (e.g., with n-type dopants or p-type dopants, etc.).

Channel regions 202 may be continuously formed on the active regions between the gate electrodes 240 adjacent to each other. The memory cells may be connected through the channel regions 202. The channel regions 202 may serve as a conduction path of charges upon operation of the memory cells. The channel regions 202 under the lower mask layers 250 may comprise inversion layers formed by an operating voltage applied to the gate electrodes 240 upon operation of the memory cells. The inversion layers may be formed by a fringe field generated in the gate electrodes 240 by the operating voltage. To continuously form the channel regions 202 by the fringe field of the gate electrodes 240, the widths of the upper mask layers 252 and the lower mask layers 250 may be adjusted. Alternatively, to reduce the threshold voltage of the channel regions 202 under the upper mask layers 252 and the lower mask layers 250, the doping concentration may be adjusted. For example, the doping concentrations of the channel regions 202 under the gate electrodes 240 and the lower mask layers 250 may be different from one another.

As such, the source/drain region within the memory cells may be omitted. Hence, the leakage current due to the depletion of the source/drain region can be reduced, and the punch-through can be prevented or reduced.

An example of the blocking insulation layer according to exemplary embodiments of the present general inventive concept will be described in connection with FIG. 6A, which is an enlarged view of a portion B of FIG. 5A.

Figure 6A:
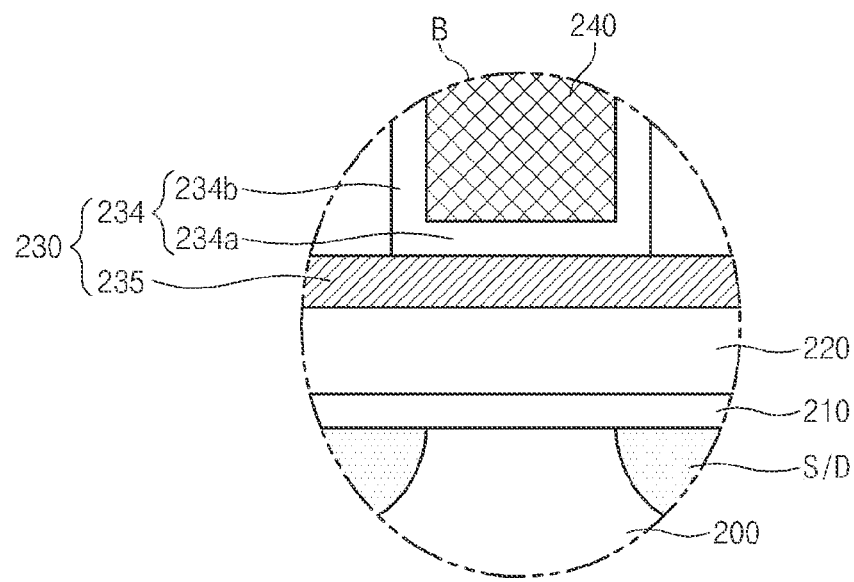
FIGS. 6A to 6D are enlarged views of a portion B of FIG. 5A, illustrating blocking insulation layers according to exemplary embodiments of the present general inventive concept.

Referring to FIG. 6A, the blocking insulation layer 230 may comprise a fixed charge layer 235 formed and/or disposed on the trap insulation layer 220. The fixed charge layer 235 may extend over the trap insulation layer 220. The blocking insulation layer 230 may comprise a first blocking insulation layer 234 between the fixed charge layer 235 and the gate electrode 240. The first blocking insulation layer 234 may comprise a bottom portion of the first blocking insulation layer 234a and a sidewall portion of the first blocking insulation layer 234b extending from the bottom portion of the blocking insulation layer 234a. The fixed charge layer 235 may be spaced apart from the gate electrode 240.

The blocking insulation layer 230 may comprise the bottom portion of the blocking insulation layer 232 and the sidewall portion of the blocking insulation layer 231 (see FIG. 5A). The sidewall portion of the blocking insulation layer 231 may comprise the sidewall portion of the first blocking insulation layer 234b. The bottom portion of the blocking insulation layer 232 may comprise the fixed charge layer 235 and the bottom portion of the first blocking insulation layer 234a.

The fixed charge layer 235 may include a material to generate fixed charges. For example, the fixed charge layer 235 may be a dielectric material comprising at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). For example, the fixed charge layer 235 may comprise aluminum nitride. The fixed charges may have the same conductivity type as carriers generated within the channel upon operation of the nonvolatile memory device. For example, when the nonvolatile memory device according to exemplary embodiments of the present general inventive concept is an NMOS type memory device, the fixed charges may be electrons.

The fixed charges may be distributed in a form of fixed charge-dots spaced apart from one another within the fixed charge layer 235. The fixed charge-dots may be distributed substantially uniformly within the fixed charge layer 235.

The first blocking insulation layer 234 may include a material different from the fixed charge layer 235. The electron affinity of the first blocking insulation layer 234 may be greater than that of the fixed charge layer 235.

The first blocking insulation layer 234 may be a single layer or a multi layer. The first blocking insulation layer 234 may comprise at least one of a silicon oxide layer, a silicon nitride layer, a silicon oxynitride layer, and a high-k layer. The high-k layer may comprise at least one of a metal oxide layer, a metal nitride layer, and a metal oxynitride layer. The high-k layer may comprise hafnium (Hf), zirconium (Zr), aluminum (Al), tantalum (Ta), lanthanum (La), cerium (Ce), or praseodymium (Pr). The dielectric constant of the first blocking insulation layer 234 may be greater than that of the tunnel insulation layer 210. For example, the first blocking insulation layer 234 may be formed of aluminum oxide to provide a higher dielectric constant than that of the silicon oxynitride layer, the silicon nitride layer, the silicon oxide layer, and/or the metal oxide layer of the tunnel insulation layer 210.

The first blocking insulation layer 234 may include the fixed charges. The first blocking insulation layer 234 may have the fixed charges of the same conductivity type as the fixed charge layer 235. For example, the fixed charges of the first blocking insulation layer 234 and of the fixed charge layer 235 may be electrons. The charge density of the first blocking insulation layer 234 may be smaller than that of the fixed charge layer 235.

The first blocking insulation layer 234 may be electrically neutral, where the charge density of the first blocking insulation layer 234 is substantially zero. Accordingly, the charge density of the first blocking insulation layer 234 is smaller than that of the fixed charge layer 235.

Another example of the blocking insulation layer according to exemplary embodiments of the present general inventive concept will be described in connection with FIG. 6B, which is an enlarged view of the portion B of FIG. 5A.

Figure 6B:
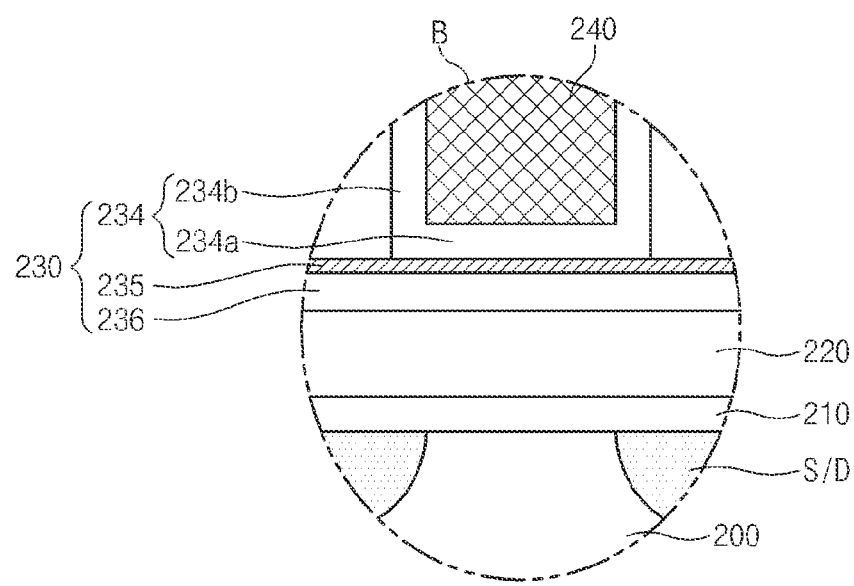

Referring to FIG. 6B, the blocking insulation layer 230 may comprise a fixed charge layer 235 on the trap insulation layer 220. The fixed charge layer 235 may extend over the trap insulation layer 220. The blocking insulation layer 230 may comprise a second blocking insulation layer 236 between the fixed charge layer 235 and the trap insulation layer 220. The second blocking insulation layer 236 may extend over the trap insulation layer 220. The blocking insulation layer 230 may comprise a first blocking insulation layer 234 between the fixed charge layer 235 and the gate electrode 240. The first blocking insulation layer 234 may comprise a bottom portion of the blocking insulation layer 234a and a sidewall portion of the blocking insulation layer 234b extending from the bottom portion of the blocking insulation layer 234a. The fixed charge layer 235 may be spaced apart from the gate electrode 240.

The blocking insulation layer 230 illustrated in FIG. 6B may comprise the bottom portion of the blocking insulation layer 232 (refer to FIG. 5A) and the sidewall portion of the blocking insulation layer 231 (refer to FIG. 5A). The blocking insulation layer 231 as illustrated in FIG. 5A may comprise the sidewall portion of the blocking insulation layer 234b as illustrated in FIG. 6B. The bottom portion of the blocking insulation layer 232 illustrated in FIG. 5A may comprise the second blocking insulation layer 236, the fixed charge layer 235, and the bottom portion of the first blocking insulation layer 234a, which are illustrated in FIG. 6B.

The second blocking insulation layer 236 may include a material different from the fixed charge layer 235, but the second blocking insulation layer 236 may include, for example, the same material as the first blocking insulation layer 234. The electron affinity of the second blocking insulation layer 236 may be less than that of the fixed charge layer 235. The charge density of the fixed charge layer 235 may be greater than that of the second blocking insulation layer 236.

Another example of the blocking insulation layer according to exemplary embodiments of the present general inventive concept will be described in connection with FIG. 6C, which is an enlarged view of the portion B of FIG. 5A.

Figure 6C:
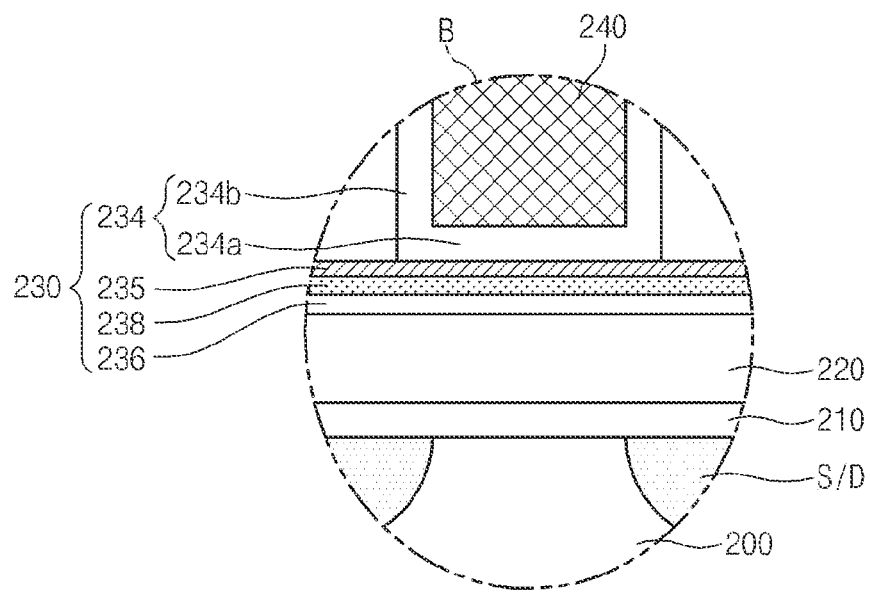

Referring to FIG. 6C, the blocking insulation layer 230 may comprise a fixed charge layer 235 formed and/or disposed on the trap insulation layer 220. The blocking insulation layer 230 may comprise a second blocking insulation layer 236 between the fixed charge layer 235 and the trap insulation layer 220. The blocking insulation layer 230 may comprise a supplementary layer 238 between the fixed charge layer 235 and the second blocking insulation layer 236. The second blocking insulation layer 236, the fixed charge layer 235, and the supplementary layer 238 may extend over the trap insulation layer.

The blocking insulation layer 230 may comprise the first blocking insulation layer 234 between the fixed charge layer 235 and the gate electrode 240 (refer to FIG. 5A). The first blocking insulation layer 234 may comprise a bottom portion of the first blocking insulation layer 234a and a sidewall portion of the first blocking insulation layer 234b extending from the bottom portion of the first blocking insulation layer 234a. The fixed charge layer 235 may be spaced apart from the gate electrode 240.

The blocking insulation layer 230 may comprise the bottom portion of the blocking insulation layer 232 and the sidewall portion of the blocking insulation layer 231. The sidewall portion of the blocking insulation layer 231 may comprise the sidewall portion of the first blocking insulation layer 234b. The bottom portion of the blocking insulation layer 232 may comprise the second blocking insulation layer 236, the supplementary layer 238, the fixed charge layer 235, and the bottom portion of the first blocking insulation layer 234a.

The supplementary layer 238 may have a higher dielectric index than the tunnel dielectric layer 210. The supplementary layer 238 may comprise a metal oxide layer. The metal oxide layer may comprise hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or ruthenium (Lu).

Another example of the blocking insulation layer according to exemplary embodiments of the present general inventive concept will be described in connection with FIG. 6D, which is an enlarged view of the portion B of FIG. 5A.

Figure 6D:
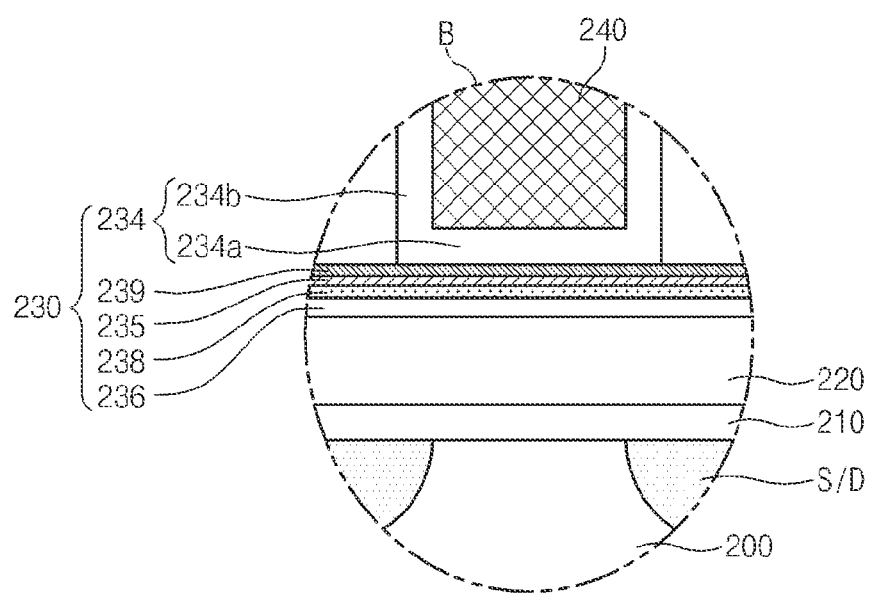

Referring to FIG. 6D, the blocking insulation layer 230 may comprise a fixed charge layer 235 formed and/or disposed on the trap insulation layer 220. The blocking insulation layer 230 may comprise a second blocking insulation layer 236 between the fixed charge layer 235 and the trap insulation layer 220. The blocking insulation layer 230 may comprise a supplementary layer 238 between the fixed charge layer 235 and the second blocking insulation layer 236. The blocking insulation layer 230 may comprise a contribution layer 239 formed and/or disposed on the fixed charge layer 235. The second blocking insulation layer 236, the fixed charge layer 235, the supplementary layer 238, and the contribution layer 239 may extend over the trap insulation layer 220.

The blocking insulation layer 230 may comprise the first blocking insulation layer 234 between the fixed charge layer 235 and the gate electrode 240 (see FIG. 5A). The first blocking insulation layer 234 may comprise a bottom portion of the first blocking insulation layer 234a and a sidewall portion of the first blocking insulation layer 234b extending from the bottom portion of the first blocking insulation layer 234a. The fixed charge layer 235 may be apart from the gate electrode 240.

The blocking insulation layer 230 may comprise the bottom portion of the blocking insulation layer 232 and the sidewall portion of the blocking insulation layer 231. The sidewall portion of the blocking insulation layer 231 may comprise the sidewall portion of the first blocking insulation layer 234b. The bottom portion of the blocking insulation layer 232 may comprise the second blocking insulation layer 236, the supplementary layer 238, the fixed charge layer 235, the contribution layer 239, and the bottom portion of the first blocking insulation layer 234a.

The contribution layer 239 may include a material to generate fixed charges. For example, the contribution layer 239 may include at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). During the forming of the contribution layer 239, the fixed charge layer 235 may be formed. The fixed charge layer 235 may be formed by the reaction between the supplementary layer 238 and the contribution layer 239. For example, the supplementary layer 238 may comprise aluminum oxide, the contribution layer 239 may comprise a silicon nitride layer, and the fixed charge layer 235 may comprise aluminum nitride that is formed by the reaction between aluminum oxide and silicon nitride.

A method of manufacturing a semiconductor device according to exemplary embodiments of the present general inventive concept will be described in connection with FIGS. 7A to 7D, which are cross-sectional views illustrating the method of manufacturing the semiconductor device.

Figure 7A:
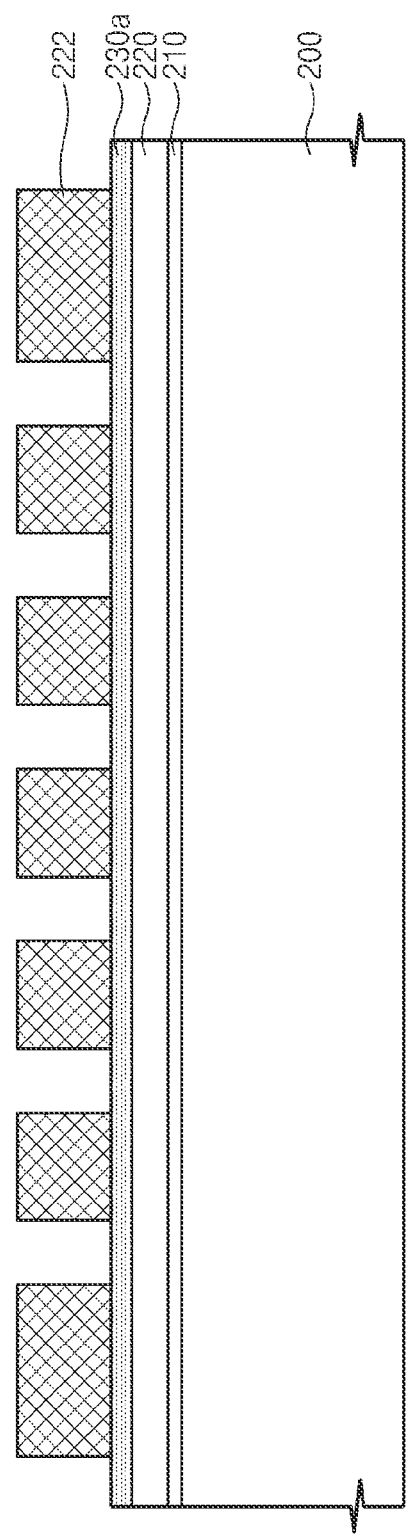

Referring to FIGS. 1A and 7A, a substrate 200 is provided. The substrate 200 may comprise a silicon substrate having a single crystal structure or any other suitable structure which will perform the intended purposes as described herein. A device isolation region ISO may be formed in the substrate 200. An active region ACT may be defined by the device isolation layer ISO.

A tunnel dielectric layer 210 may be formed on the substrate 200 having the active region ACT. The tunnel dielectric layer 210 may have a first surface contacting the active region ACT, and a second surface facing the first surface. The tunnel dielectric layer 210 may comprise at least one of a silicon oxide layer, a silicon nitride layer, a silicon oxynitride layer, and a metal oxide layer. The tunnel dielectric layer 210 may be formed by any one of a CVD process, a PVD process, and an ALD process.

A trap insulation layer 220 may be formed on the second surface of the tunnel dielectric layer 210. The trap insulation layer 220 may comprise at least one of a silicon nitride layer, a metal nitride layer, a metal oxynitride layer, a meal silicon oxynitride layer, and nano dots. The trap insulation layer 220 may be formed by any one of a CVD process, a PVD process, and an ALD process.

A lower blocking insulation layer 230a may be formed on the trap insulation layer 220.

Methods of forming the lower blocking insulation layer 230a according to exemplary embodiments of the present general inventive concept will be described below.

Referring to FIG. 6A, a fixed charge layer 235 may be formed on the trap insulation layer 220 by the method described with reference to FIG. 3A. The lower blocking insulation layer 230a may comprise the fixed charge layer 235.

Another example of the lower blocking insulation layer 230a according to exemplary embodiments of the present general inventive concept will be described. Referring to FIG. 6B, a second blocking insulation layer 236 and a fixed charge layer 235 may be sequentially formed on the trap insulation layer 220 by the method described with reference to FIG. 3B. The lower blocking insulation layer 230a may comprise the fixed charge layer 235 and the second blocking insulation layer 236.

Another example of the lower blocking insulation layer according to exemplary embodiments of the present general inventive concept will be described. Referring to FIG. 6C, a second blocking insulation layer 236, an supplementary layer 238, and a fixed charge layer 235 may be sequentially formed on the trap insulation layer 220 by the method described with reference to FIG. 3C. The lower blocking insulation layer 230a may comprise the fixed charge layer 235, the supplementary layer 238, and the second blocking insulation layer 236.

Another example of the lower blocking insulation layer according to exemplary embodiments of the present general inventive concept will be described. Referring to FIG. 6D, a second blocking insulation layer 236, an supplementary layer 238, a fixed charge layer 235, and a contribution layer 239 may be sequentially formed on the trap insulation layer 220 by the method described with reference to FIG. 3D. The lower blocking insulation layer 230a may comprise the fixed charge layer 235, the supplementary layer 238, the contribution layer 239, and the second blocking insulation layer 236.

Figure 7B:
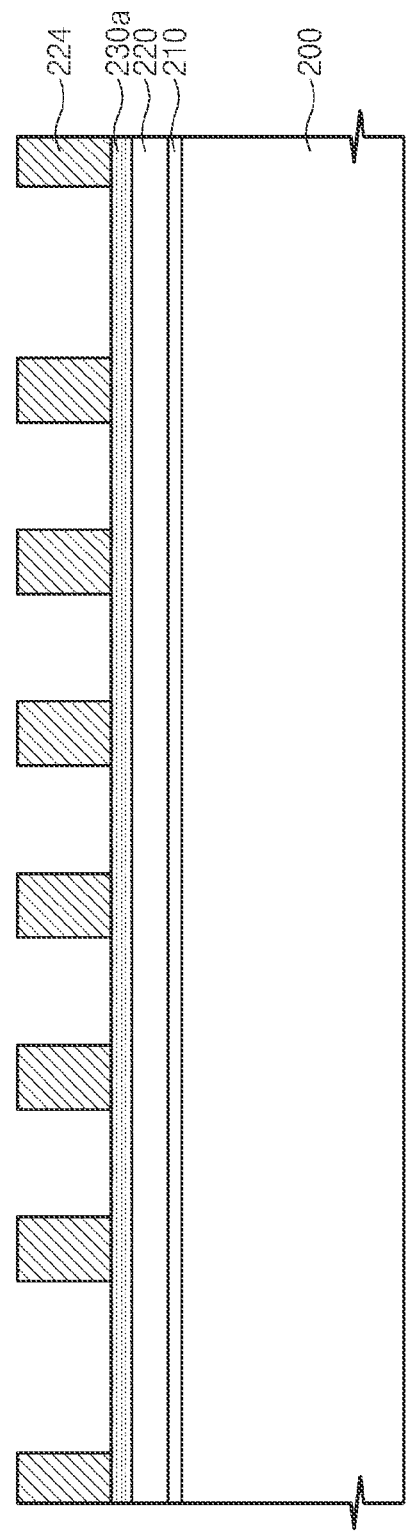

Referring to FIGS. 7A and 7B, mask patterns 224 may be formed between the adjacent supplementary gate electrode pattern 222. The mask patterns 224 may comprise a material having an etch selectivity to the supplementary gate electrode patterns 222. The supplementary gate electrode patterns 222 may be removed by an etch process. At least a portion of the lower blocking insulation layer 230a may be exposed between the adjacent mask patterns 224.

Referring to FIG. 7C, a first blocking insulation layer 234 may be formed on a substrate 200 where the mask patterns 224 are formed. The first blocking insulation layer 234 may be formed on the top surface and sidewall of the mask patterns 224. The first blocking insulation layer 234 may be formed on the lower blocking insulation layer 230 exposed by the mask patterns 224. The top surface of the first blocking insulation layer 234 formed on the lower blocking insulation layer 230 may be lower than those of the mask patterns 224. The first blocking insulation layer 234 may comprise a bottom portion of the first blocking insulation layer 234a and a sidewall portion of the first blocking insulation layer 234b extending from the bottom portion of the first blocking insulation layer 234a (refer to FIGS. 6A to 6D).

The first blocking insulation layer 234 may comprise at least one of a silicon oxide layer, a silicon nitride layer, a silicon oxynitride layer, and a high-k layer. The first blocking insulation layer 136 may be formed by any one of a CVD process, a PVD process, and an ALD process.

The blocking insulation layer 230 may comprise the lower blocking insulation layer 230a and the first blocking insulation layer 234.

A gate conductive layer 242 may be formed on the blocking insulation layer 230. The gate conductive layer 242 may comprise at least one of a doped polysilicon, a metal, a metal silicide, and a metal nitride layer. The gate conductive layer 242 may be formed by any one of a CVD process, a PVD process, and an ALD process.

Referring to FIG. 7D, a planarization process may be performed using the mask patterns 224 as an etch stop layer. The planarization process may use an etch-back process or a chemical mechanical polishing (CMP) process. In this way, gate electrodes 240 may be formed.

Referring again to FIG. 5A, the mask patterns 224 may be removed by an etch process. Impurities may be penetrated into the active region through the space exposed by the removed mask patterns 224. In this way, source/drain region S/D may be formed in the active regions on either side of the gate electrodes 240.

A method of manufacturing a nonvolatile memory device according to exemplary embodiments of the present general inventive concept will be described in connection with FIGS. 8A and 8B, which are cross-sectional views illustrating the method of manufacturing a nonvolatile memory device.

Figure 8A:
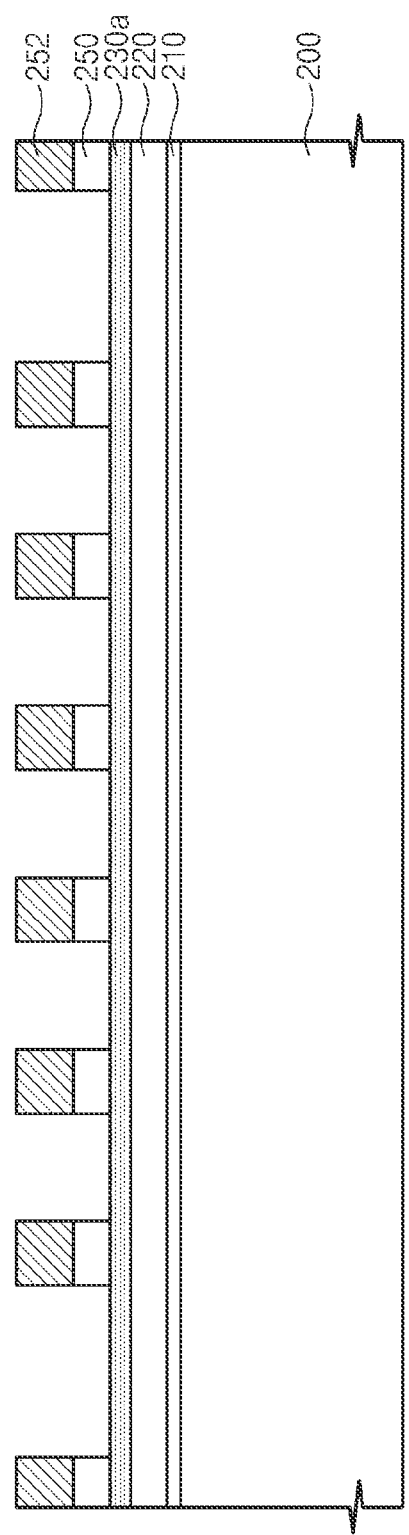
FIGS. 8A and 8B are cross-sectional views illustrating a method of manufacturing a nonvolatile memory device according exemplary embodiments of the present general inventive concept.

Referring to FIG. 8A, a tunnel dielectric layer 210 and a trap insulation layer 220 may be sequentially formed on a substrate 200. A lower blocking insulation layer 230a may be formed on the trap insulation layer 220. Lower mask layers 250 may be formed on the lower blocking insulation layer 230a, and upper mask layers 252 may be formed on the lower mask layers 250. At least a portion of the lower blocking insulation layer 230a may be exposed between the adjacent lower and upper mask layers 250 and 252.

Figure 8B:
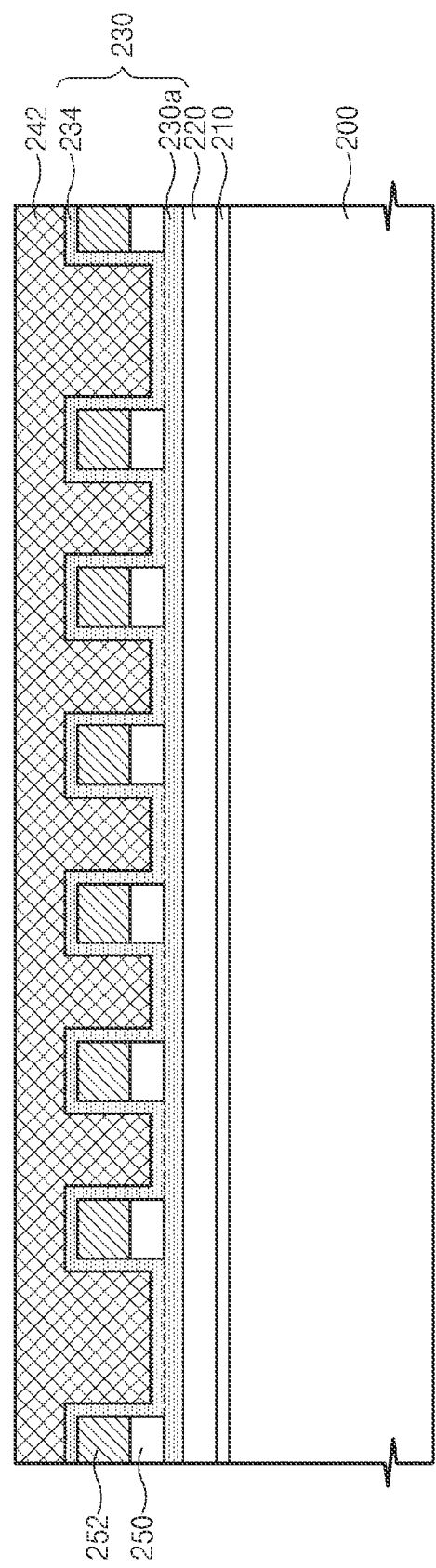

Referring to FIG. 8B, a first blocking insulation layer 234 may be formed on the substrate where the upper and lower mask layers 250 and 252 are formed. The blocking insulation layer 230 may comprise the lower blocking insulation layer 230a and the first blocking insulation layer 234. A gate conductive layer 242 may be formed on the blocking insulation layer 230.

Referring again to FIG. 5B, gate electrodes 240 may be formed by a planarization process using the upper mask patterns 252 as an etch stop layer. The gate electrodes 240 may comprise a pair of selection gate electrodes 241. Control gate electrodes 242 may be provided between the pair of the selection gate electrodes 241. The upper and lower mask layers 250 and 252 on either side of the pair of the selection gate electrodes 241 may be removed. Source/drain region S/D may be formed in the active regions on either side of the pair of the selection gate electrodes 241.

A nonvolatile memory device according to exemplary embodiments of the present general inventive concept will be described in connection with FIG. 9A, which is a cross-sectional view illustrating the nonvolatile memory device.

Referring to 1A and FIG. 9A, a substrate 200 is provided. The substrate 200 may comprise semiconductor having a single crystal structure or any other suitable structure which will perform the intended purposes as described herein. The substrate 200 may comprise a device isolation region ISO. An active region ACT may be defined by the device isolation layer ISO. A tunnel dielectric layer 210 having a first surface contacting the active region ACT and a second surface facing the first surface may be provided. Gate electrodes 240 may be provided on the tunnel dielectric layer 210. The gate electrodes 240 may be provided in series on the substrate 200. The gate electrodes 240 may comprise a pair of selection gate electrodes 241. The gate electrodes 240 may comprise control gate electrodes 242 provided between the pair of the selection gate electrodes 241. A blocking insulation layer 230 may be provided between the gate electrodes 240 and the second surface of the tunnel dielectric layer 210.

The blocking insulation layer 230 may comprise fixed charge layer (not illustrated) spaced apart from the gate electrodes 240. The blocking insulation layer 230 may comprise a bottom portion of the blocking insulation layer 232 and a sidewall portion of the blocking insulation layer 231 extending from the bottom portion of the blocking insulation layer 232. The sidewall portion of the blocking insulation layer 231 may cover the sidewalls of the gate electrodes 240. A trap insulation layer 220 may be provided between the blocking insulation layer 230 and the second surface of the tunnel dielectric layer 210. Source/drain region S/D may be provided in the active region ACT on either side of the gate electrodes 240. The source/drain region S/D may be regions doped with dopants (e.g., with n-type dopants or p-type dopants, etc.).

A memory cell may comprise the tunnel dielectric layer 210, the trap insulation layer 220, the blocking insulation layers 230, and the control gate electrode 242. The memory cell may form a serially-connected NAND structure. A select transistor may comprise the tunnel dielectric layer 210, the trap insulation layer 220, the blocking insulation layer 230, and the selection gate electrode 241.

The tunnel dielectric layer 210 may be a single layer or a multi layer. For example, the tunnel dielectric layer 210 may comprise at least one of a silicon oxynitride layer, a silicon nitride layer, a silicon oxide layer, and a metal oxide layer.

The trap insulation layer 220 may comprise charge trap sites to store electric charges. For example, the trap insulation layer 220 may comprise at least one of a silicon nitride layer, a metal nitride layer, a metal oxynitride layer, a metal silicon oxide layer, a metal silicon oxynitride layer, and nanodots. The trap insulation layer 220 can trap electric charges of the same type as carriers generated in the channel upon operation of the nonvolatile memory device. For example, when the nonvolatile memory device is an NMOS type memory device, electrons may be trapped in the trap insulation layer 220.

The gate electrodes 240 may be a single layer or a multi layer. The gate electrodes 240 may comprise at least one of a doped polysilicon layer, a metal silicide layer, and a metal nitride layer. The metal silicide layer may comprise a tungsten silicide layer, a titanium silicide layer, a cobalt silicide layer, or a tantalum silicide layer. The metal nitride layer may comprise a titanium nitride layer or a tantalum nitride layer.

Source/drain region S/D may be provided in the active regions ACT on either side of the gate electrodes 240. The source/drain regions S/D may be regions doped with dopants (e.g., with n-type dopants or p-type dopants, etc.).

Figure 9B:
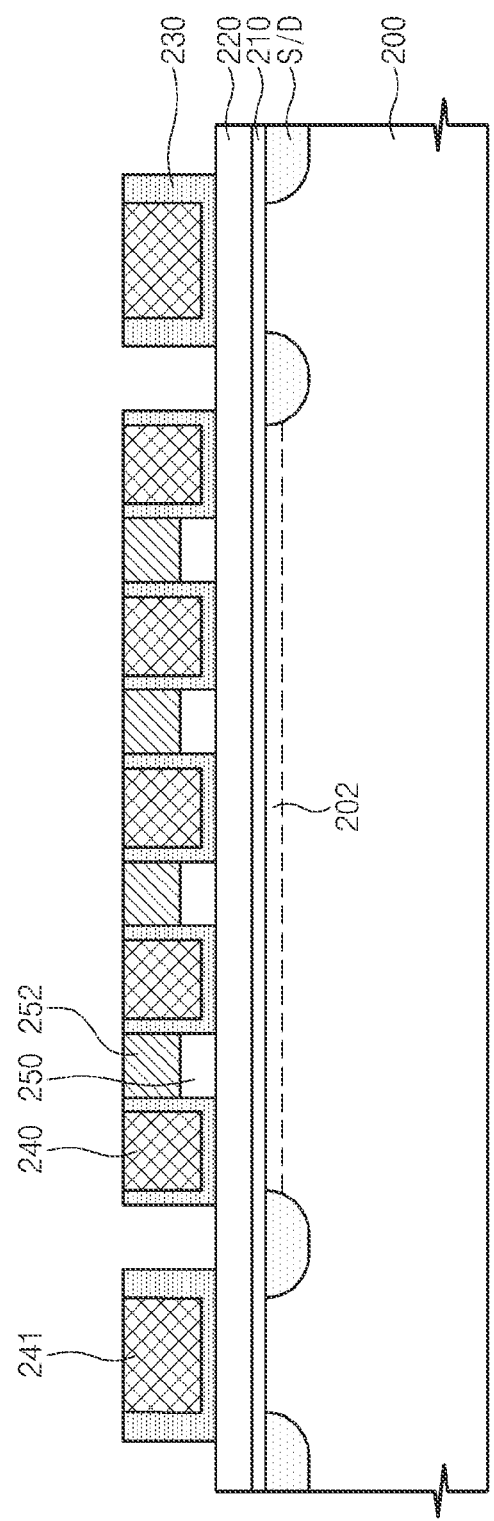
FIG. 9B is a cross-sectional view of a nonvolatile memory device according to exemplary embodiments of the present general inventive concept.

A nonvolatile memory device according to exemplary embodiments of the present general inventive concept will be described in connection with FIG. 9B, which is a cross-sectional view of the nonvolatile memory device. In FIGS. 9A and 9B, like reference numerals are used to refer to like elements.

Referring to FIG. 9B, lower mask layers 250 and upper mask layers 252 may be provided between the control gate electrodes 242 and the trap insulation layer 220. The lower mask layers 250 and the upper mask layers 252 may be provided on the trap insulation layer 220. The upper mask layers 252 may be provided on the lower mask layers 250.

Source/drain region S/D may be provided in active regions on either side of the selection gate electrodes 241. The source/drain region S/D may be regions doped with dopants (e.g., with n-type dopants or p-type dopants, etc.).

Channel regions 202 may be continuously formed on the active regions between the adjacent control gate electrodes 242. The memory cells may be connected through the channel regions 202. The channel regions 202 may serve as a conduction path of charges upon operation of the memory cells. The channel regions 202 under the lower mask layers 250 may comprise inversion layers formed by an operating voltage applied to the control gate electrodes 242 upon operation of the memory cells.

An example of the blocking insulation layer according to exemplary embodiments of the present general inventive concept will be described in connection with FIG. 10A to 10D, which are enlarged views of a portion C of FIG. 9A.

Figure 10A:
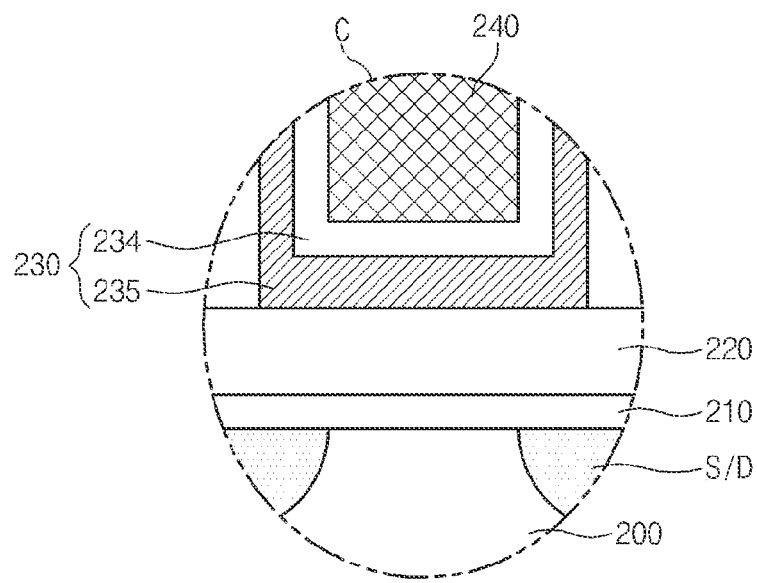
FIGS. 10A to 10D are enlarged views of a portion C of FIG. 9A, illustrating blocking insulation layers according to exemplary embodiments of the present general inventive concept.

Referring to FIG. 10A, the blocking insulation layer 230 may comprise a fixed charge layer 235 on the trap insulation layer 220, and a first blocking insulation layer 234 on the fixed charge layer 235. The fixed charge layer 235 may be spaced apart from the gate electrode 240.

The blocking sidewall part 231 and the bottom portion of the blocking insulation layer 232 may comprise the fixed charge layer 235 and the first blocking insulation layer (refer to FIG. 9A).

Another example of the blocking insulation layer according to exemplary embodiments of the present general inventive concept will be described below.

Figure 10B:
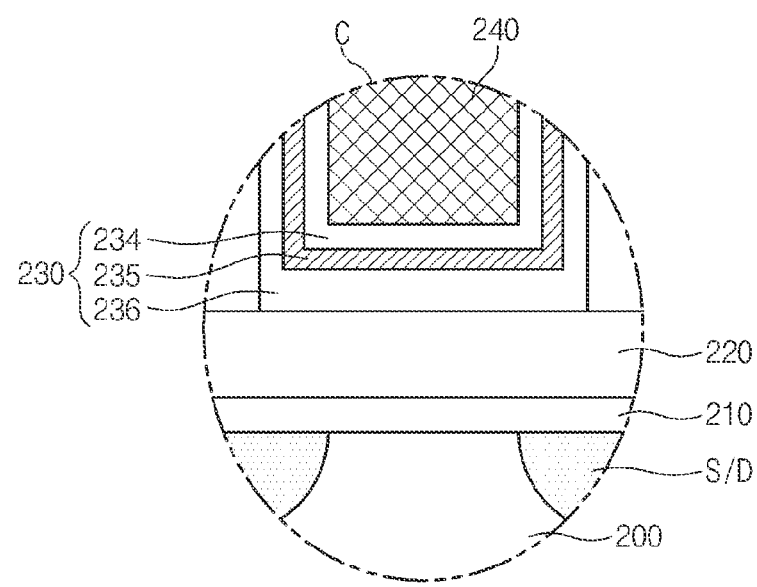

Referring to FIG. 10B, the blocking insulation layer 230 may comprise a fixed charge layer 235 formed and/or disposed on the trap insulation layer 220, and a first blocking insulation layer 234 on the fixed charge layer 235. The fixed charge layer 235 may be spaced apart from the gate electrode 240. The blocking insulation layer 230 may comprise a second blocking insulation layer 236 between the trap insulation layer 220 and the fixed charge layer 235.

The blocking sidewall part 231 and the bottom portion of the blocking insulation layer 232 may comprise the first blocking insulation layer 234, the fixed charge layer 235, and the second blocking insulation layer 236 (refer to FIG. 9A).

Another example of the blocking insulation layer according to exemplary embodiments of the present general inventive concept will be described below.

Figure 10C:
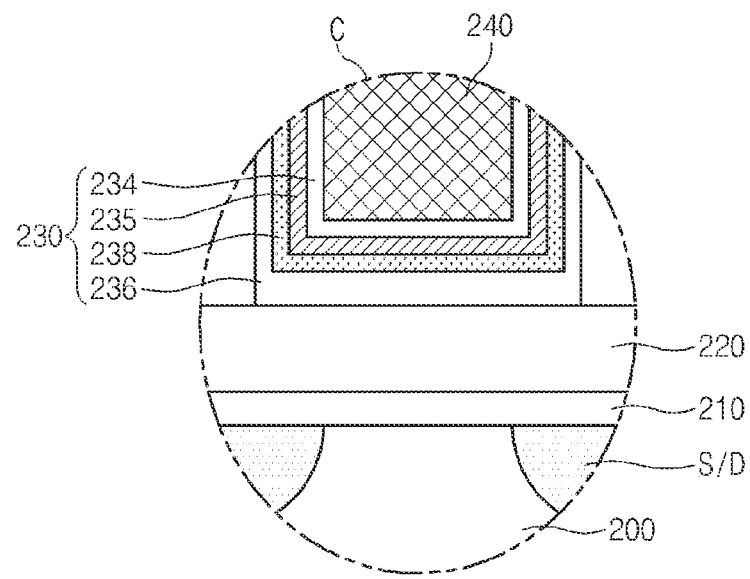

Referring to FIG. 10C, the blocking insulation layer 230 may comprise a fixed charge layer 235 on the trap insulation layer 220, and a first blocking insulation layer 234 on the fixed charge layer 235. The fixed charge layer 235 may be spaced apart from the gate electrode 240. The blocking insulation layer 230 may comprise a second blocking insulation layer 236 between the trap insulation layer 220 and the fixed charge layer 235. The blocking insulation layer 230 may comprise a supplementary layer 238 between the fixed charge layer 235 and the second blocking insulation layer 236.

The sidewall portion of the blocking insulation layer 231 and the bottom portion of the blocking insulation layer 232 may comprise the first blocking insulation layer 234, the fixed charge layer 235, the supplementary layer 238, and the second blocking insulation layer 236 (refer to FIG. 9A).

Another example of the blocking insulation layer according to exemplary embodiments of the present general inventive concept will be described below.

Figure 10D:
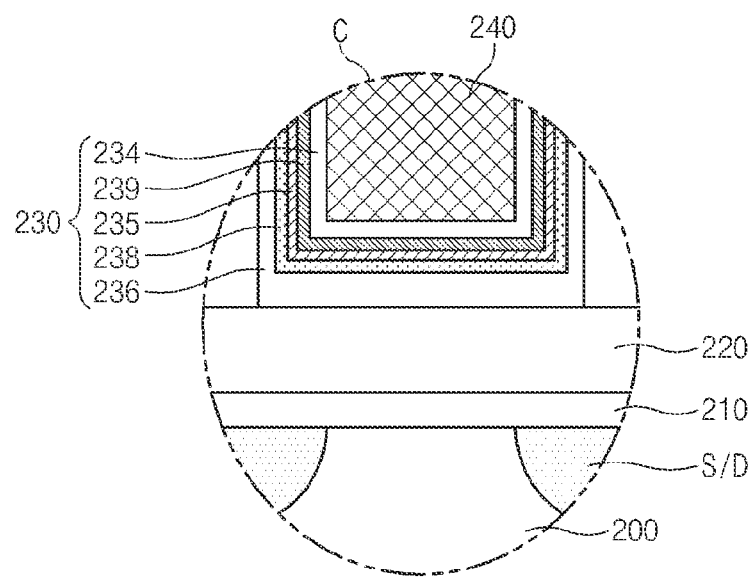

Referring to FIG. 10D, the blocking insulation layer 230 may comprise a fixed charge layer 235 on the trap insulation layer 220, and a first blocking insulation layer 234 on the fixed charge layer 235. The fixed charge layer 235 may be spaced apart from the gate electrode 240. The blocking insulation layer 230 may comprise a second blocking insulation layer 236 between the trap insulation layer 220 and the fixed charge layer 235. The blocking insulation layer 230 may comprise a supplementary layer 238 between the fixed charge layer 235 and the second blocking insulation layer 236. The blocking insulation layer 236 may comprise a contribution layer 239 between the fixed charge layer 235 and the first blocking insulation layer 234.

The sidewall portion of the blocking insulation layer 231 and the bottom portion of the blocking insulation layer 232 may comprise the first blocking insulation layer 234, the fixed charge layer 235, the supplementary layer 238, the contribution layer 239, and the second blocking insulation layer 236 (see FIG. 9A).

A method of manufacturing a nonvolatile semiconductor device according to exemplary embodiments of the present general inventive concept will be described in connection with FIGS. 11A to 11D, which are cross-sectional views illustrating the method of manufacturing the nonvolatile semiconductor device.

Figure 11A:
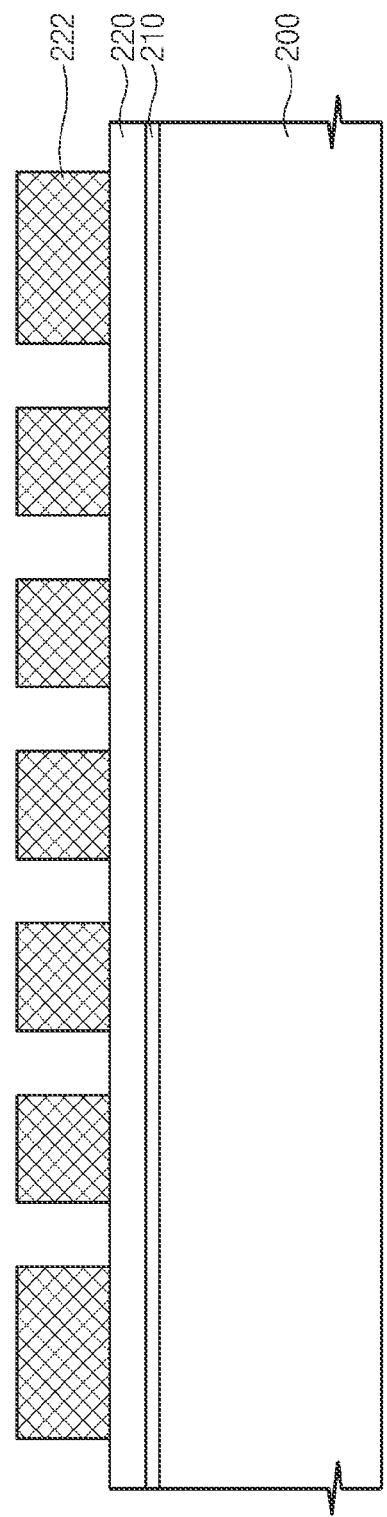

Referring to FIG. 11A, a substrate 200 is provided. A tunnel dielectric layer 210 may be formed on the substrate 200. A charge trap layer 220 may be formed on the tunnel dielectric layer 210. Supplementary gate electrode patterns 222 may be formed on the charge trap layer 220.

Referring to FIG. 11B, mask patterns 224 may be formed between the adjacent supplementary gate electrode patterns 222. The supplementary gate electrode patterns 222 may be removed. The trap insulation layer 220 may be exposed between the adjacent mask patterns 224.

Figure 11C:
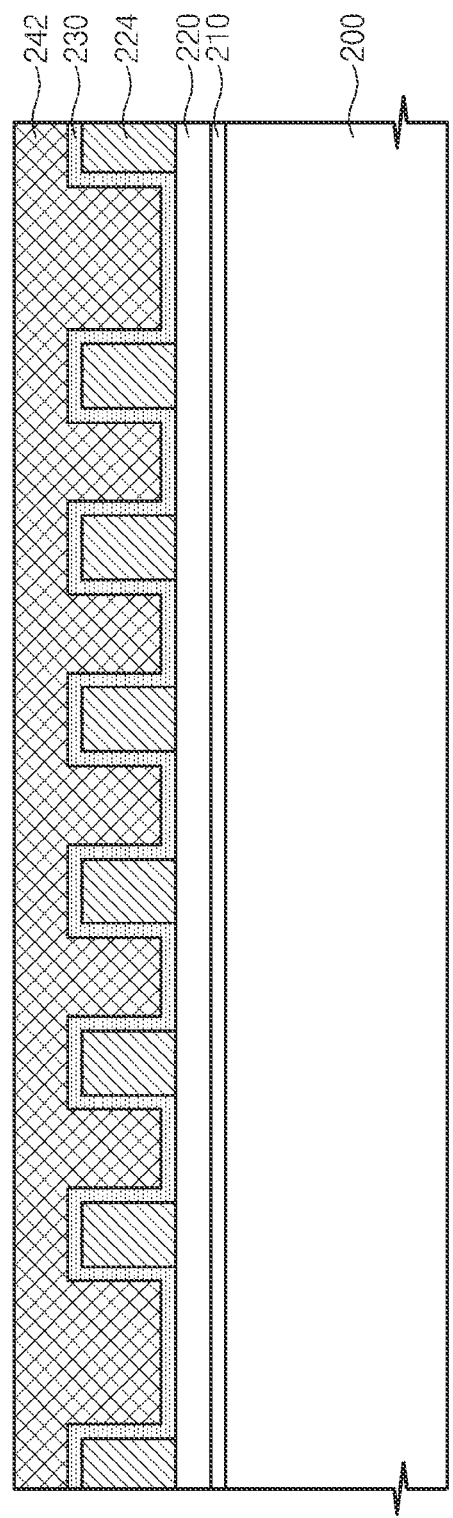

Referring to FIG. 11C, a blocking insulation layer 230 may be formed on the substrate 200 where the mask patterns 224 are formed. The blocking insulation layer 230 may be formed on the top surfaces and sidewalls of the mask patterns 224. The blocking insulation layer 230 may be formed on the trap insulation layer 220 exposed by the mask patterns 224. The top surface of the blocking insulation layer 230 formed on the trap insulation layer 220 may be lower than those of the mask patterns 224. The blocking insulation layer 230 may comprise a bottom portion of the blocking insulation layer and a sidewall portion of the blocking insulation layer extending from the bottom portion of the blocking insulation layer (refer to FIGS. 10A to 10D). The blocking insulation layer 230 may be formed by the method described with reference to FIGS. 3A to 3D. A gate conductive layer 242 may be formed on the blocking insulation layer 230. The gate conductive layer 242 may bury the bottom of the blocking insulation layer 230.

Figure 11D:
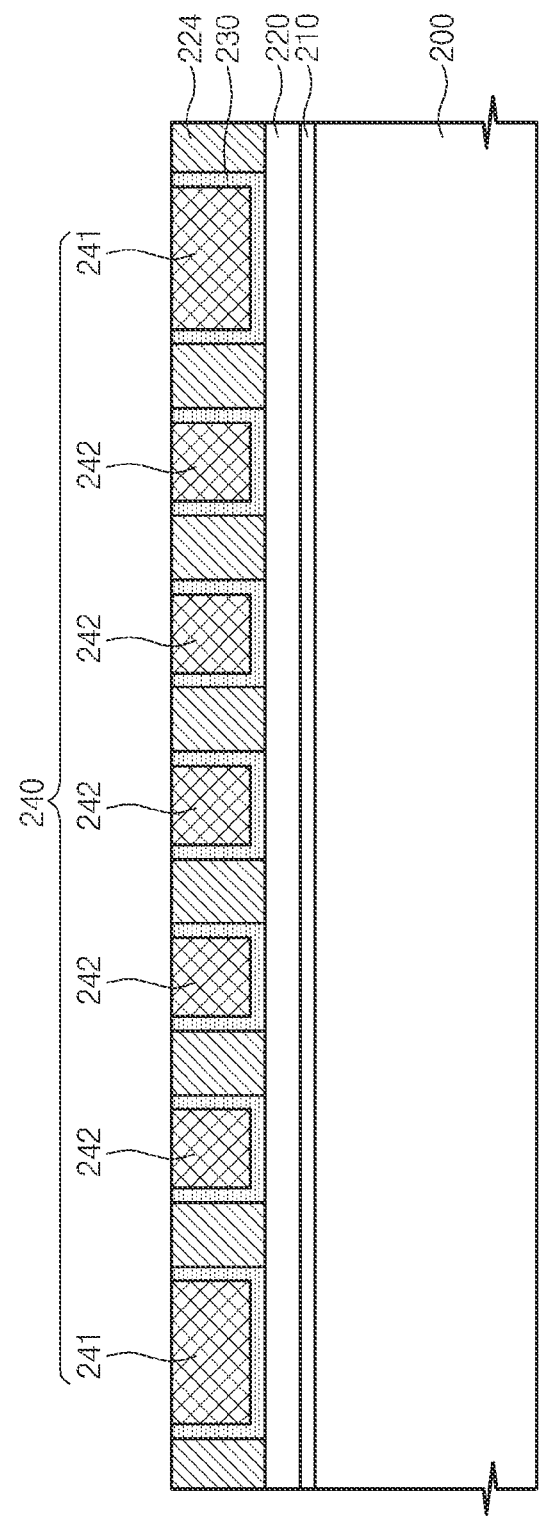

Referring to FIGS. 11D and 9A, a planarization process may be performed using the mask patterns 224 as an etch stop layer. In this way, gate electrodes 240 may be formed. The mask patterns 224 may be removed by an etch process. Source/drain region S/D may be formed in the active regions on either side of the gate electrodes 240.

A method of manufacturing the nonvolatile memory device according to exemplary embodiments of the present general inventive concept will be described in connection with FIGS. 12A to 12D, which are cross-sectional views illustrating the method of manufacturing the nonvolatile memory device.

Figure 12A:
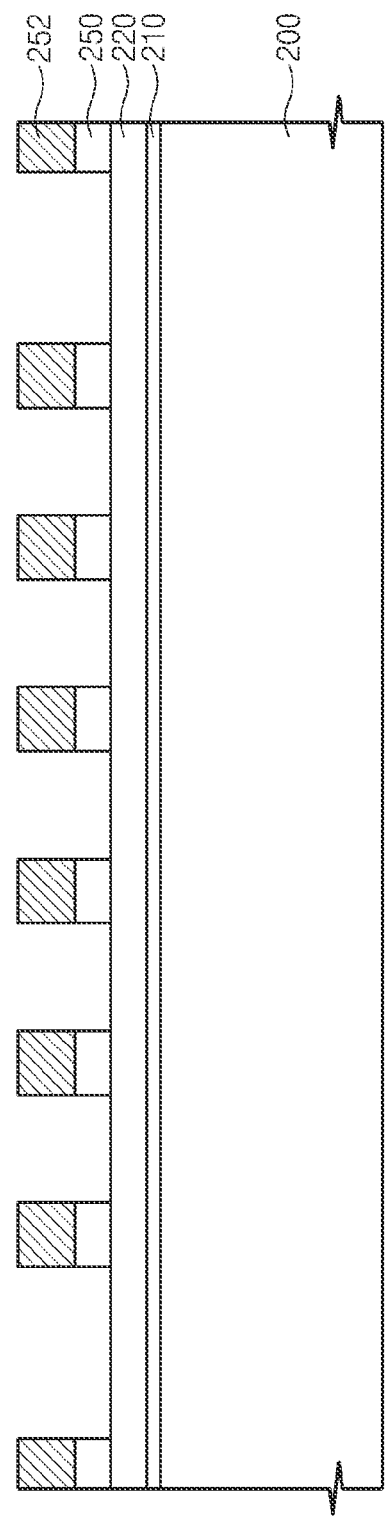

Referring to FIG. 12A, a tunnel dielectric layer 210 and a trap insulation layer 220 may be sequentially formed on a substrate 200. Lower mask layers 250 may be formed on the trap insulation layer 220. Upper mask layers 252 may be formed on the lower mask layers 250. A portion of the trap insulation layer 220 may be exposed between the adjacent lower and upper mask layers 250 and 252.

Referring to FIG. 12B, a blocking insulation layer 230 may be formed on the substrate 200 where the lower and upper mask layers 250 and 252. A gate conductive layer 242 may be formed on the blocking insulation layer 230.

Referring to FIG. 9B, a planarization process may be performed using the upper mask layers 252 as an etch stop layer. In this way, gate electrodes 240 may be formed. The gate electrodes 240 may comprise a pair of selection gate electrodes 241. Gate electrodes 240 may be provided between the pair of the selection gate electrodes 241. The lower and upper mask layers 250 and 252 on either side of the pair of the selection gate electrodes 241 may be removed. Source/drain region S/D may be formed in the active regions on either side of the pair of the selection gate electrodes 241.

Figure 14:
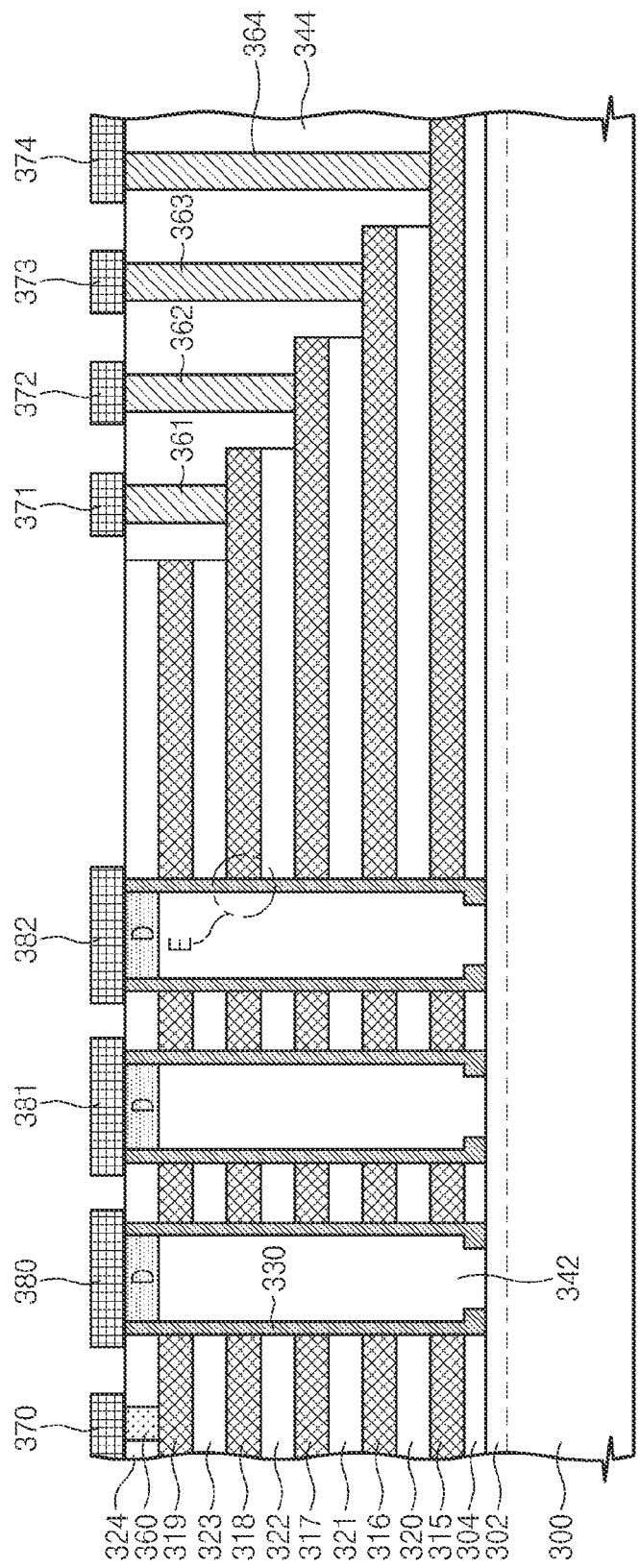
FIG. 14 is a cross-sectional view taken along line II-II' of FIG. 13, illustrating the nonvolatile memory device according to the exemplary embodiments of the present general inventive concept.

A nonvolatile memory device according to exemplary embodiments of the present general inventive concept will be described in connection with FIG. 13, which is a plan view illustrating the nonvolatile memory device, and FIG. 14, which is a cross-sectional view illustrating the nonvolatile memory device. FIG. 14 illustrates a cross-sectional view taken along line II-II' of FIG. 13.

Referring to FIGS. 13 and 14, a substrate 300 is provided. An active pillar 342 may be provided on the substrate 300. The active pillar 342 may comprise an active region. The substrate 300 may be a semiconductor-based substrate. The substrate 300 may comprise a well. The well may comprise a dopant of a first conductivity type. The active pillar 342 may vertically extend (e.g., in a direction from the substrate 300 towards bit lines 380, 381, and 382) on the substrate 300. One end of the active pillar 342 may be connected to the well. The other end of the active pillar 342 may be electrically connected to a bit line (e.g., bit line 380, 381, or 382). The active pillar 342 may a pillar type whose inner part is filled, and may comprise a single crystalline semiconductor.

A common source region 302 electrically connected to the active pillar 342 may be provided within the substrate 300. The common source region 302 may be provided in a plate form within a cell region of the substrate 300 between the substrate 300 and the active pillar 342.

The common source region 302 may comprise a dopant of a high concentration. The dopant in the common source region 302 may be a second conductivity type different from the dopant comprised in the well. For example, when the well comprises a p-type dopant, the common source region 302 may comprise an n-type dopant.

A ground select gate pattern 315, a plurality of cell gate patterns 316 to 318, and a plurality of string select gate patterns 319 may be formed, disposed, and/or stacked on the substrate 300. The gate patterns 315 to 319 may be formed, disposed, and/or stacked on the substrate 300 along the sidewall of the active pillar 342. The gate patterns 315 to 319 formed, disposed, and/or stacked along the sidewall of the active pillar 342 may be a vertical cell string (e.g., where the vertical direction is a direction perpendicular to direction II illustrated in FIG. 13). The active pillar 342 may penetrate the gate patterns 315 to 319 and be connected to the substrate 300.

The cell gate patterns 316 to 318 may have a plate form parallel to the substrate 300. Although three cell gate patterns are illustrated for convenience, the number of the cell gate patterns is not limited thereto. The cell gate patterns 316 to 318 may be word lines. The word lines may be connected to global word lines 371 to 373 through word line contact plugs 361 to 363 penetrating an interlayer dielectric layer 344. The word line contact plugs 361 to 363 may be formed at edges of a cell array.

Cell inter-gate insulation layers 321 to 322 may be provided between the cell gate patterns 316 to 318. The cell gate patterns 316 to 318 may be spaced apart from one another by the cell inter-gate insulation layers 321 to 322. The cell inter-gate insulation layers 321 to 322 may comprise oxide.

The ground select gate pattern 315 may be provided between the substrate 300 and the lowermost cell gate pattern 316. The ground select gate pattern 315 may be provided on the substrate 300 in a plate form. A ground select insulation layer 304 may be provided between the ground select gate pattern 315 and the substrate 300. The ground select gate pattern 315 may control the electrical connection between the active pillar 342 and the well of the substrate 300. The ground select gate pattern 315 may be connected to a ground select line 374 through a ground select gate plug 364 penetrating the interlayer dielectric layer 344.

The string select gate pattern 319 may be provided on the substrate 300 over the cell gate patterns 316 to 318. The string select gate pattern 319 may be formed, disposed, and/or stacked on the uppermost cell gate pattern 318 among the cell gate patterns 316 to 318. The string select gate pattern 319 may have a line form. The string select gate pattern 319 may extend in a first direction parallel to the substrate 300.

Inter-gate insulation layers 320 and 323 may be provided between the select gate patterns 315 and 319 and the cell gate patterns 316 to 318. The inter-gate insulation layer 323 may be provided between string select gate pattern 319 and the above the uppermost cell gate pattern 318. The inter-gate insulation layer 320 may be provided between ground select gate pattern 315 and the lowermost cell gate pattern 316. The cell gate patterns 316 to 318 are spaced apart from the select gate patterns 315 and 319.

Bit lines 380 to 382 may be provided on the string select gate pattern 319. The bit lines 380 to 382 may be provided across the string select gate pattern 319. That is, the bit lines 380 to 382 may extend in a second direction intersecting with the first direction. The first direction and the second direction may be perpendicular to each other. A string select insulation layer 324 may be provided between the string select gate pattern 319 and the bit lines 380 to 382. The string select gate pattern 319 may be electrically connected to the string select line 370 by the string select plug 360 penetrating the string select insulation layer 324.

The bit lines 380 to 382 may be connected to the active pillar 342 through the drain region D, an upper portion of the active pillar 342. The drain region D may be a high-concentration dopant region in the active pillar 342. The bit lines 380 to 382 may be connected to the drain region D by a predetermined plug. The electrical connection between the bit lines 380 to 382 and the active pillar 342 may be controlled by the string select gate pattern 319.

A charge storage pattern 330 may be provided between the cell gate patterns 316 to 318 and the active pillar 342. The charge storage pattern 330 may be formed cylindrically so that it penetrates the cell gate patterns 316 to 318 and the select gate patterns 315 and 319. The charge storage pattern 330 may be formed to surround the active pillar 342. The charge storage pattern 330 may comprise a tunnel dielectric layer, a trap insulation layer, and a blocking insulation layer.

An example of the blocking insulation layer according to exemplary embodiments of the present general inventive concept will be described in connection with FIG. 15A, which is an enlarged view of a portion E of FIG. 14.

Figure 15A:
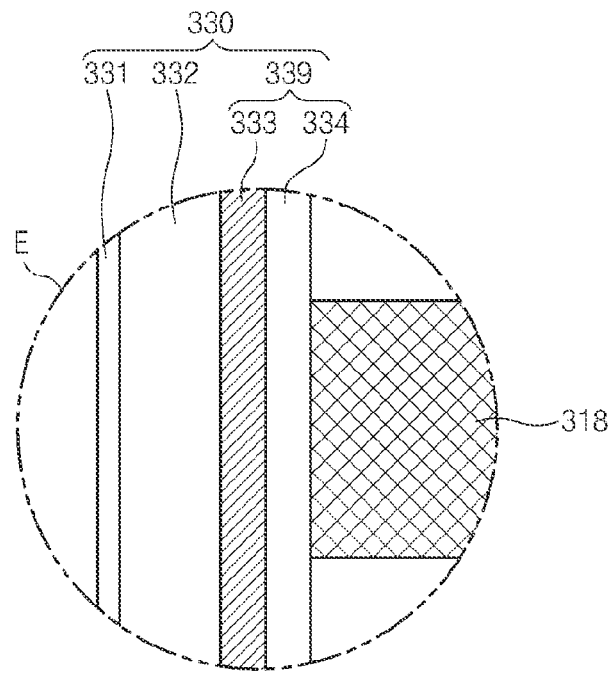
FIGS. 15A to 15D are enlarge views of a portion E of FIG. 14, illustrating blocking insulation layers according to exemplary embodiments of the present general inventive concept.

Referring to FIG. 15A, a tunnel dielectric layer 331 having a first surface contacting the active pillar 342 and a second surface opposite to the first surface may be provided. A blocking insulation layer 339 may be provided between the second surface of the tunnel dielectric layer 331 and the cell gate pattern 318. A trap insulation layer 332 may be provided between the blocking insulation layer 339 and the second surface of the tunnel dielectric layer 331.

The blocking insulation layer 339 may comprise a fixed charge layer 333 between the trap insulation layer 332 and the cell gate pattern 318. The fixed charge layer 333 may contact the trap insulation layer 332. The blocking insulation layer 339 may comprise a first blocking insulation layer 334 between the fixed charge layer 333 and the cell gate pattern 318. The fixed charge layer 333 may be spaced apart from the cell gate pattern 318.

The tunnel dielectric layer 331 may be a single layer or a multi layer. For example, the tunnel dielectric layer 331 may comprise at least one of a silicon oxynitride layer a silicon nitride layer, a silicon oxide layer, and a metal oxide layer.

The trap insulation layer 332 may comprise charge trap sites to store electric charges. For example, the trap insulation layer 332 may comprise at least one of a silicon nitride layer, a metal nitride layer, a metal oxynitride layer, a metal silicon oxide layer, a metal silicon oxynitride layer, and nanodots. The trap insulation layer 332 can trap electric charges of the same type as carriers generated in the channel upon operation of the nonvolatile memory device. For example, when the nonvolatile memory device is an NMOS type memory device, electrons may be trapped in the trap insulation layer 332.

The fixed charge layer 333 may include a material to generate fixed charges. For example, the fixed charge layer 333 may include a dielectric material including at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). For example, the fixed charge layer 333 may comprise aluminum nitride. The fixed charges may have the same conductivity type as carriers generated within the channel upon operation of the nonvolatile memory device. For example, when the nonvolatile memory device according to exemplary embodiments of the present general inventive concept is an NMOS type memory device, the fixed charges may be electrons.

The fixed charges within the fixed charge layer 333 may be distributed in a form of fixed charge-dots spaced apart from one another. At this time, the fixed charge-dots may be distributed substantially uniformly within the fixed charge layer 333.

The first blocking insulation layer 334 may include a material different from the fixed charge layer 333. The electron affinity of the first blocking insulation layer 334 may be greater than that of the fixed charge layer 333.

The first blocking insulation layer 334 may be a single layer or a multi layer. The first blocking insulation layer 334 may comprise at least one of a silicon oxide layer, a silicon nitride layer, a silicon oxynitride layer, and a high-k layer. The high-k layer may comprise at least one of a metal oxide layer, a metal nitride layer, and a metal oxynitride layer. The high-k layer may comprise hafnium (Hf), zirconium (Zr), aluminum (Al), tantalum (Ta), lanthanum (La), cerium (Ce), or praseodymium (Pr). The dielectric constant of the first blocking insulation layer 334 may be greater than that of the tunnel insulation layer 331. For example, the first blocking insulation layer 334 may be formed of aluminum oxide.

The first blocking insulation layer 334 may include the fixed charges. The first blocking insulation layer 334 may have the fixed charges of the same conductivity type as the fixed charge layer 333. For example, the fixed charges of the first blocking insulation layer 334 and those of the fixed charge layer 333 may be electrons. The charge density of the first blocking insulation layer 334 may be smaller than that of the fixed charge layer 333.

Alternatively, the first blocking insulation layer 334 may be electrically neutral. In this case, the charge density of the first blocking insulation layer 334 is substantially zero. Accordingly, the charge density of the first blocking insulation layer 334 is smaller than that of the fixed charge layer 333.

Figure 15B:
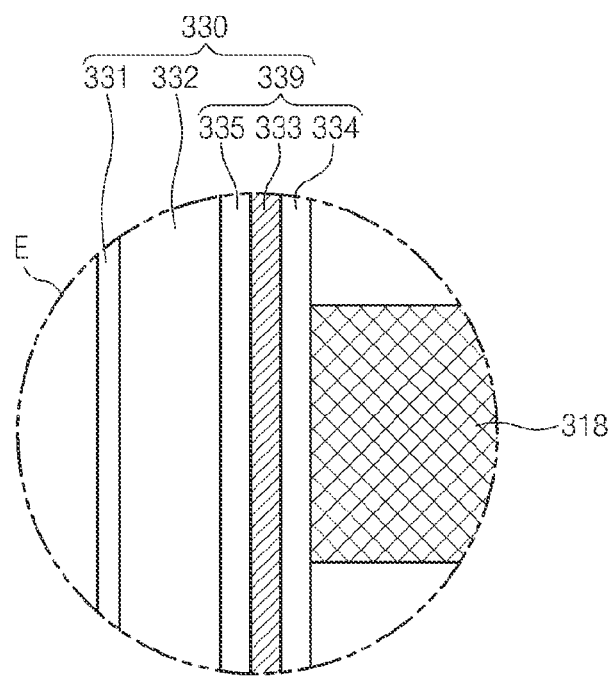

Another example of the blocking insulation layer according to exemplary embodiments of the present general inventive concept will be described in connection with FIG. 15B is an enlarged view of the portion E of FIG. 14.

Referring to FIG. 15B, the tunnel dielectric layer 331, the trap insulation layer 332, the fixed charge layer 333, and the first blocking insulation layer 334 described above with reference to FIG. 15A may be provided. A second blocking insulation layer 335 may be provided between the trap insulation layer 332 and the fixed charge layer 333. A blocking insulation layer 339 may comprise the second blocking insulation layer 335, the fixed charge layer 333, and the first blocking insulation layer 334.

The second blocking insulation layer 335 may include a material different from the fixed charge layer 333. For example, the second blocking insulation layer 335 may include the same material as the first blocking insulation layer 334. The electron affinity of the second blocking insulation layer 335 may be smaller than that of the fixed charge layer 333. The charge density of the fixed charge layer 333 may be greater than that of the second blocking insulation layer 335.

Another example of the blocking insulation layer according to exemplary embodiments of the present general inventive concept will be described in connection with FIG. 15C, which is an enlarged view of the portion E of FIG. 14.

Figure 15C:
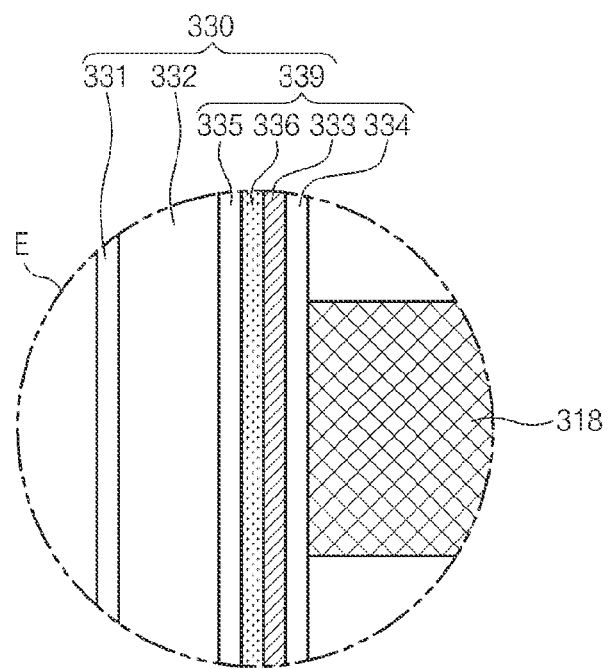

Referring to FIG. 15C, the tunnel dielectric layer 331, the trap insulation layer 332, the second blocking insulation layer 335, the fixed charge layer 333, and the first blocking insulation layer 334, which are described above with reference to FIGS. 15A and 15B, may be provided. A supplementary layer 336 may be provided between the fixed charge layer 333 and the second blocking insulation layer 335. A blocking insulation layer 339 may comprise the second blocking insulation layer 336, the supplementary layer 336, the fixed charge layer 333, and the first blocking insulation layer 334.

The supplementary layer 336 may have a higher dielectric constant than the tunnel dielectric layer 331. The supplementary layer 336 may comprise a metal oxide layer. For example, the metal oxide layer comprise hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or ruthenium (Lu).

Another example of the blocking insulation layer according to exemplary embodiments of the present general inventive concept will be described in connection with FIG. 15D, which is an enlarged view of the portion E of FIG. 14.

Figure 15D:
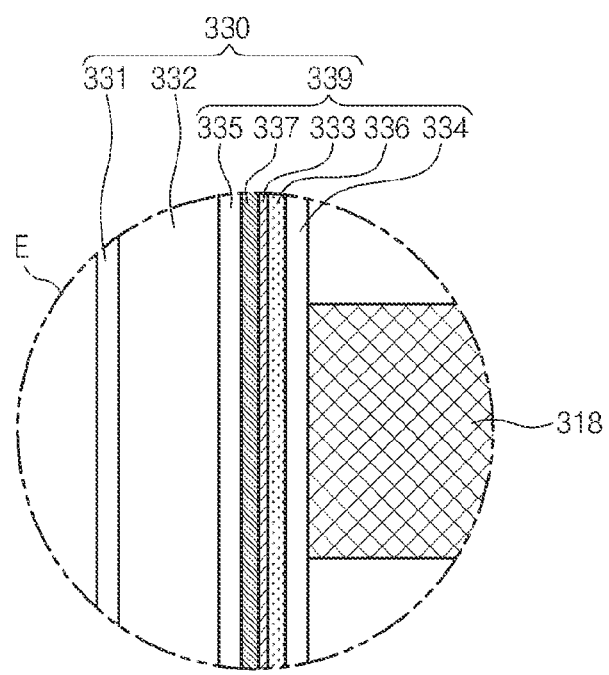

Referring to FIG. 15D, the tunnel dielectric layer 331, the trap insulation layer 332, the second blocking insulation layer 335, the fixed charge layer 333, and the first blocking insulation layer 334, which are described above with reference to FIGS. 15A and 15B, may be provided. A supplementary layer 336 may be provided between the fixed charge layer 333 and the first blocking insulation layer 334. A contribution layer 337 may be provided between the fixed charge layer 333 and the second blocking insulation layer 335. The blocking insulation layer 339 may comprise the second blocking insulation layer 335, the contribution layer 337, the fixed charge layer 333, the supplementary layer 336, and the first blocking insulation layer 334.

The contribution layer 337 may include a material to generate fixed charges. For example, the contribution layer 337 may include at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). During the process of forming the contribution layer 337, the fixed charge layer 333 may be formed. The fixed charge layer 333 may be formed by the reaction between the supplementary layer 336 and the contribution layer 337. For example, the supplementary layer 336 may comprise aluminum oxide, the contribution layer 337 may comprise a silicon nitride layer, and the fixed charge layer 333 may comprise aluminum nitride formed by the reaction between aluminum oxide and silicon nitride.

A method of manufacturing a nonvolatile memory device according to exemplary embodiments of the present general inventive concept will be described in connection with FIGS. 16A to 16D, which are cross-sectional views illustrating the method of manufacturing the nonvolatile memory device.

Figure 16A:
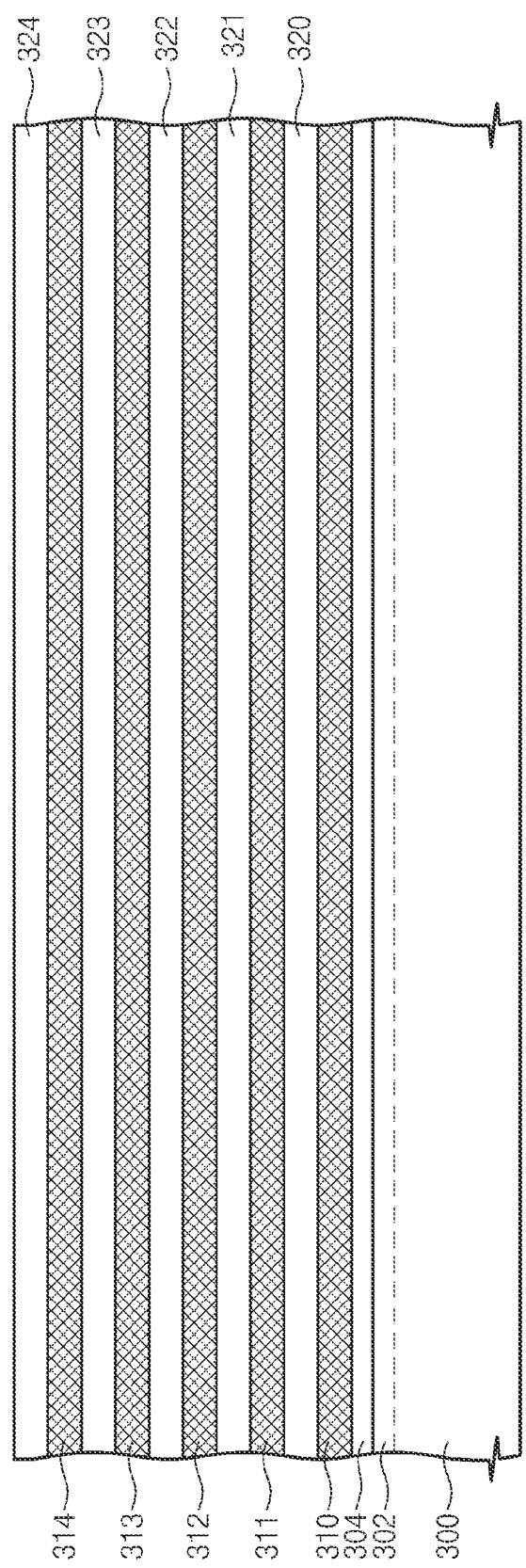
FIGS. 16A to 16D are cross-sectional views illustrating a method of manufacturing a nonvolatile memory device according to exemplary embodiments of the present general inventive concept.

Referring to FIG. 16A, a common source region 302, a ground select insulation layer 304, a ground select gate layer 310, cell gate layers 311 to 314, and a string select gate layer 314 may be sequentially formed on a substrate 300. The substrate 300 is a semiconductor-based substrate and may comprise an insulation region and/or an active region. The substrate 300 may comprise a well. The well may be formed by injecting a dopant (e.g., an n-type dopant, a p-type dopant, etc.) into the substrate 300. The dopant may be injected into the substrate 300 by a doping process including ion implantation or plasma implantation.

The common source region 302 may be formed by doping a dopant into the well. The common source region 302 may include a dopant of a conductivity type different from the well. For example, the well may comprise a p-type dopant, and the common source region 302 may comprise an n-type dopant.

The ground select insulation layer 304 may separate the substrate 300 from the ground select gate layer 310. The string select insulation layer 304 may comprise nitride, oxide, or a combination thereof.

The ground select gate layer 310 may be formed to cover the cell region of the substrate 300. The ground select gate layer 310 may comprise a conductive layer. For example, the ground select gate layer 310 may comprise a metal or a polycrystalline semiconductor. When the ground select gate layer 310 comprises the polycrystalline semiconductor, a dopant may further be doped into the ground select gate layer 310. The dopant of the ground select gate layer 310 may be doped in-situ, but the present general inventive concept is not limited thereto. While the ground select gate layer 310 is formed in a plate form in exemplary embodiments of the present general inventive concept, it may also be provided in a line form by patterning the plate form.

An inter-gate insulation layer 320 may be formed between the ground select gate layer 310 and the lowermost cell gate layer 311. Cell inter-gate insulation layers 321 and 322 may be formed between the cell gate layers 311 to 313. The cell gate layers 311 to 313 and the cell inter-gate insulation layers 321 and 322 may be alternately stacked. The cell gate layers 311 to 313 may comprise a conductive material. For example, the cell gate layers 311 to 313 may comprise a metal or a doped polycrystalline semiconductor.

The string select gate layer 314 may be provided on the uppermost cell gate layer 313 in a line form. The string select gate layer 314 may have a line form extending in a first direction. An inter-gate insulation layer 323 may be further formed between the uppermost cell gate layer 313 and the string select gate layer 314. A string select insulation layer 324 may be further formed on the string select gate layer 314.

Figure 16B:
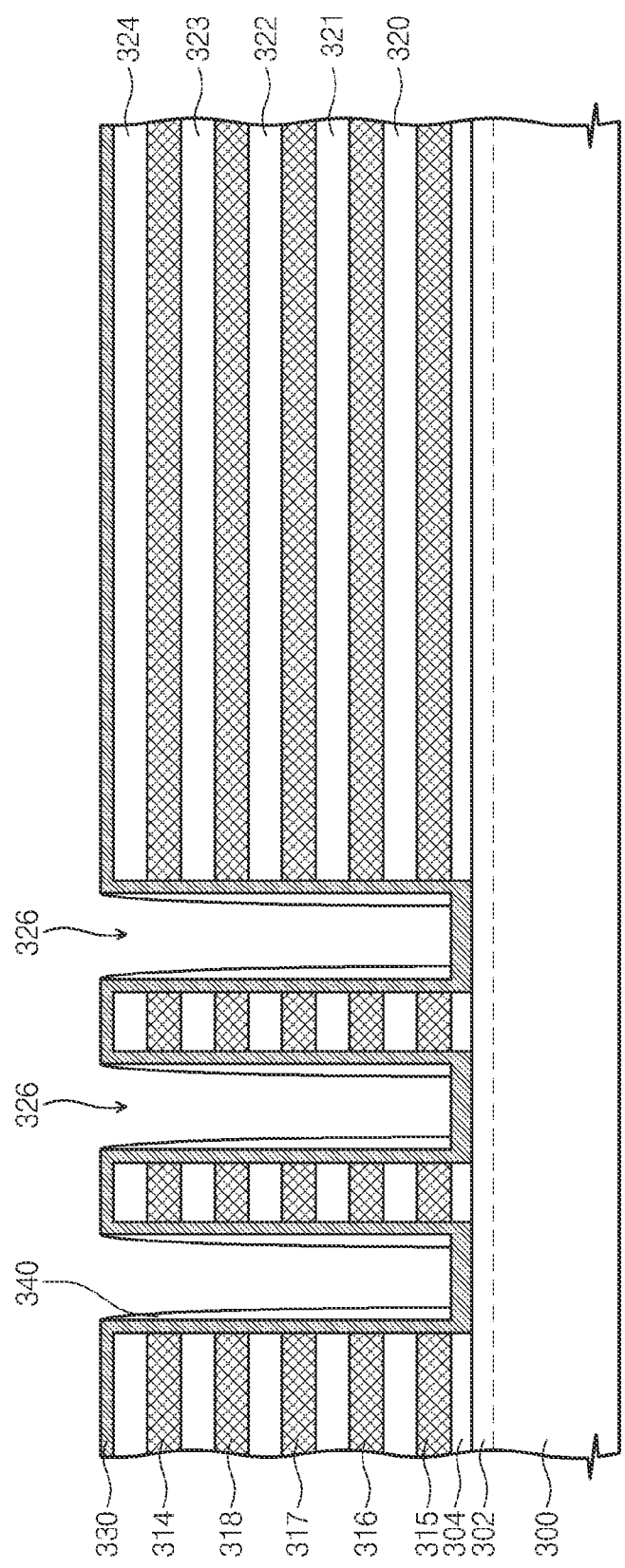

Referring to FIG. 16B, the gate layers 310 to 314 and the insulation layers 304 and 320 to 324 are anisotropically etched to form an opening 326 exposing the common source region 302. The gate layers 310 to 314 may be etched to form the cell gate patterns 316 to 318 and the ground select gate pattern 315 on the substrate 300.

A charge storage pattern 330 may be formed within the opening 326 so that it contacts the sidewalls of the gate patterns 315 to 319 and the sidewalls of the insulation layers 304 and 320 to 324. The charge storage pattern 330 may comprise a tunnel dielectric layer, a trap insulation layer, a blocking insulation layer, and a fixed charge layer.

A method of forming the blocking insulation layer according to exemplary embodiments of the present general inventive concept will be described below.

Referring to FIG. 15A, a first blocking insulation layer 334 may be formed within the opening 326 by the method described above with reference to FIG. 3A. A fixed charge layer 333 may be formed on the first blocking insulation layer 334 by the method described above with reference to FIG. 3A.

Another example of the method of forming the blocking insulation layer according to exemplary embodiments of the present general inventive concept will be described. Referring to FIG. 15B, a first blocking insulation layer 334 and a fixed charge layer 333, which are described above with reference to FIG. 15A, may be formed. A second blocking insulation layer 335 may be formed on the fixed charge layer 333 by the method described above with reference to FIG. 3B.

Another example of the method of forming the blocking insulation layer according to embodiments of the present general inventive concept will be described. Referring to FIG. 15C, a first blocking insulation layer 334 and a fixed charge layer 333, which are described above with reference to FIG. 15A, may be formed. A supplementary layer 336 may be formed on the fixed charge layer 333 by the method described above with reference to FIG. 3C. A second blocking insulation layer 335 may be formed on the supplementary layer 336 by the method described above with reference to FIG. 3B.

Another example of the method of forming the blocking insulation layer according to exemplary embodiments of the present general inventive concept will be described. Referring to FIG. 15D, a first blocking insulation layer 334 described above with reference to FIG. 15A may be formed. A supplementary layer 336 may be formed on the first blocking insulation layer 334 by the method described above with reference to FIG. 3C. A contribution layer 337 and a fixed charge layer 333 may be formed on the supplementary layer 336 by the method described above with reference to FIG. 3D. A second blocking insulation layer 335 may be formed on the contribution layer 337 by the method described above with reference to FIG. 3B.

After forming the blocking insulation layer 339, a trap insulation layer 332 and a tunnel dielectric layer 331 may be sequentially formed by the method described above with reference to FIG. 2. A charge storage pattern 330 may comprise the blocking insulation layer 339, the trap insulation layer 332, and the tunnel dielectric layer 331.

Referring again to FIG. 16B, after forming the charge storage pattern 330, a spacer 340 may be formed within the opening 326. The spacer 340 may partially cover the charge storage pattern 330 formed on the sidewall of the opening 326 and the charge storage pattern 330 formed on the bottom of the opening 326.

Figure 16C:
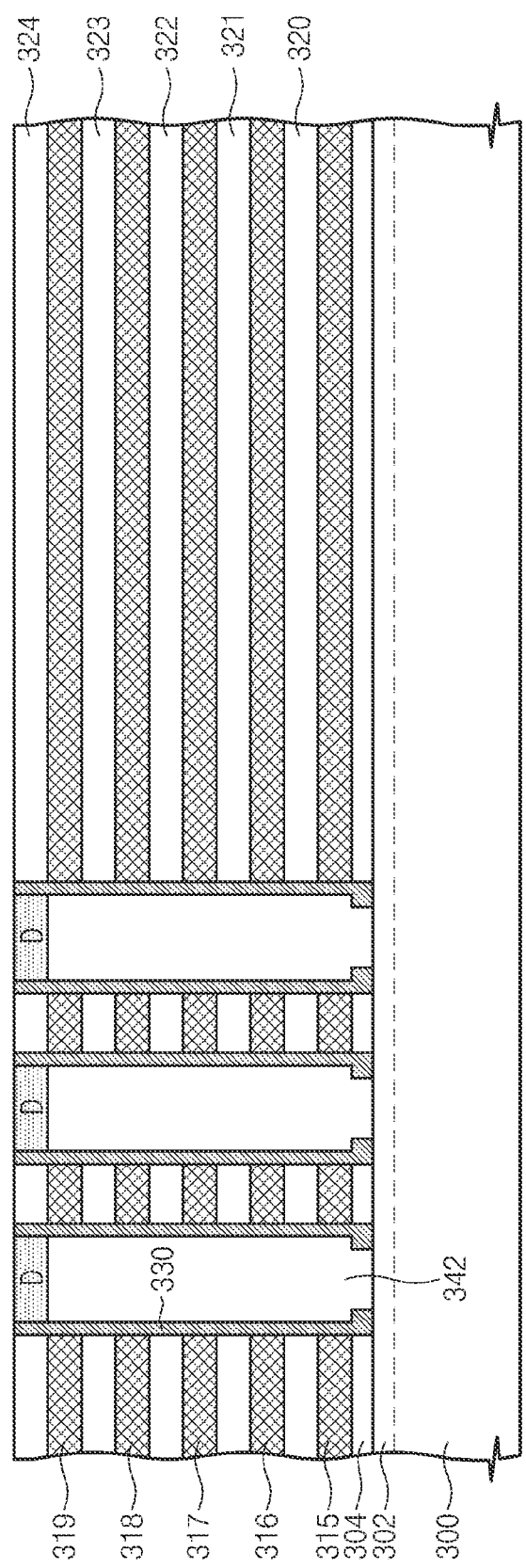

Referring to FIG. 16C, the charge storage pattern 330 may be etched using the spacer 340 as an etch mask. Hence, a portion of the charge storage pattern 330 formed on the bottom of the opening 326 may be etched to expose a portion of the common source region 302. An active pillar 342 may be formed to fill the opening 326. The active pillar 342 may comprise a single crystalline semiconductor, but the present general inventive concept is not limited thereto. When the active pillar 342 comprises the single crystalline semiconductor, the active pillar 342 may be formed by an epitaxial growth using the substrate 300 as a seed layer. Alternatively, the active pillar 342 may be formed by forming a polycrystalline or amorphous semiconductor layer filling the opening 326 and applying a heat and/or laser to phase-change the polycrystalline or amorphous semiconductor layer.

The active pillar 342 may be formed to fill the opening 326 as described above, or may be formed in an unfilled cylindrical shape or any other suitable shape which will perform the intended purposes as described herein.

A drain region D may be formed on the active pillar 342. The drain region D may be formed by doping the upper portion of the active pillar 342. The drain region D may be a region doped with high-concentration dopants of a conductivity type different from the well. For example, the drain region D may comprise a high-concentration n-type dopant. The string select gate layer 314 may be etched to form a string select gate pattern 319. The string select gate pattern 319 may be provided in a direction intersecting with bit lines (not illustrated).

Figure 16D:
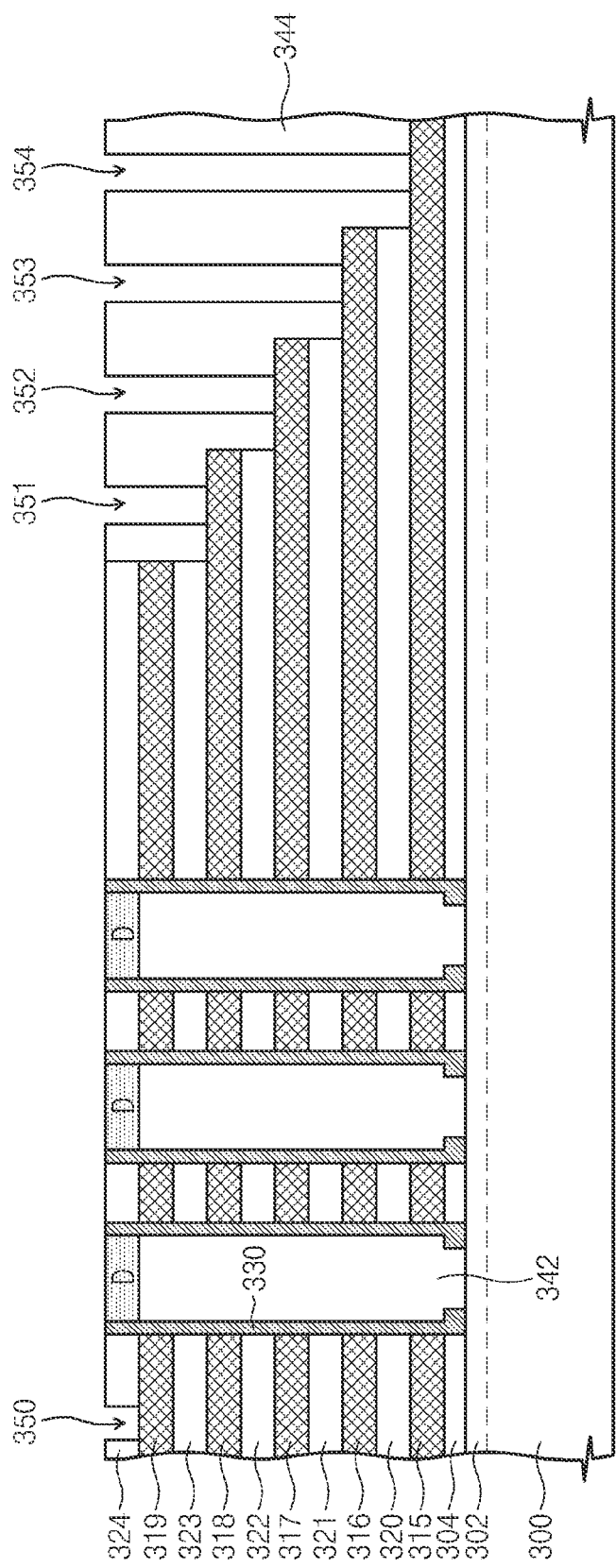

Referring to FIG. 16D, the cell gate patterns 316 to 318, the ground select gate pattern 315, and the insulation layers 320 to 324 may be etched, respectively. The cell gate patterns 316 to 318, the ground select gate pattern 315, and the insulation layers 320 to 324 may be etched so that their widths become narrower toward the upper direction. After the etch process, an interlayer dielectric layer 344 may be formed on the substrate 300. The interlayer dielectric layer 344 may be patterned to form cell gate plug openings 351 to 353 exposing one end of each of the cell gate patterns 316 to 318, and a ground select gate plug opening 354 exposing one end of the ground select gate pattern 315. The string select insulation layer 324 may be etched to form a string select plug opening 350.

Referring to FIG. 14, plugs 360 to 364 filling the plug openings 350 to 354 may be formed. The plugs 360 to 364 may comprise word line contact plugs 361 to 363, a string contact plug 360, and a ground select contact plug 364. Global word lines 371 to 373 connected to the word line contact plugs 361 to 363 may be formed. A string select line 370 connected to the string select plug 360 may be formed. A ground select line 374 connected to the ground select contact plug 364 may be formed. Bit lines 380 to 382 may be formed on the string select gate pattern 319. The bit lines 380 to 382 may be formed to intersect with the string select gate pattern 319 and to electrically connect to the drain region D. The bit lines 380 to 382 may be formed by forming a conductive layer on the string select gate pattern 319 and performing an anisotropic etch process using the mask, which is formed in a direction intersecting with the string select gate pattern 319, as an etch mask.

A nonvolatile memory device according to exemplary embodiments of the present general inventive concept will be described in connection with FIG. 17, which is a plan view illustrating the nonvolatile memory device, and FIG. 18, which is a cross-sectional view illustrating the nonvolatile memory device. FIG. 19 is a cross-sectional view taken along line III-III' of FIG. 18.

Figure 17:
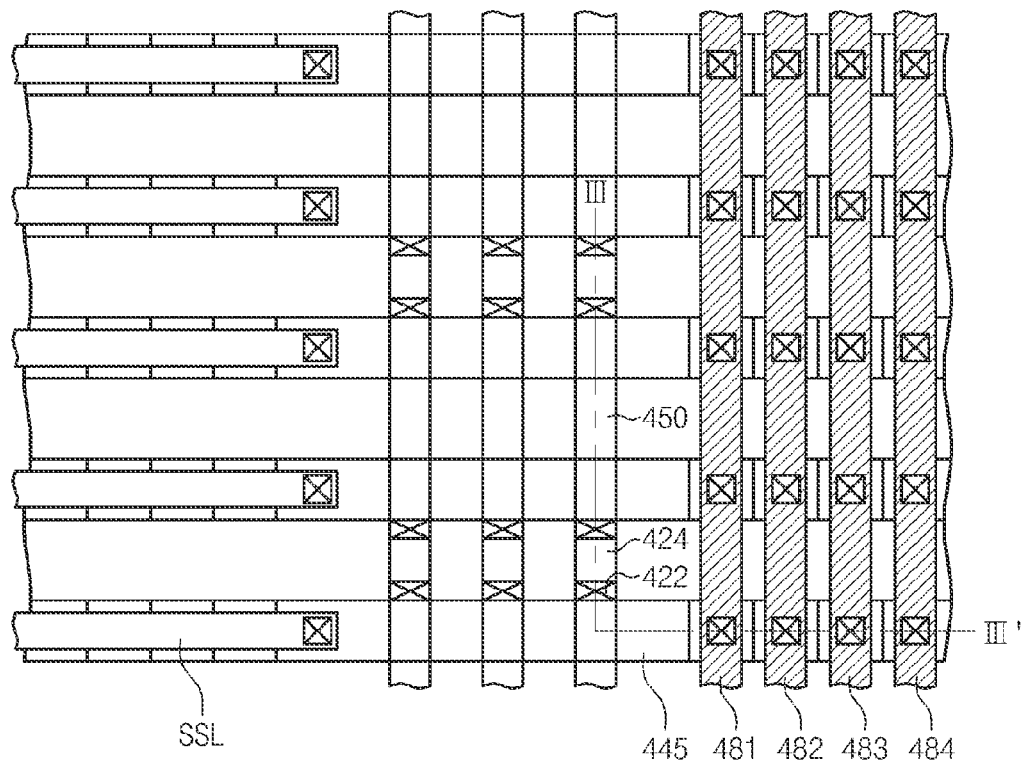
FIG. 17 is a plan view of a nonvolatile memory device according to exemplary embodiments of the present general inventive concept.
Figure 18:
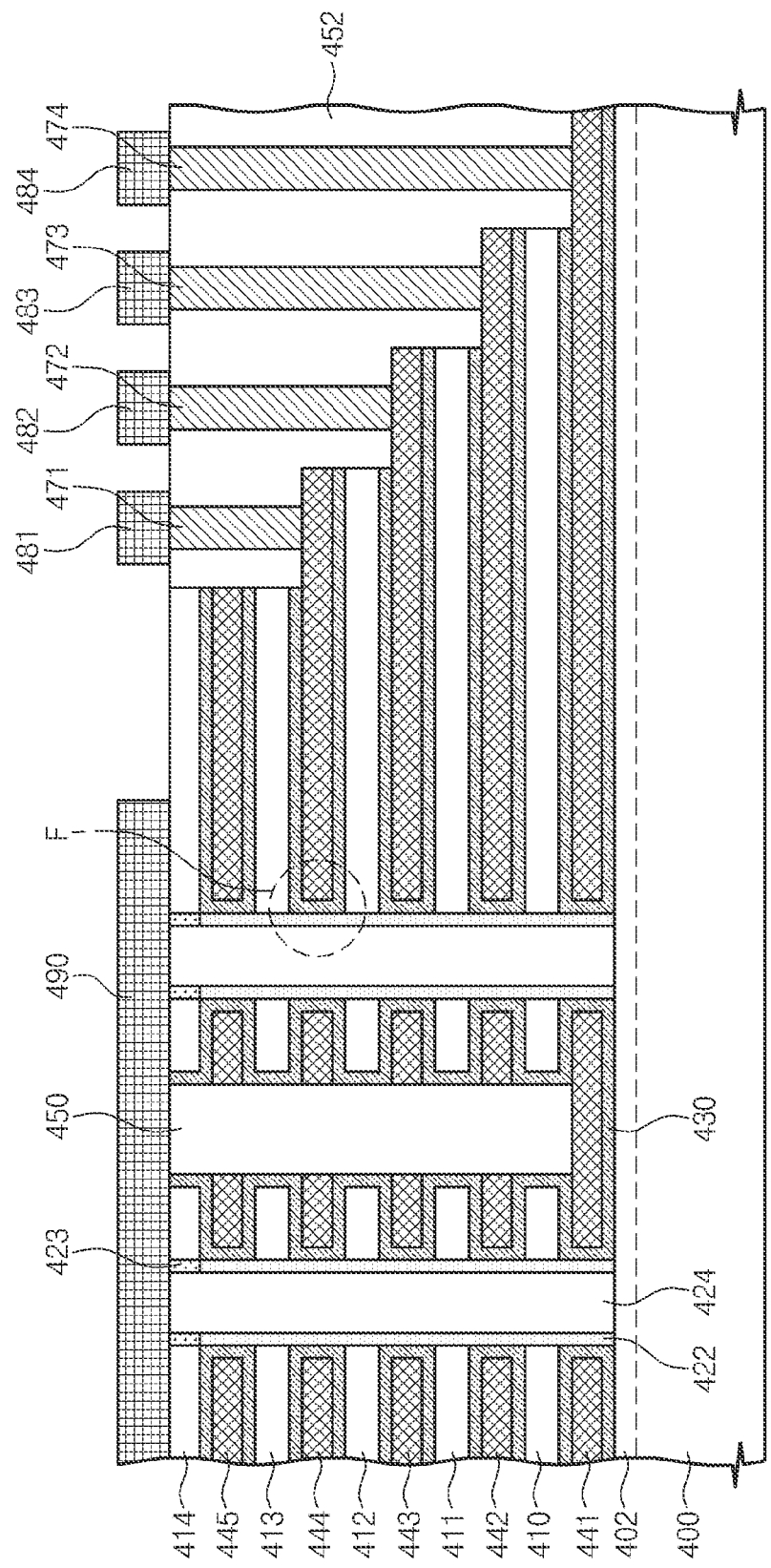
FIG. 18 is a cross-sectional view taken along line III-III' of FIG. 17, illustrating the nonvolatile memory device according to exemplary embodiments of the present general inventive concept.

Referring to FIGS. 17 and 18, a substrate 400 is provided. An active pillar 422 may be provided on the substrate 400. The active pillar 422 may comprise an active region. The substrate 400 may be a semiconductor-based substrate. The substrate 400 may comprise a well. The well may comprise a dopant (e.g., n-type dopant, p-type dopant, etc.) of a first conductivity type. The active pillar 422 may vertically extend on the substrate 400 (e.g., in a direction from the substrate 400 to the bit lines 490). One end of the active pillar 422 may be connected to the well. The other end of the active pillar 422 may be electrically connected to a bit line 490 that will be described later. The active pillar 422 may comprise a single crystalline semiconductor.

A common source region 402 electrically connected to the active pillar 422 may be provided within the substrate 400. The common source region 402 may be provided in a plate form within a cell region of the substrate 400 between the substrate 400 and the active pillar 422. The common source region 402 may comprise a dopant (e.g., n-type dopant, p-type dopant, etc.) of a high concentration. The dopant comprised in the common source region 402 may be a second conductivity type different from the dopant comprised in the well. For example, when the well comprises a p-type dopant, the common source region 402 may comprise an n-type dopant.

A ground select gate pattern 441, a plurality of cell gate patterns 442 to 444, and a plurality of string select gate patterns 445 may be formed, disposed, and/or stacked on the substrate 400. The gate patterns 441 to 445 may be formed, disposed, and/or stacked on the substrate 400 along the sidewall of the active pillar 422. The gate patterns 441 to 445 formed, disposed, and/or stacked along the sidewall of the active pillar 422 may be a vertical cell string. The nonvolatile memory device according to exemplary embodiments of the present general inventive concept may comprise a plurality of cell gate patterns arranged on the substrate 400 in a first direction. The active pillar 422 may face the sides of the gate patterns 441 to 445.

The cell gate patterns 442 to 444 may have a plate form parallel to the substrate 400. Although three cell gate patterns are illustrated for convenience, the number of the cell gate patterns is not limited thereto. The cell gate patterns 442 to 444 may extend in the first direction parallel to the substrate 400. The cell gate patterns 442 to 444 may be word lines, respectively. The word lines may be connected to global word lines 481 to 483 through word line contact plugs 471 to 473, respectively. The word line contact plugs 471 to 473 may be formed at edges of the cell array.

Cell inter-gate insulation layers 411 and 412 may be provided between the cell gate patterns 442 to 444. The cell gate patterns 442 to 445 may be spaced apart from one another by the cell inter-gate insulation layers 411 and 412. The cell inter-gate insulation layers 411 and 412 may comprise oxide.

The ground select gate pattern 441 may be provided between the substrate 400 and the lowermost cell gate pattern 442. The ground select gate pattern 441 may be provided on the substrate 400 in a plate form. The ground select gate pattern 441 may control the electrical connection between the active pillar 422 and the well of the substrate 400. The ground select gate pattern 441 may be connected to a ground select line 484 through a ground select plug 474.

The string select gate pattern 445 may be formed, disposed, and/or stacked on the uppermost cell gate pattern 444 among the cell gate patterns 442 to 445. The string select gate pattern 445 may extend in the first direction parallel to the substrate 400. The string select gate pattern 445 may be connected to a string select line SSL. The string select line SSL may extend in the first direction.

Inter-gate insulation layers 410 and 413 may be provided between the select gate patterns 441 and 445 and the cell gate patterns 442 to 445. The inter-gate insulation layer 410 may be provided between a lowermost cell gate pattern 442 and the ground select gate pattern 441. The inter-gate insulation layers 413 may be provided between an uppermost cell gate pattern 444 and the string select gate pattern 445. The cell gate patterns 442 to 444 are spaced apart from the select gate patterns 441 and 445.

A bit line 490 may be provided on the string select gate pattern 445. The bit line 490 may be provided across the string select gate pattern 445. That is, the bit line 490 may extend in a second direction intersecting with the first direction where the string select gate pattern 445 extends. The first direction and the second direction may be perpendicular to each other. A string select insulation layer 414 may be provided between the string select gate pattern 445 and the bit line 490.

The bit line 490 may be connected to the active pillar 422 through the drain region D, an upper portion of the active pillar 422. The drain region D may be a high-concentration dopant region in the active pillar 422. Unlike the illustration, the bit line 490 may be connected to the drain region D by a predetermined plug. The active pillar 422 may be provided in plurality on the substrate 400. The electrical connection between the bit line 490 and the active pillar 422 may be controlled by the string select gate pattern 445.

The plurality of active pillars 422 may be connected to the same bit line 490. The adjacent active pillars 422 connected to the same bit line 490 may be insulated by an insulating material 424.

A charge storage pattern 430 may be provided between the cell gate patterns 442 to 445 and the active pillar 422. The charge storage pattern 430 may be provided between the gate patterns 441 to 445 and the insulation layers 410 to 414. The charge storage pattern 430 may comprise a tunnel dielectric layer, a trap insulation layer, and a blocking insulation layer.

An example of the blocking insulation layer according to exemplary embodiments of the present general inventive concept will be described, in connection with FIG. 19A, which is an enlarged view of a portion F of FIG. 18.

Figure 19A:
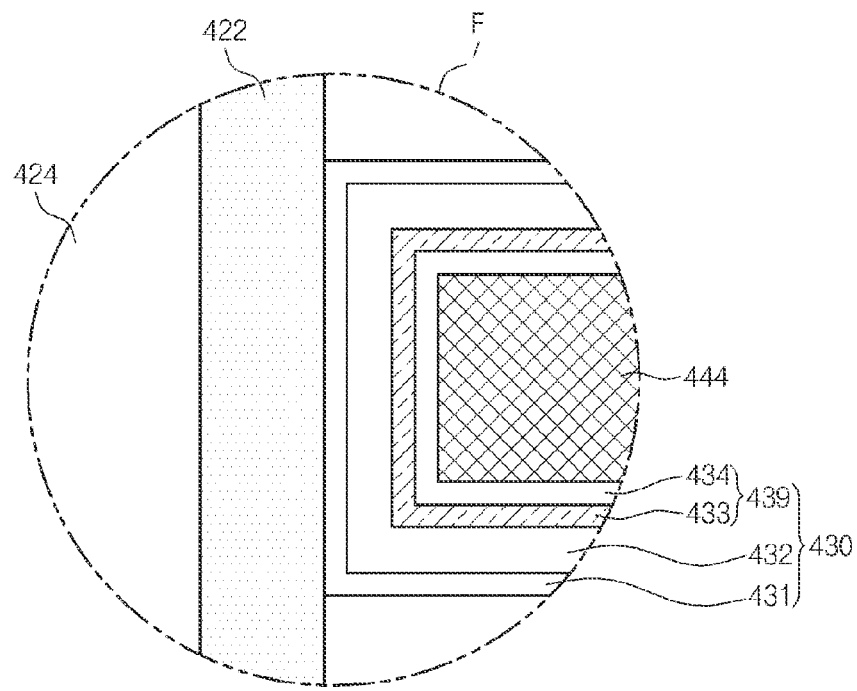
FIGS. 19A to 19D are enlarged views of a portion F of FIG. 19, illustrating blocking insulation layers according to a fifth embodiment of the present general inventive concept.

Referring to FIG. 19A, a tunnel dielectric layer 431 having a first surface contacting the active pillar 422 and a second surface opposite to the first surface may be provided. A blocking insulation layer 439 may be provided between the second surface of the tunnel dielectric layer 431 and the cell gate pattern 444. A trap insulation layer 432 may be provided between the blocking insulation layer 439 and the second surface of the tunnel dielectric layer 431. The blocking insulation layer 439 may comprise a fixed charge layer 433 between the trap insulation layer 432 and the cell gate pattern 444. The blocking insulation layer 439 may comprise a first blocking insulation layer 434 between the fixed charge layer 433 and the cell gate pattern 444. Hence, the fixed charge layer 433 may be spaced apart from the cell gate pattern 444.

The tunnel dielectric layer 431 may be a single layer or a multi layer. For example, the tunnel dielectric layer 431 may comprise at least one of a silicon oxynitride layer a silicon nitride layer, a silicon oxide layer, and a metal oxide layer.

The trap insulation layer 432 may comprise charge trap sites to store electric charges. For example, the trap insulation layer 432 may comprise at least one of a silicon nitride layer, a metal nitride layer, a metal oxynitride layer, a metal silicon oxide layer, a metal silicon oxynitride layer, and nanodots. The trap insulation layer 432 can trap electric charges of the same type as carriers generated in the channel upon operation of the nonvolatile memory device. For example, when the nonvolatile memory device is an NMOS type memory device, electrons may be trapped in the trap insulation layer 432.

The fixed charge layer 433 may include a material to generate fixed charges. For example, the fixed charge layer 433 may include a dielectric material including at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). For example, the fixed charge layer 433 may comprise aluminum nitride. The fixed charges may have the same conductivity type as carriers generated within the channel upon operation of the nonvolatile memory device. For example, when the nonvolatile memory device according to exemplary embodiments of the present general inventive concept is an NMOS type memory device, the fixed charges may be electrons.

The fixed charges within the fixed charge layer 433 may be distributed in a form of fixed charge-dots spaced apart from one another. At this time, the fixed charge-dots may be distributed substantially uniformly within the fixed charge layer 433.

The first blocking insulation layer 434 may have a material different from the fixed charge layer 433. The electron affinity of the first blocking insulation layer 434 may be greater than that of the fixed charge layer 433.

The first blocking insulation layer 434 may be a single layer or a multi layer. The first blocking insulation layer 434 may comprise at least one of a silicon oxide layer, a silicon nitride layer, a silicon oxynitride layer, and a high-k layer. The high-k layer may comprise at least one of a metal oxide layer, a metal nitride layer, and a metal oxynitride layer. The high-k layer may comprise hafnium (Hf), zirconium (Zr), aluminum (Al), tantalum (Ta), lanthanum (La), cerium (Ce), or praseodymium (Pr). The dielectric constant of the first blocking insulation layer 434 may be greater than that of the tunnel insulation layer 431. For example, the first blocking insulation layer 434 may be formed of aluminum oxide.

The first blocking insulation layer 434 may include the fixed charges. The first blocking insulation layer 434 may have the fixed charges of the same conductivity type as the fixed charge layer 433. For example, the fixed charges of the first blocking insulation layer 434 and the fixed charge layer 433 may be electrons. The charge density of the first blocking insulation layer 434 may be smaller than that of the fixed charge layer 433.

The first blocking insulation layer 434 may be electrically neutral. In this case, the charge density of the first blocking insulation layer 434 is substantially zero. Accordingly, the charge density of the first blocking insulation layer 434 is smaller than that of the fixed charge layer 433.

Another example of the blocking insulation layer according to exemplary embodiments of the present general inventive concept will be described in connection with FIG. 19B, which is an enlarged view of the portion F of FIG. 18.

Figure 19B:
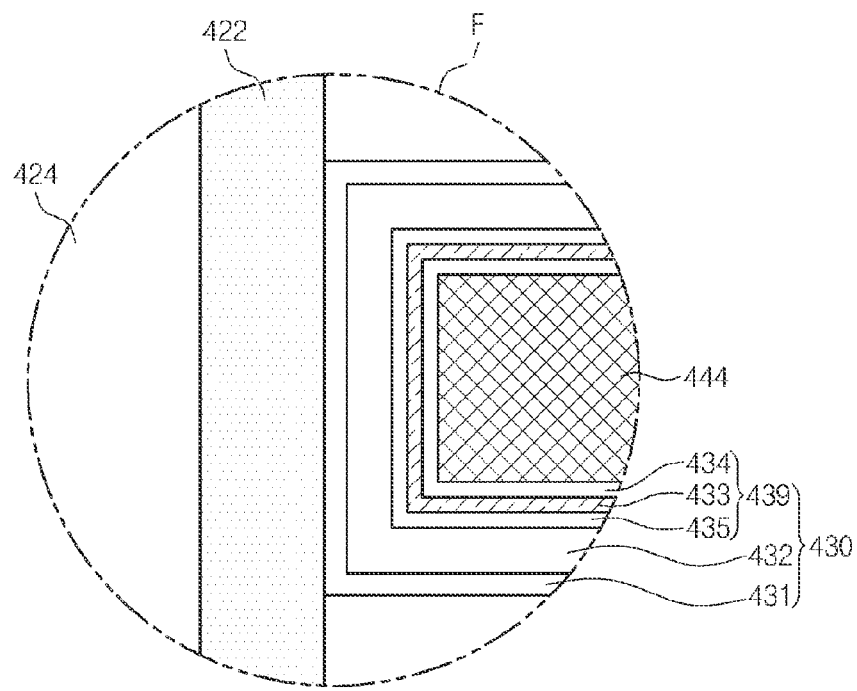

Referring to FIG. 19B, the tunnel dielectric layer 431, the trap insulation layer 432, the fixed charge layer 433, and the first blocking insulation layer 434 described above with reference to FIG. 19A may be provided. A second blocking insulation layer 435 may be provided between the trap insulation layer 432 and the fixed charge layer 433. A blocking insulation layer 439 may comprise the second blocking insulation layer 435, the fixed charge layer 433, and the first blocking insulation layer 434.

The second blocking insulation layer 435 may have a material different from the fixed charge layer 433. For example, the second blocking insulation layer 435 may include the same material as the first blocking insulation layer 434. The electron affinity of the second blocking insulation layer 435 may be smaller than that of the fixed charge layer 433. The charge density of the fixed charge layer 433 may be greater than that of the second blocking insulation layer 435.

Another example of the blocking insulation layer according to exemplary embodiments of the present general inventive concept will be described in connection with FIG. 19C, which is an enlarged view of the portion F of FIG. 18.

Figure 19C:
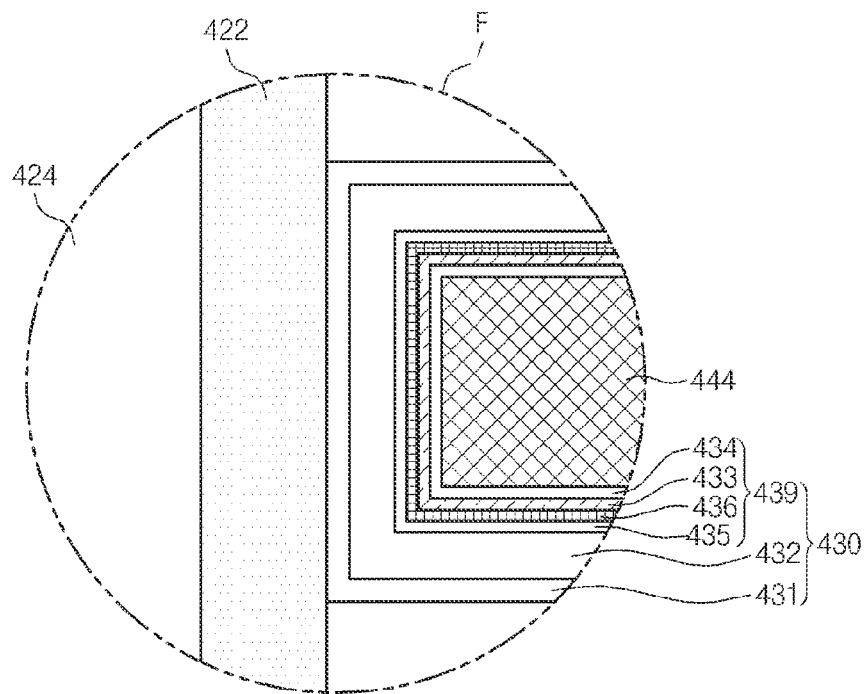

Referring to FIG. 19C, the tunnel dielectric layer 431, the trap insulation layer 432, the second blocking insulation layer 435, the fixed charge layer 433, and the first blocking insulation layer 434, which are described above with reference to FIGS. 19A and 19B, may be provided. A supplementary layer 436 may be provided between the fixed charge layer 433 and the second blocking insulation layer 435. A blocking insulation layer 439 may comprise the second blocking insulation layer 436, the supplementary layer 436, the fixed charge layer 433, and the first blocking insulation layer 434.

The supplementary layer 436 may have a higher dielectric constant than the tunnel dielectric layer 431. The supplementary layer 436 may comprise a metal oxide layer. For example, the metal oxide layer comprise hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or ruthenium (Lu).

Another example of the blocking insulation layer according to exemplary embodiments of the present general inventive concept will be described in connection with FIG. 19D, which is an enlarged view of the portion F of FIG. 18.

Figure 19D:
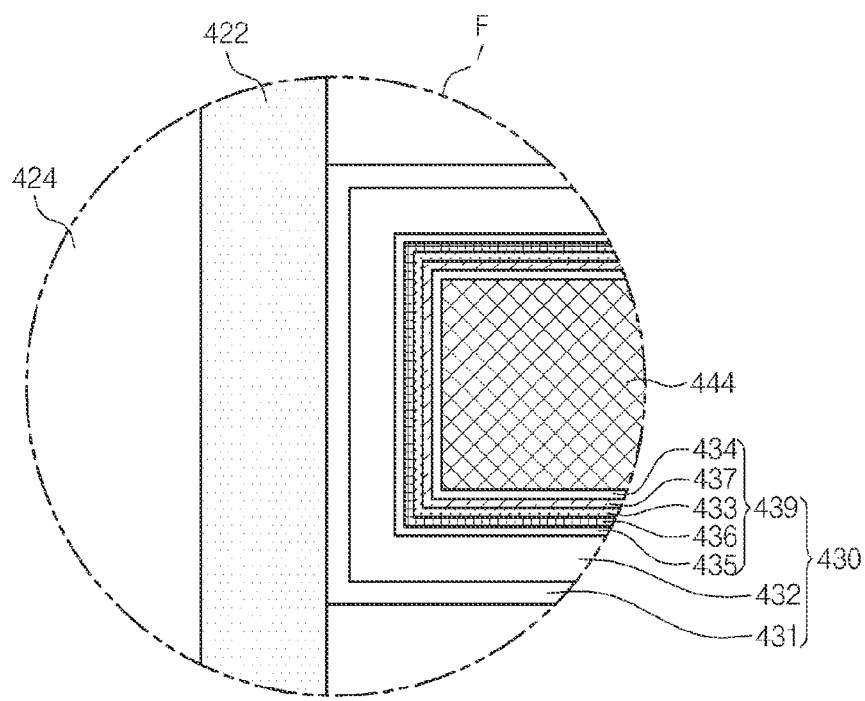

Referring to FIG. 19D, the tunnel dielectric layer 431, the trap insulation layer 432, the second blocking insulation layer 435, the fixed charge layer 433, and the first blocking insulation layer 434, which are described above with reference to FIGS. 19A and 19B, may be provided. A supplementary layer 436 may be provided between the fixed charge layer 433 and the first blocking insulation layer 434. A contribution layer 437 may be provided between the fixed charge layer 433 and the second blocking insulation layer 435. The blocking insulation layer 439 may comprise the second blocking insulation layer 435, the contribution layer 437, the fixed charge layer 433, the supplementary layer 436, and the first blocking insulation layer 434.

The contribution layer 437 may include a material to generate fixed charges. For example, the contribution layer 437 may include at least one of nitrogen (N), fluorine (F), phosphorus (P), sulfur (S), chlorine (Cl), carbon (C), arsenic (As), selenium (Se), bromine (Br), tellurium (Te), iodine (I), and astatine (At). During the process of forming the contribution layer 437, the fixed charge layer 433 may be formed. The fixed charge layer 433 may be formed by the reaction between the supplementary layer 436 and the contribution layer 437. For example, the supplementary layer 436 may comprise aluminum oxide. The contribution layer 437 may comprise a silicon nitride layer. In this case, the fixed charge layer 433 may comprise aluminum nitride formed by the reaction between aluminum oxide and silicon nitride.

A method of manufacturing a nonvolatile memory device according to exemplary embodiments of the present general inventive concept will be described in connection with FIGS. 20A to 20H, which are cross-sectional views illustrating the method of manufacturing the nonvolatile memory device.

Figure 20A:
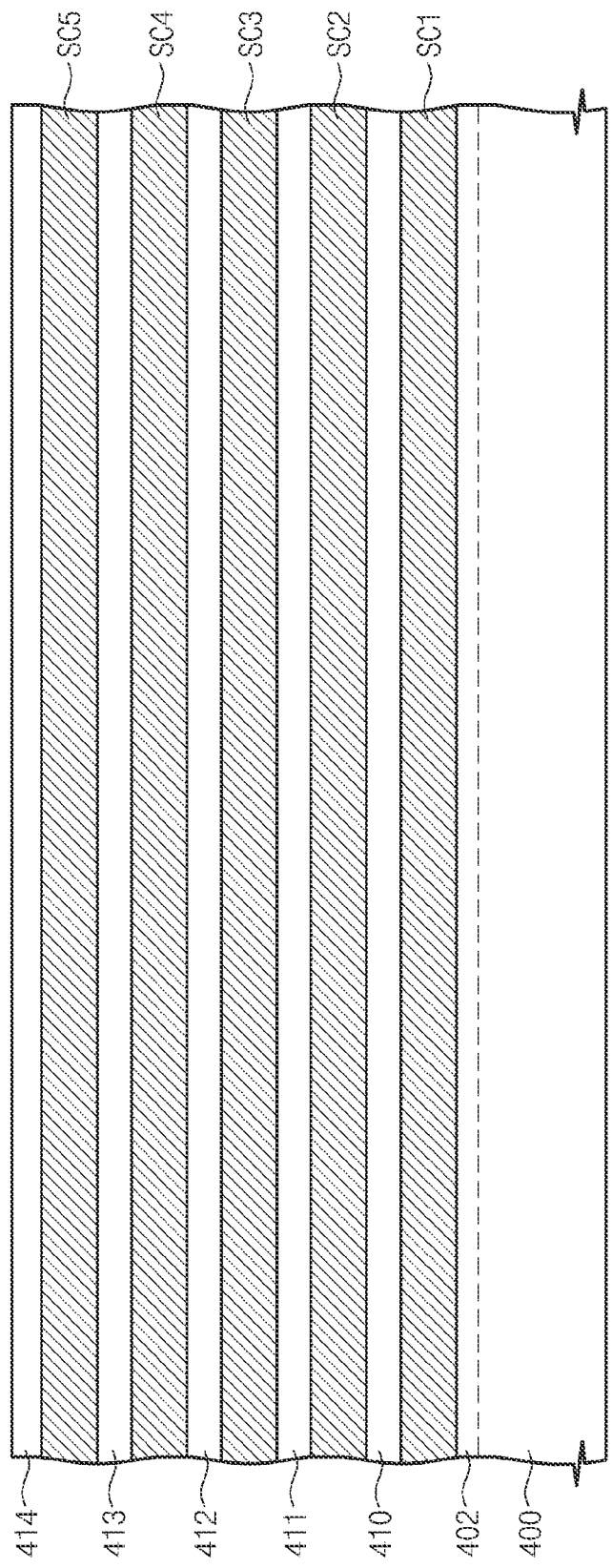

Referring to FIG. 20A, a substrate 400 is provided. The substrate 400 may be a single crystalline semiconductor (for example, a P-type silicon wafer). The base substrate 400 may comprise a region electrically apart by impurity regions of a different conductivity type. The substrate 400 may comprise a common source region 402.

Sacrificial layers SC1 to SC5 and insulation layers 410 to 414 may be alternately formed on the base substrate 400. The insulation layers 410 to 414 may be formed, disposed, and/or stacked apart from one another by the sacrificial layers SC1 to SC5. The insulation layers 410 to 414 may comprise a string select gate insulation layer 414, cell inter-gate insulation layers 411 to 414, and inter-gate insulation layers 410 and 413. The insulation layers 410 to 414 may comprise at least one of a silicon oxide layer and a silicon nitride layer. The sacrificial layers SC1 to SC5 may be formed of materials that can be selectively etched while minimizing the etching of the inter-gate insulation layers 410 to 414.

Referring to FIG. 20B, the insulation layers 410 to 414 and the sacrificial layers SC1 to SC5 alternately stacked may be patterned to form a first opening 420 exposing the surface of the substrate 400. The patterning to form the first opening 420 may be performed using an anisotropic etch technique.

Referring to FIG. 20C, an active pillar 422 covering the inner wall of the first opening 420 may be formed. The active pillar 422 may be formed to conformally cover the inner wall of the first opening 420 by using any one of a CVD process and an ALD process. The active pillar 422 may be formed to have the same conductivity type as the substrate 400 contacted therewith. Hence, the active pillar 422 and the substrate 400 may be electrically connected to each other. For example, the active pillar 422 may comprise a single crystalline semiconductor continuously connected to the substrate 400 without or with minimized crystal defect. To this end, the active pillar 422 may be grown from the exposed substrate 400 by using one of epitaxial techniques. The space other than the first opening 420 may be filled with an insulating material 424 (for example, a silicon oxide layer, a silicon nitride layer, or air). A drain region 423 may be formed in an upper portion of the active pillar 422 for electrical connection to a bit line 490 that will be described later.

The insulation layers 410 to 414 and the sacrificial layers SC1 to SC5 may be again patterned to form a supplementary gate separation region 426 exposing the surface of the base substrate 400. For example, the supplementary gate separation region 426 may be formed between the adjacent active pillars 422. Therefore, the sidewalls of the insulation layers 410 to 414 and the sacrificial layers SC1 to SC5 may be exposed by the supplementary gate separation region 426. The process of forming the supplementary gate separation region 426 may be substantially identical to the process of forming the first opening 420.

Figure 20D:
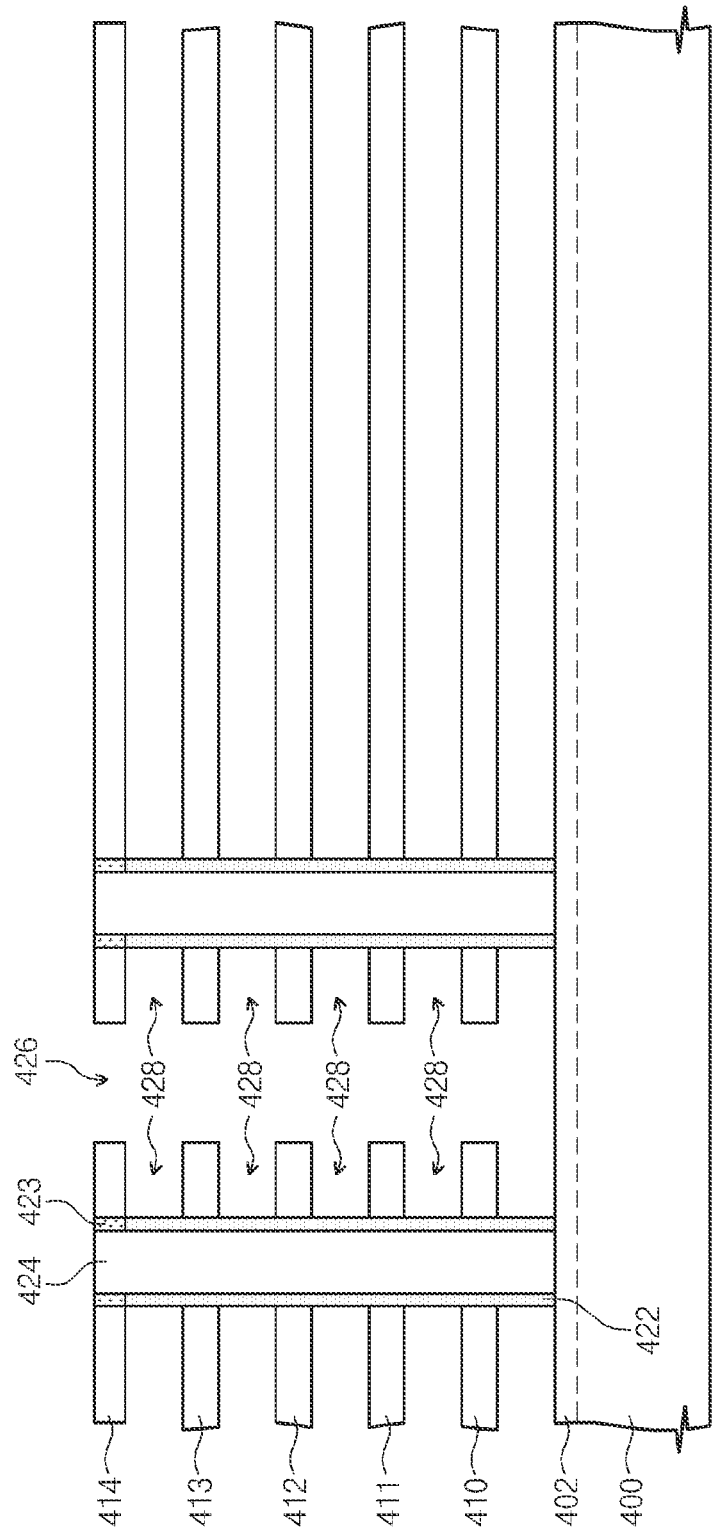

Referring to FIG. 20D, the sacrificial layers SC1 to SC5 exposed by the supplementary gate separation region 426 may be removed. Hence, gate regions 428 exposing the sidewalls of the active pillars 422 may be formed between the insulation layers 410 to 414. The process of removing the sacrificial layers SC1 to SC5 may be performed by using an etch recipe that has an etch selectivity to the insulation layers 410 to 414, the substrate 400, the active pillar 422, and the insulating material 424. Moreover, the process of removing the sacrificial layers SC1 to SC5 may be performed by a dry or wet etch process or an isotropic etch process.

Figure 20E:
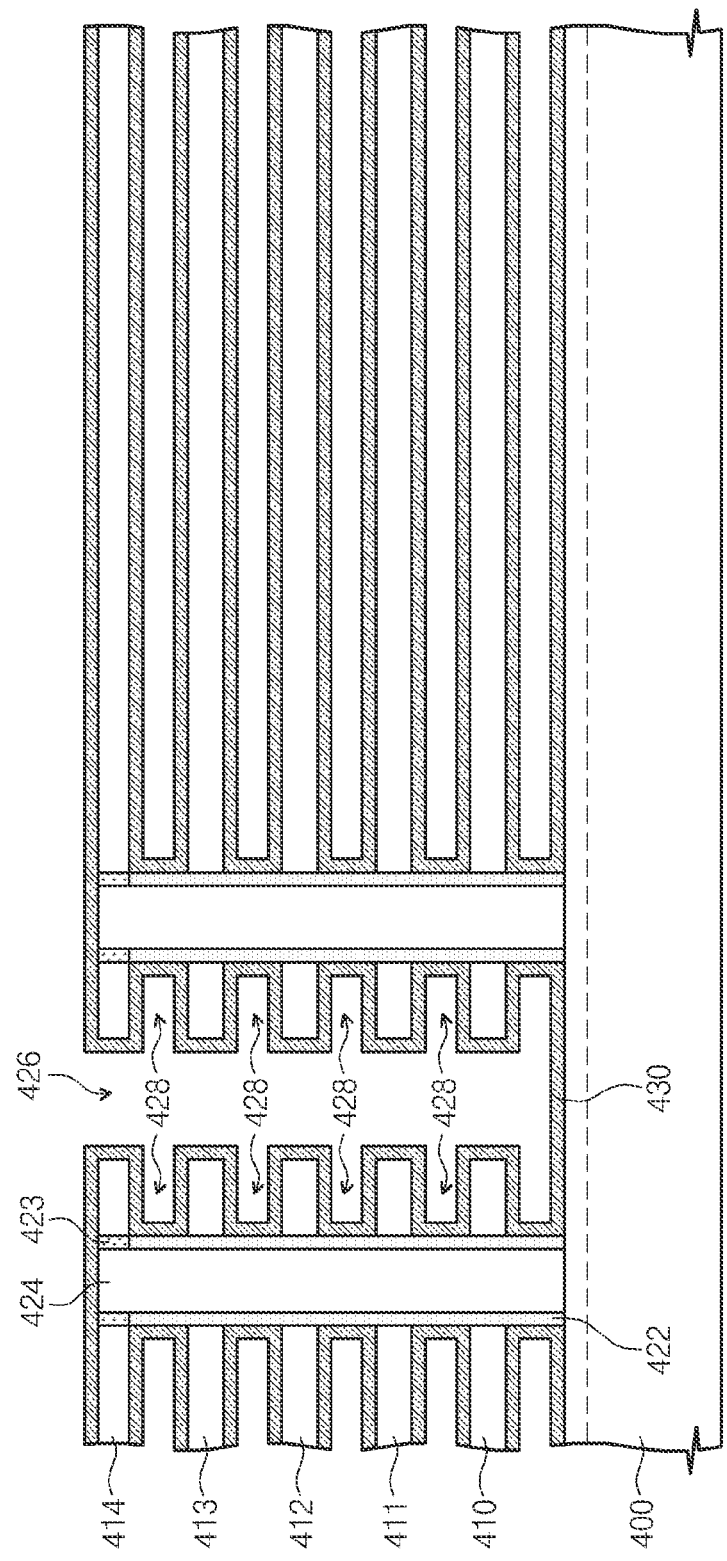

Referring to FIG. 20E, a charge storage pattern 430 may be conformally formed on a resulting structure where the gate regions 428 are formed. The charge storage pattern 430 may comprise a tunnel dielectric layer, a trap insulation layer, and a blocking insulation layer formed, disposed, and/or stacked in sequence. The tunnel dielectric layer and the trap insulation layer may be formed by the method described above with reference to FIG. 2. The blocking insulation layer may be formed by the method described above with reference to FIGS. 3A to 3D.

Figure 20F:
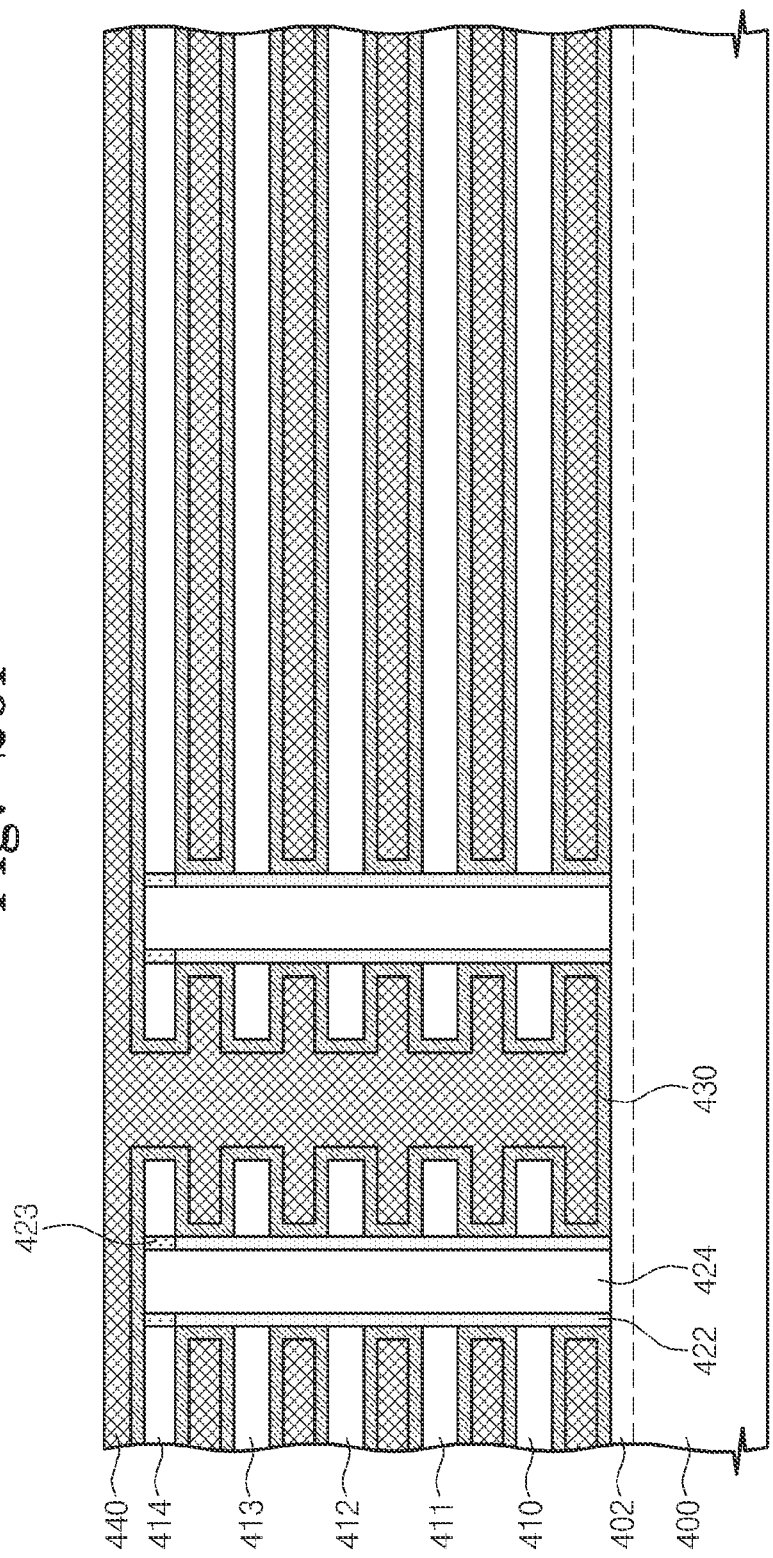

Referring to FIG. 20F, an supplementary gate conductive layer 440 filling the supplementary gate separation region 426 and the gate region 428 may be formed on the charge storage pattern 430. The supplementary gate conductive layer 440 may comprise at least one of polycrystalline silicon layers, silicide layers, and metal layers formed by using a CVD process or an ALD process which provides excellent step coverage. Since the charge storage pattern 430 is also formed on the surface of the substrate 400, the supplementary gate conductive layer 440 may be electrically apart from the substrate 400.

Referring to FIG. 20G, an etch process may be performed using the string select gate insulation layer 414 as an etch stop layer to thereby remove a portion of the charge storage pattern 430 and a portion of the supplementary gate conductive layer 440. The supplementary gate conductive layer 440 formed on the supplementary gate separation region 426 may be removed, and a gap-fill insulation layer 450 may be formed on a resulting structure to thereby form gate patterns 441 to 445. The gate patterns 441 to 445 may comprise a string select gate pattern 445, cell gate patterns 442 to 444, and a ground select gate pattern 441.

The removing of the supplementary gate conductive layer 440 formed on the supplementary gate separation region 426 may be achieved by etching the supplementary gate conductive layer 440 through a patterning process until the upper surface of the ground select gate pattern 441 is exposed but the substrate 400 is not exposed. The active pillar 422 may be patterned to form pillars arranged two-dimensionally.

Figure 20H:
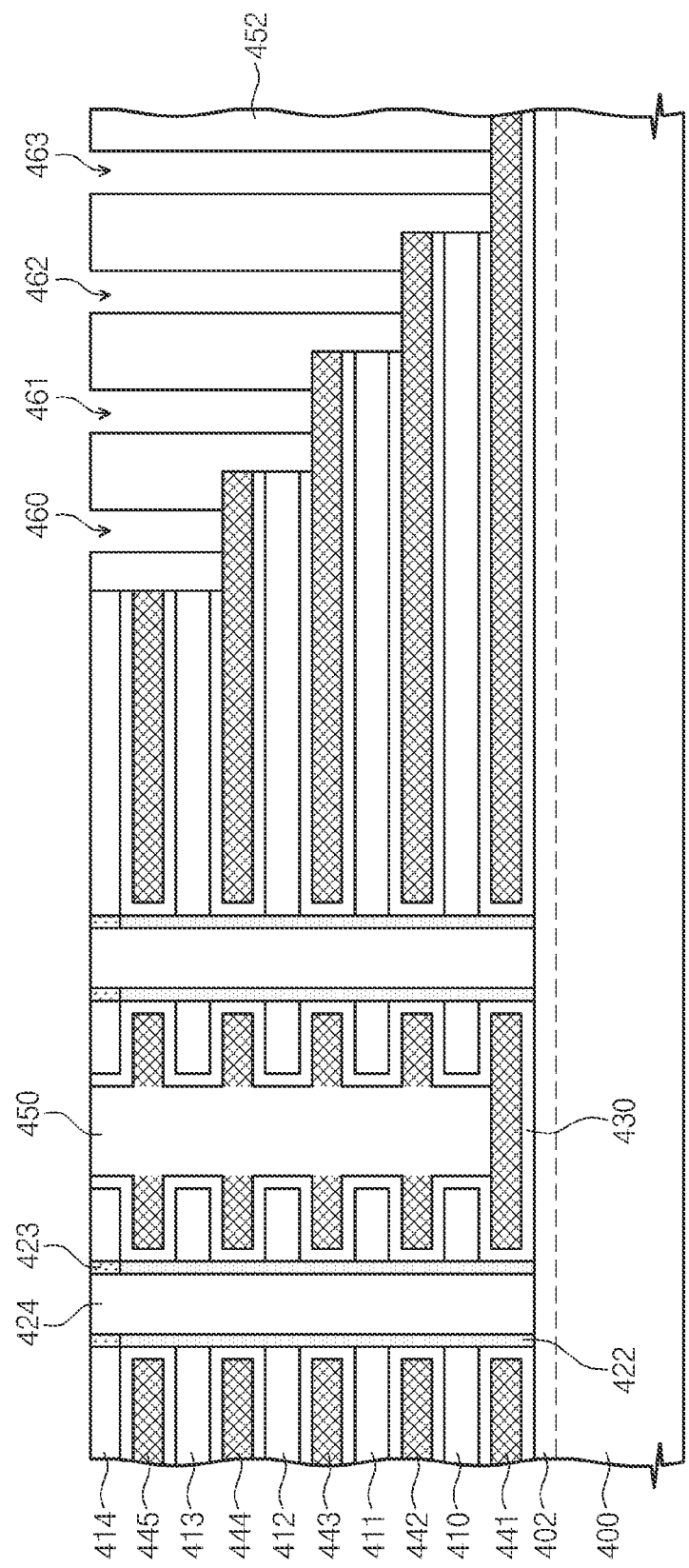

Referring to FIG. 20H, the cell gate patterns 442 to 444, the select gate patterns 445 and 441, the insulation layers 410 to 414, and the charge storage pattern 430 may be etched, respectively. The cell gate patterns 442 to 444, the select gate patterns 441 and 445, the insulation layers 410 to 414, and the charge storage pattern 430 may be etched so that their widths become narrower toward the upper direction. After the etch process, an interlayer dielectric layer 452 may be formed on the substrate 400. The interlayer dielectric layer 452 may be patterned to form cell gate plug openings 460 to 462 exposing one end of each of the cell gate patterns 442 to 444, and a ground select gate plug opening 463 exposing one end of the ground select gate pattern 441.

Referring to FIG. 19, plugs 471 to 474 filling the plug openings 460 to 461 may be formed. The plugs 471 to 474 may comprise word line contact plugs 471 to 473 and a ground select gate plug 474. Global word lines 481 to 483 connected to the word line contact plugs 471 to 473 may be formed. A ground select line 484 connected to the ground select gate plug 474 may be formed. A string select line SSL connected to the string select gate pattern 445 may be formed.

A bit line 490 may be formed on the string select gate pattern 445. The bit line 490 may be formed to intersect with the string select gate pattern 445 and to electrically connect to the drain region D. The bit line 490 may be formed by forming a conductive layer on the string select gate pattern 445 and performing an anisotropic etch process using the mask, which is formed in a direction intersecting with the string select gate pattern 445, as an etch mask.

Figure 21:
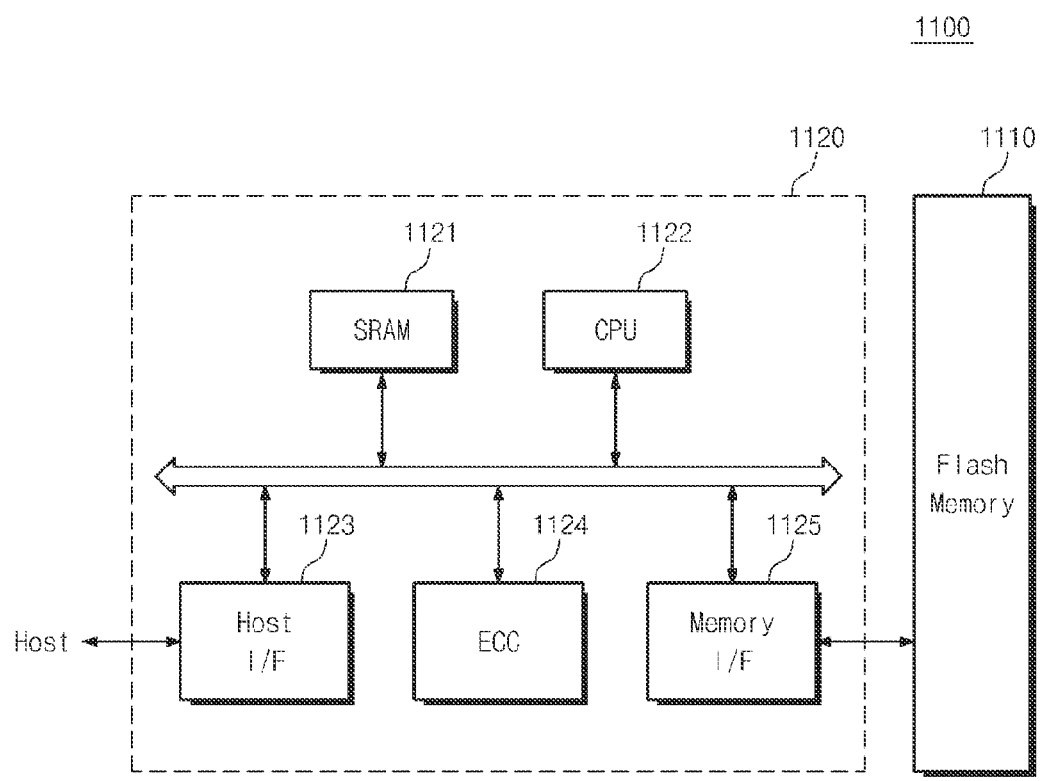
FIGS. 21 and 22 are block diagrams illustrating application examples according to embodiments of the present general inventive concept.

Application examples of the exemplary embodiments of the present general inventive concept will be described. FIG. 21 is a block diagram illustrating an example of a memory card 1100 including a nonvolatile memory device according to the exemplary embodiments of the present general inventive concept.

In this application example, the three-dimensional semiconductor device may be applied to a flash memory 1110. The three-dimensional semiconductor device according to the exemplary embodiments of the present general inventive concept is mounted on a memory card 1100 for supporting high-capacity data storage capability. The memory card 1100 may comprise a memory controller 1120 that controls data exchange between a host and a flash memory 1110.

The memory controller 1120 may comprise a processing unit 1122 for controlling an operation of the memory card 1100, an SRAM 1121, an error correction block 1124, a host interface 1123, and a memory interface 1125. The SRAM 1121 may be used as a working memory of the processing unit 1122. The host interface 1123 may comprise data exchange protocol of the host connected to the memory card 1100. The error correction block 1124 is designed to detect and correct an error comprised in data read from the flash memory 1110. The memory interface 1125 is designed to interface with the flash memory 1110. The processing unit 1122 is designed to perform an overall control operation for data exchange of the memory controller 1120. The memory card 1100 according to this application example can provide the flash memory 1110 with improved reliability, thereby providing a high-reliability system.

Figure 22:
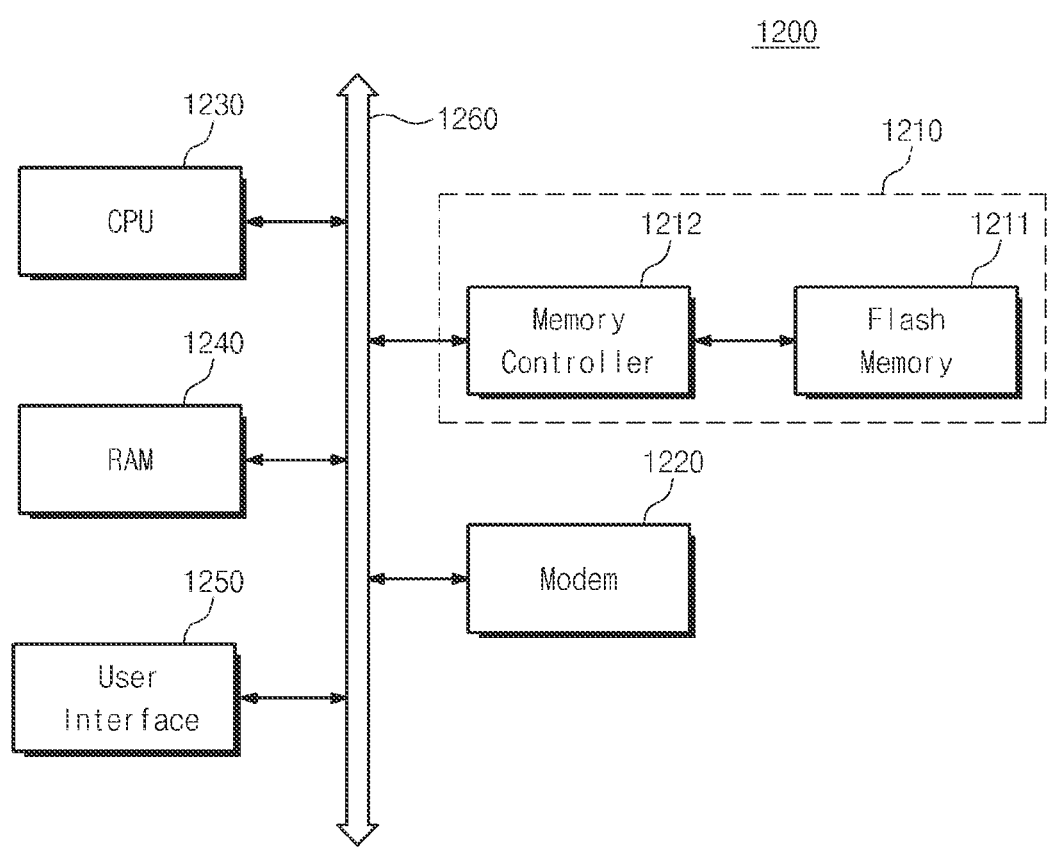

Another application example of the nonvolatile memory device according to the exemplary embodiments of the present general inventive concept will be described. FIG. 22 is a block diagram of an information processing system 1200 including a memory system 1210 with a nonvolatile memory device according to the exemplary embodiments of the present general inventive concept.

In this application example, a three-dimensional semiconductor device according to the exemplary embodiments of the present general inventive concept may comprise a memory system 1210. The memory system 1210 according to the exemplary embodiments of the present general inventive concept may be mounted on information processing systems such as a mobile device or desktop computer. The information processing system 1200 according to this application example may comprise a memory system 1210, a modem 1220 electrically connected to a system bus 1260, a central processing unit (CPU) 1230, a RAM 1240, and a user interface 1250. The memory system 1210 may store data processed by the CPU 1230 or data inputted from the outside. In this application example, the memory system 1210 may be configured with a semiconductor disk device (SSD). In this case, the information processing system 1200 can stably store high-capacity data in the memory system 1210. Moreover, as the reliability of the semiconductor device is improved, the memory system 1210 can save resources consumed in error correction, thereby providing a high-speed data exchange function to the information processing system 1200.

Furthermore, the three-dimensional semiconductor devices according to the exemplary embodiments of the present general inventive concept may be mounted in various types of packages. Examples of the packages of the three-dimensional semiconductor devices according to the exemplary embodiments of the present general inventive concept may comprise package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), and so on.

According to the exemplary embodiments of the present general inventive concept, the fixed charge layer can increase the potential barrier between the trap insulation layer and the gate electrode with respect to charges stored in the trap insulation layer. Hence, the data storage capability of the nonvolatile memory device is improved, thereby minimizing degradation of erase characteristic.

The above-disclosed subject matter is to be considered illustrative, and not restrictive, and the appended claims are intended to cover all such modifications, enhancements, and other embodiments, which fall within the true spirit and scope of the present general inventive concept. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device, comprising:
an active region;
a tunnel dielectric layer having a first surface contacting the active region, and a second surface opposite to the first surface;
a gate electrode on the second surface of the tunnel dielectric layer;
a blocking insulation layer comprising a fixed charge layer between the second surface of the tunnel dielectric layer and the gate electrode, with at least a portion of the fixed charge layer to extend beyond the gate electrode; and
a trap insulation layer between the blocking insulation layer and the second surface of the tunnel dielectric layer,
wherein the fixed charge layer is apart from the gate electrode and comprises negative charges.

2. The nonvolatile memory device of claim 1, wherein the blocking insulation layer further comprises a first blocking insulation layer adjacent to the gate electrode, and the fixed charge layer comprises a material different from the first blocking insulation layer.

3. The nonvolatile memory device of claim 2, wherein a first electric field is generated between the gate electrode and the fixed charge layer by an erase voltage applied between the gate electrode and a channel region in an erase operation;
a second electric field is generated between the first blocking insulation layer and the fixed charge layer; and
the second electric field and the first electric field are opposite in direction.

4. The nonvolatile memory device of claim 2, wherein the blocking insulation layer further comprises a second blocking insulation layer between the fixed charge layer and the trap insulation layer, and the second blocking insulation layer comprises a material different from the fixed charge layer.

5. The nonvolatile memory device of claim 4, wherein the charge density of the fixed charge layer is greater than the charge density of the second blocking insulation layer.

6. The nonvolatile memory device of claim 4, wherein the blocking insulation layer further comprises a supplementary layer between the fixed charge layer and the second blocking insulation layer, and the supplementary layer has a higher dielectric constant than the tunnel dielectric layer.

7. The nonvolatile memory device of claim 6, wherein the blocking insulation layer further comprises a contribution layer between the fixed charge layer and the first blocking insulation layer, and the fixed charge layer is formed by a reaction between the contribution layer and the supplementary layer.

8. The nonvolatile memory device of claim 2, wherein the first blocking insulation layer has a bottom portion and a sidewall portion extending from the bottom portion, and the sidewall portion of the first blocking insulation layer covers both sidewalls of the gate electrode.

9. The nonvolatile memory device of claim 2, wherein the blocking insulation layer has a bottom portion and a sidewall portion extending from the bottom portion, and the sidewall portion of the blocking insulation layer covers both sidewalls of the gate electrode.

10. The nonvolatile memory device of claim 1, wherein the fixed charge layer increases a potential barrier between the trap insulation layer and the gate electrode with respect to charges stored in the trap insulation layer.

11. A nonvolatile memory device comprising:
a substrate;
an active pillar extending vertically on the substrate, the active pillar having an active region connected to the substrate;
a tunnel dielectric layer having a first surface contacting the active pillar, and a second surface opposite to the first surface;
a plurality of gate patterns on the second surface of the tunnel dielectric layer;
a blocking insulation layer comprising a fixed charge layer between the second surface of the tunnel dielectric layer and the gate patterns, with at least a portion of the fixed charge layer to extend beyond the gate electrode; and
a trap insulation layer between the blocking insulation layer and the second surface of the tunnel dielectric layer,
wherein the fixed charge layer is apart from the gate patterns, and has same conductivity type charges as the trap insulating layer.

12. The nonvolatile memory device of claim 11, wherein the blocking insulation layer further comprises a first blocking insulation layer adjacent to the gate patterns, and the fixed charge layer comprises a material different from the first blocking insulation layer.

13. The nonvolatile memory device of claim 12, wherein a first electric field is generated between the gate patterns and the fixed charge layer by an erase voltage applied between the gate patterns and a channel region in an erase operation, a second electric field is generated between the first blocking insulation layer and the fixed charge layer, and the second electric field and the first electric field are opposite in direction.

14. The nonvolatile memory device of claim 12, wherein the blocking insulation layer further comprises a second blocking insulation layer between the fixed charge layer and the trap insulation layer, and the second blocking insulation layer comprises a material different from the fixed charge layer.

15. The nonvolatile memory device of claim 12, wherein the fixed charge layer comprises a first region under the gate patterns, and a second region extending toward a region adjacent to the gate patterns.

16. A memory device, comprising:
a tunnel dielectric layer contacting an active region of a substrate;
a trap insulation layer formed on the tunnel dielectric layer, the trap insulation layer trapping charges;
a blocking insulation layer including a fixed charge layer, the blocking insulation layer formed on at least a portion of the trap insulation layer; and
a gate electrode on the blocking insulation layer, the fixed charge layer being separated from the gate electrode, with at least a portion of the fixed charge layer to extend beyond the gate electrode,
wherein the fixed charge layer has the same conductivity type charges as the trap insulation layer.

17. The memory device of claim 16, wherein the dielectric constant of the blocking insulation layer is greater than the tunnel insulation layer.

18. The memory device of claim 17, wherein the blocking insulation layer is formed of at least one of silicon oxide layer, a silicon nitride layer, a silicon oxynitride layer, and a high-dielectric-constant layer.

19. The memory device of claim 18, wherein the high-dielectric-constant layer at least one of a metal oxide layer, a metal nitride layer, and a metal oxynitride layer.

20. The memory device of claim 19, wherein the high-dielectric-constant layer comprises one of hafnium (Hf), zirconium (Zr), aluminum (Al), tantalum (Ta), lanthanum (La), cerium (Ce), or praseodymium (Pr).

21. The memory device of claim 16, wherein the charge density of the fixed charge layer is greater than the remaining portion of the blocking insulation layer.

22. The memory device of claim 16, wherein the blocking insulation layer comprises:
the fixed charged layer formed between a first blocking insulation layer and a second blocking insulation layer,
wherein the first blocking layer is formed such that it is between the gate electrode and the fixed charge layer, and the second blocking insulation layer is formed such that it is between the fixed charge layer and the trap insulation layer.

23. The memory device of claim 22, wherein an electron affinity of the first blocking insulation layer is greater than that of the fixed charge layer, and an electron affinity of the second blocking insulation layer is less than that of the fixed charge layer.

24. The memory device of claim 22, further comprising:
a supplementary layer formed between the second blocking insulation layer and the fixed charge layer, the supplementary layer having a higher dielectric constant than the tunnel dielectric layer.

25. The memory device of claim 24, further comprising:
a contribution layer formed within the blocking insulation layer such that the fixed charge layer is formed by a reaction between the supplementary layer and the contribution layer.

26. The memory device of claim 16, wherein the blocking insulation layer comprises:
a first blocking insulation layer formed on at least two sides of the gate electrode; and
a second blocking insulation layer that is formed between the fixed charge layer and the trap insulation layer,
wherein the fixed charge layer is formed between at least a portion of the first blocking insulation layer and the second blocking insulation layer.

* * * * *